United States Patent
Tsai et al.

(10) Patent No.: US 12,389,652 B2
(45) Date of Patent: Aug. 12, 2025

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: Han-Yu Tsai, Hsinchu (TW); Yi-Hsiu Liu, Taipei (TW); You-Ting Lin, Miaoli County (TW); Chih-Chung Chang, Mingjian Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 630 days.

(21) Appl. No.: 17/587,805

(22) Filed: Jan. 28, 2022

(65) Prior Publication Data

US 2023/0027567 A1 Jan. 26, 2023

Related U.S. Application Data

(60) Provisional application No. 63/225,339, filed on Jul. 23, 2021.

(51) Int. Cl.
| | | |
|---|---|---|
| *H10D 64/01* | (2025.01) | |
| *H01L 21/3115* | (2006.01) | |
| *H10D 30/67* | (2025.01) | |
| *H10D 62/10* | (2025.01) | |

(52) U.S. Cl.
CPC ..... *H10D 64/015* (2025.01); *H01L 21/31155* (2013.01); *H10D 30/6735* (2025.01); *H10D 30/6757* (2025.01); *H10D 62/118* (2025.01)

(58) Field of Classification Search
CPC ............ H01L 29/6653; H01L 29/0665; H01L 29/42392; H01L 29/78696; H01L 21/31155; H10D 64/015; H10D 30/6757; H10D 30/6735; H10D 62/118
See application file for complete search history.

(56) References Cited

U.S. PATENT DOCUMENTS

| | | |
|---|---|---|
| 7,034,369 B2 | 4/2006 | Arikado et al. |
| 7,808,051 B2 | 10/2010 | Hou et al. |
| 9,372,954 B2 | 6/2016 | Zhang et al. |

(Continued)

*Primary Examiner* — Timor Karimy
(74) *Attorney, Agent, or Firm* — STUDEBAKER BRACKETT PLLC

(57) ABSTRACT

A method of manufacturing a semiconductor device includes forming a fin structure including a stacked layer of first semiconductor layers and second semiconductor layers disposed over a bottom fin structure and a hard mask layer over the stacked layer, forming an isolation insulating layer so that the hard mask layer and the stacked layer are exposed from the isolation insulating layer, forming a sacrificial cladding layer over at least sidewalls of the exposed hard mask layer and stacked layer, forming layers of a first dielectric layer and an insertion layer over the sacrificial cladding layer and the fin structure, performing an annealing operation to convert a portion of the layers of the first dielectric layer and the insertion layer from an amorphous form to a crystalline form, and removing the remaining amorphous portion of the layers of the first dielectric layer and the insertion layer to form a recess.

20 Claims, 43 Drawing Sheets

(56) References Cited

U.S. PATENT DOCUMENTS

| | | |
|---|---|---|
| 10,074,668 B2 | 9/2018 | Ching et al. |
| 10,388,771 B1 | 8/2019 | Lin et al. |
| 10,535,654 B2 | 1/2020 | Tsai et al. |
| 2019/0164741 A1 | 5/2019 | Wen et al. |
| 2020/0035811 A1* | 1/2020 | Huang ................ H01L 21/0262 |
| 2021/0175126 A1 | 6/2021 | Wu et al. |
| 2021/0202714 A1 | 7/2021 | Yu et al. |

* cited by examiner

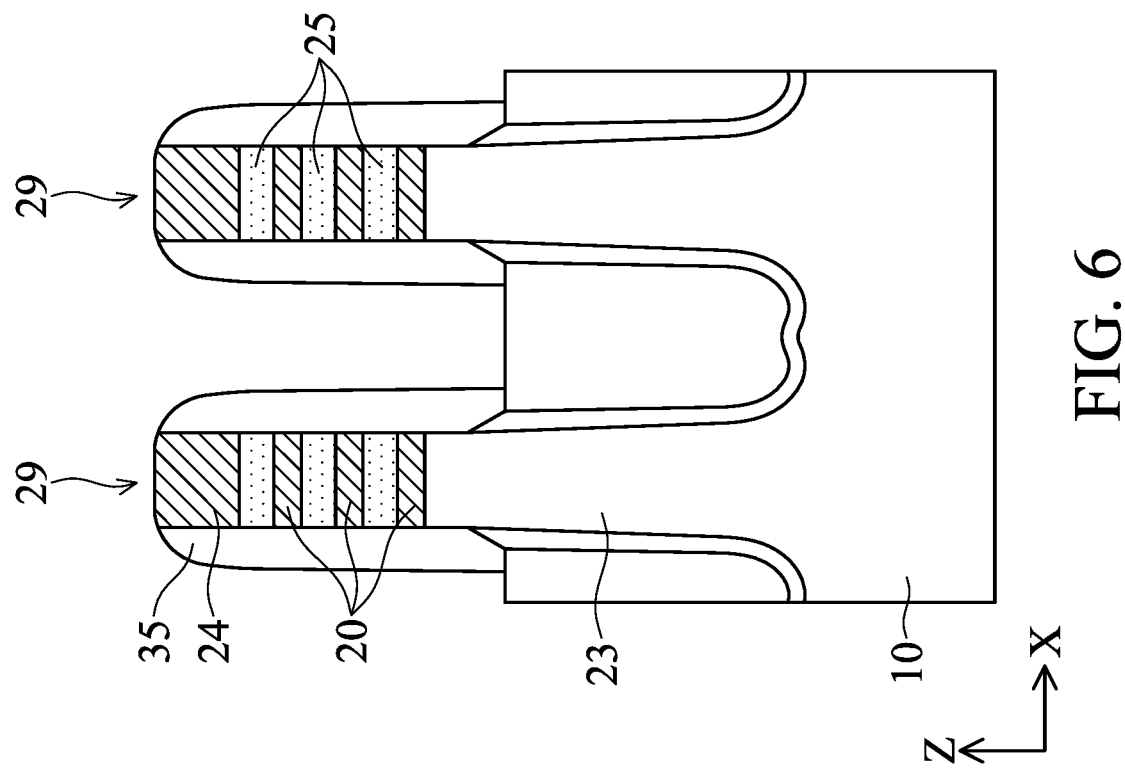
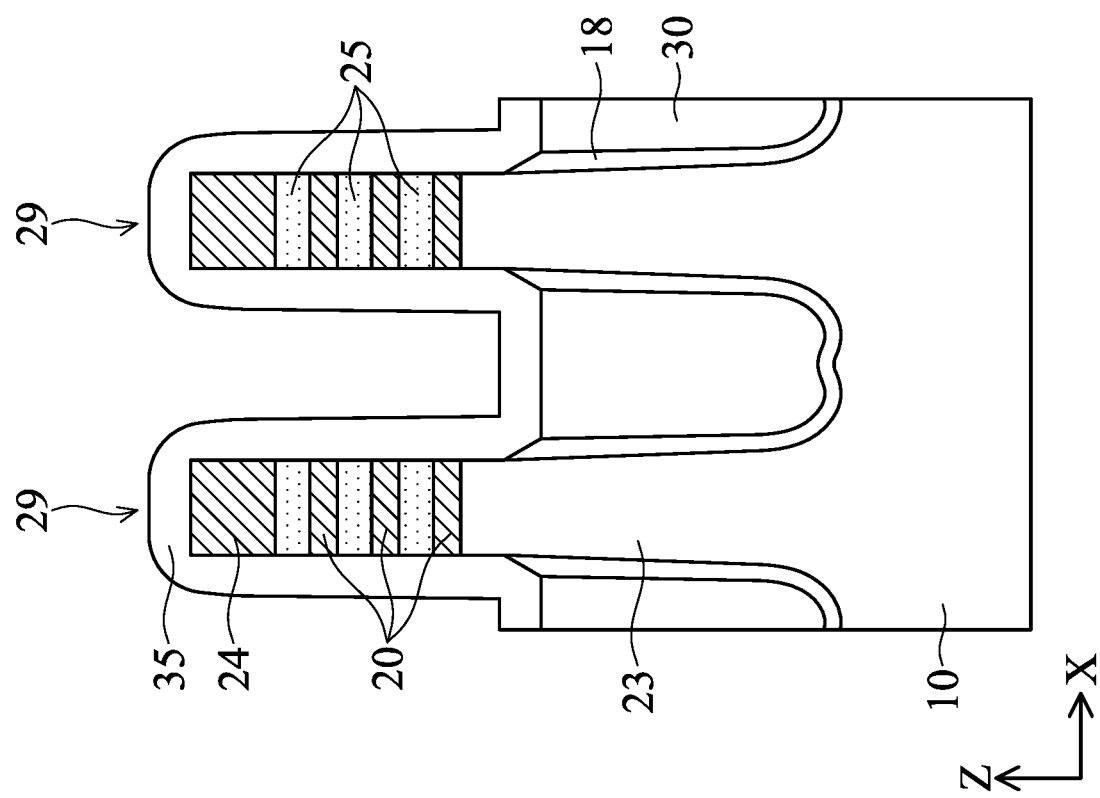

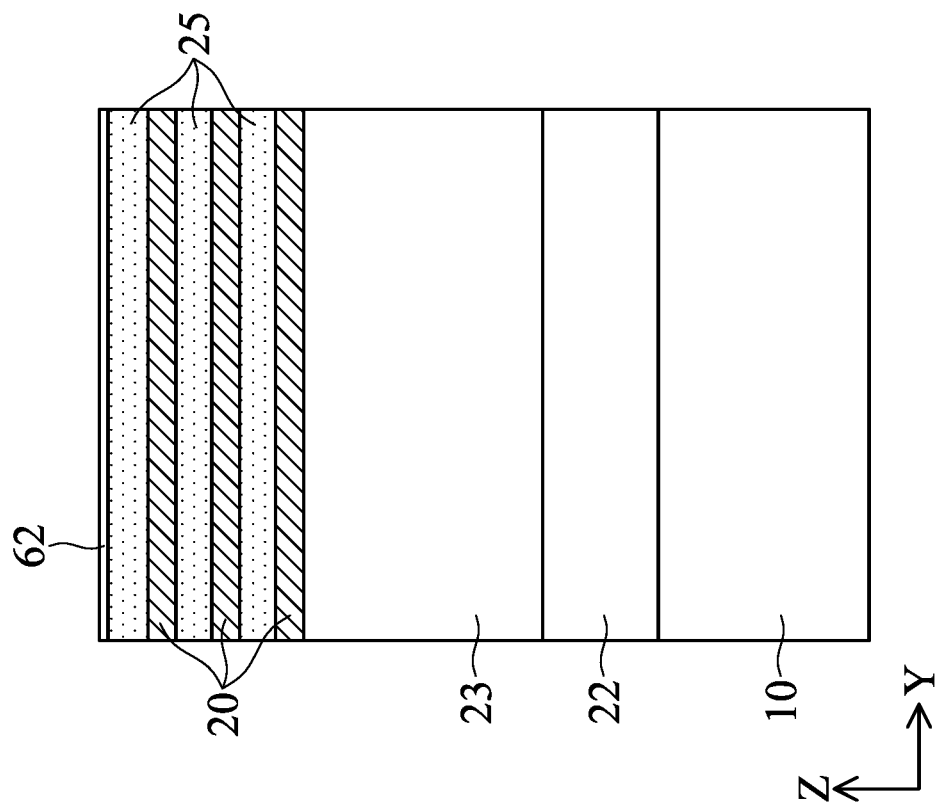
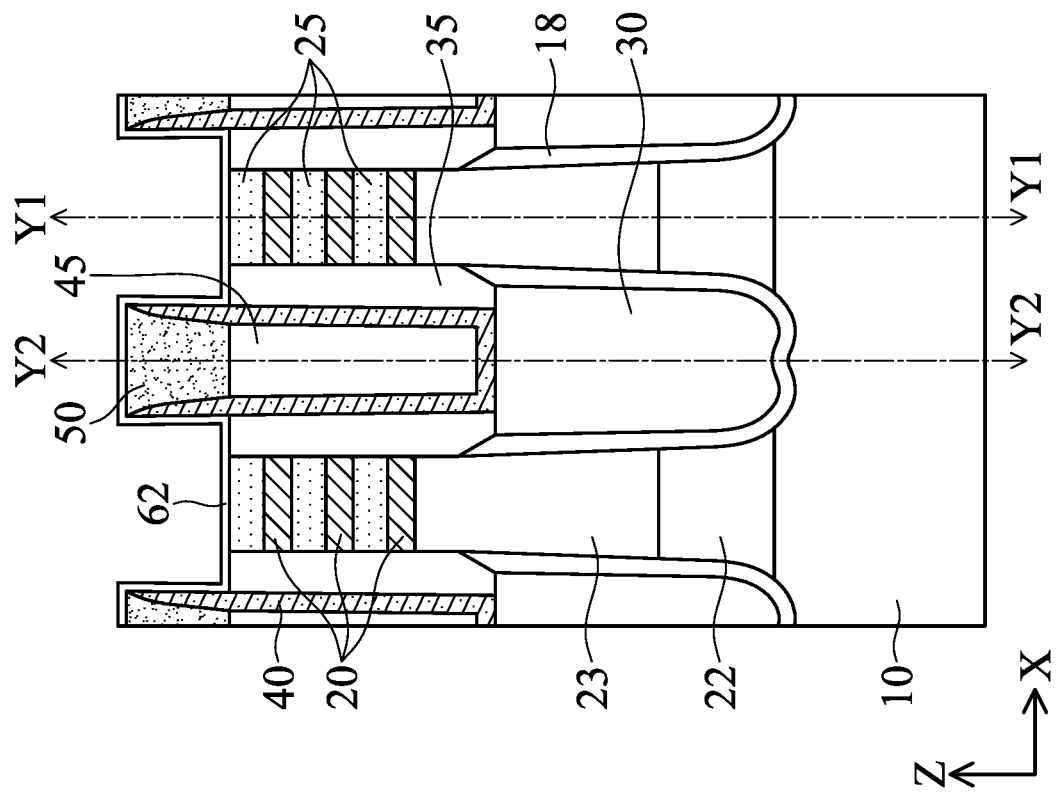

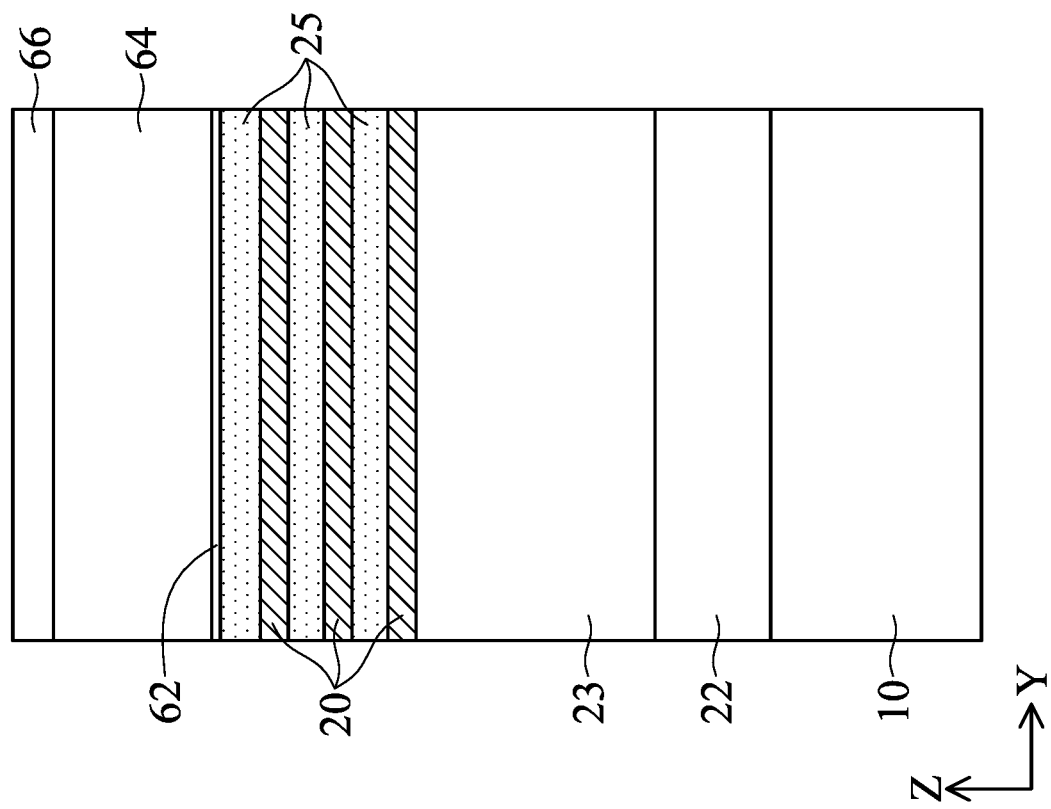
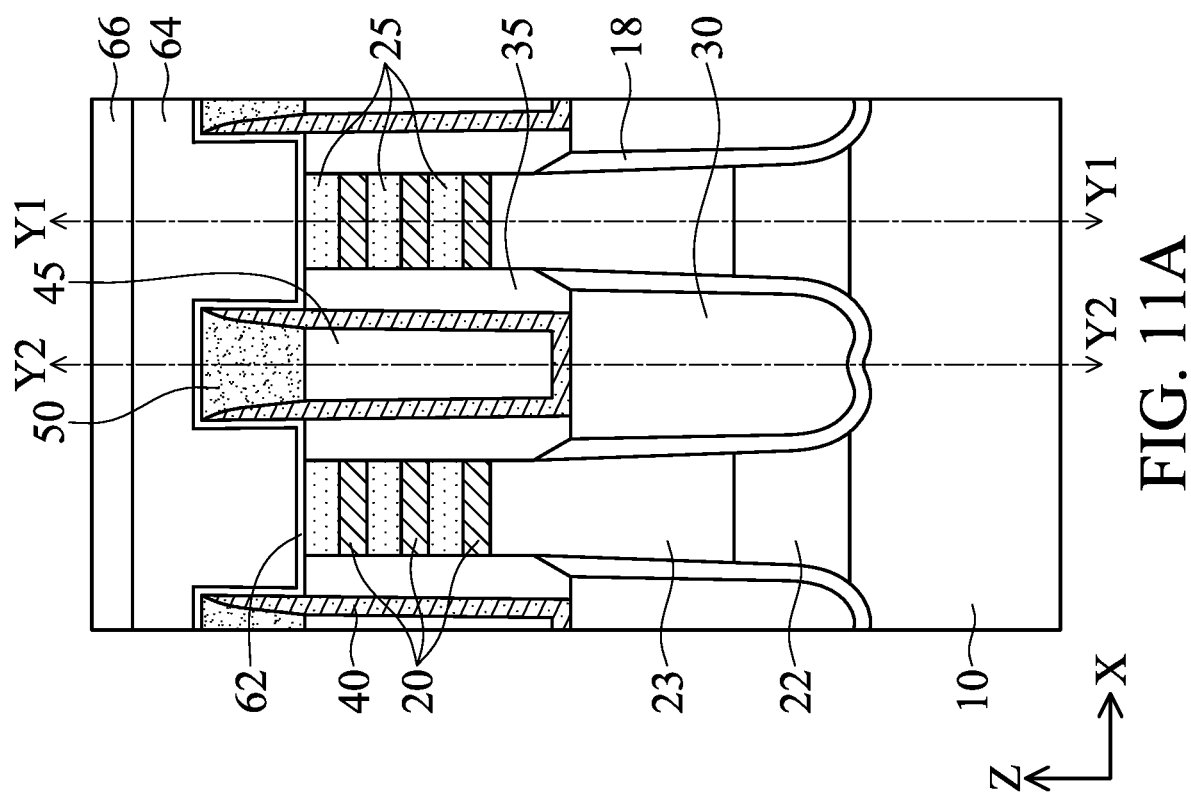
FIG. 11A
FIG. 11B

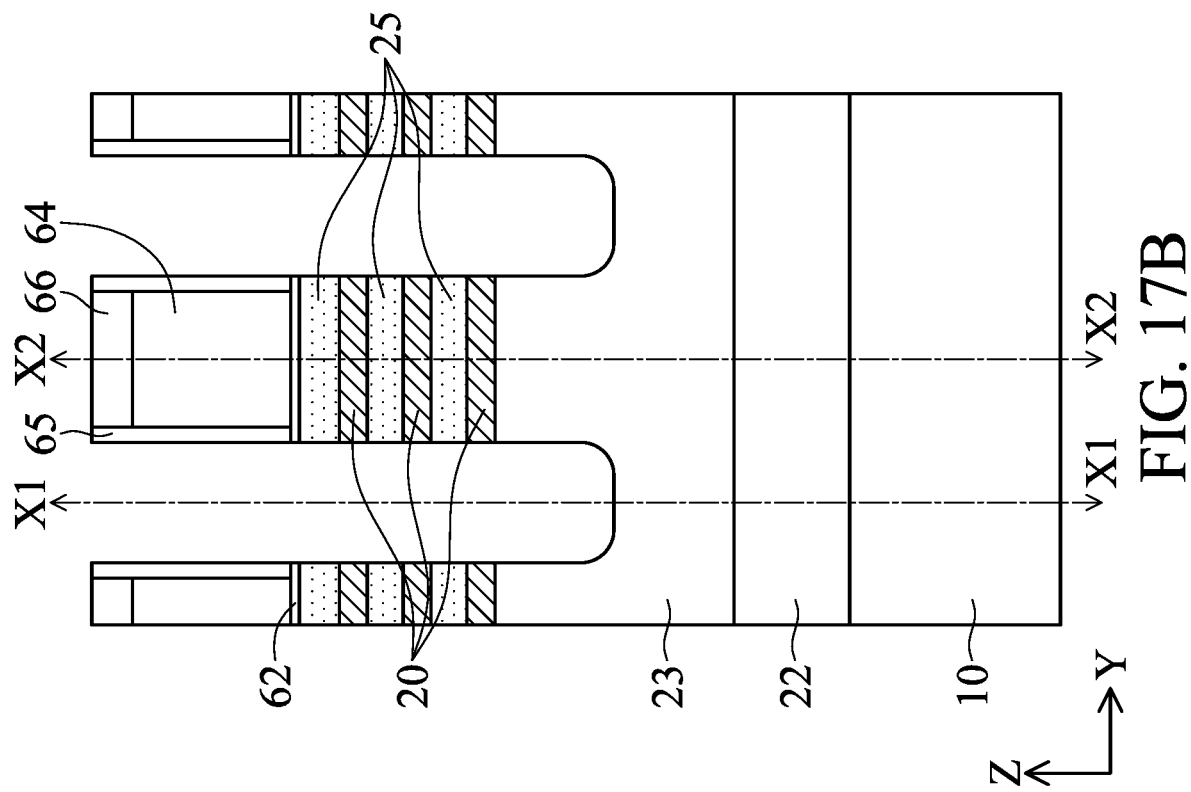
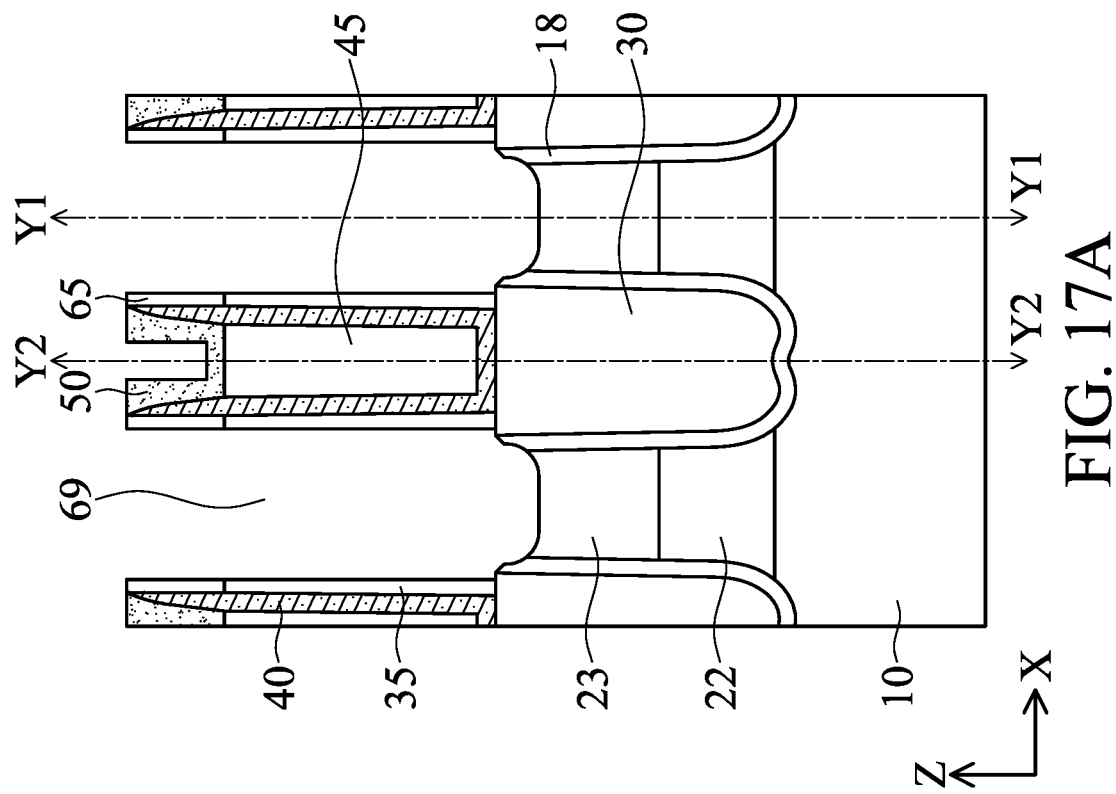
FIG. 17B
FIG. 17A

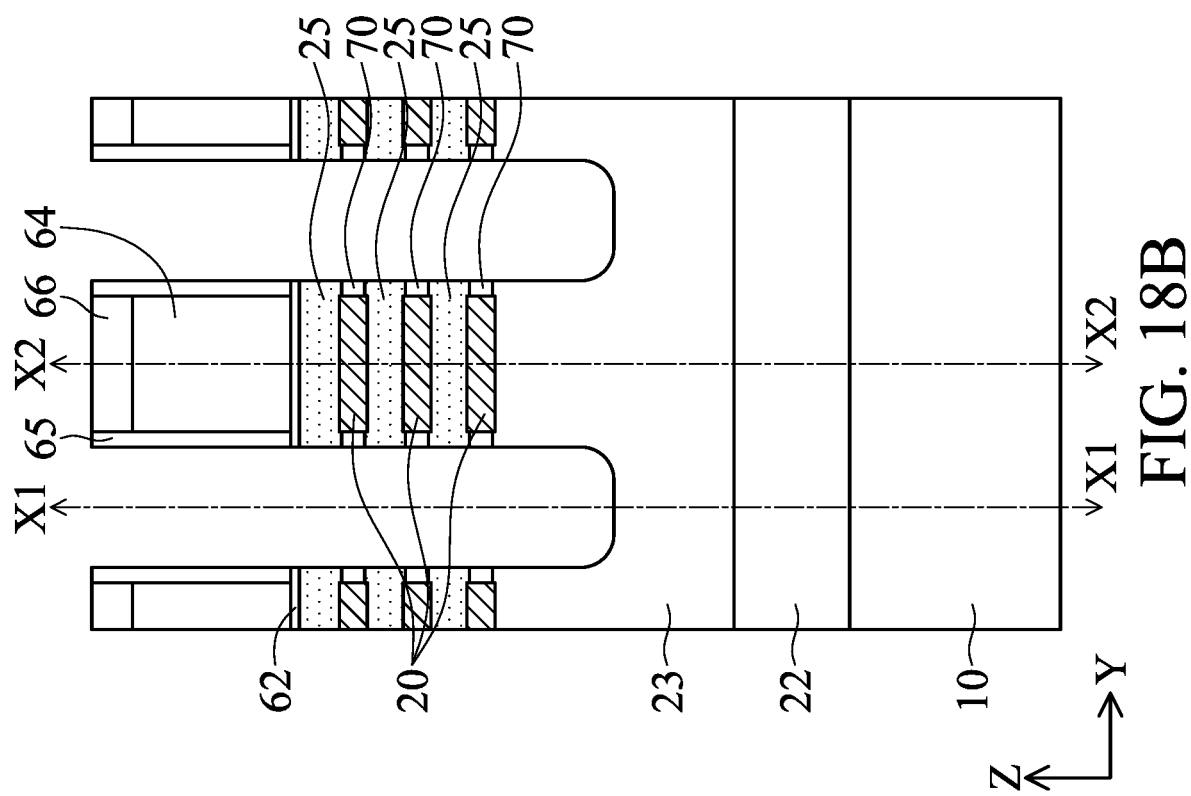
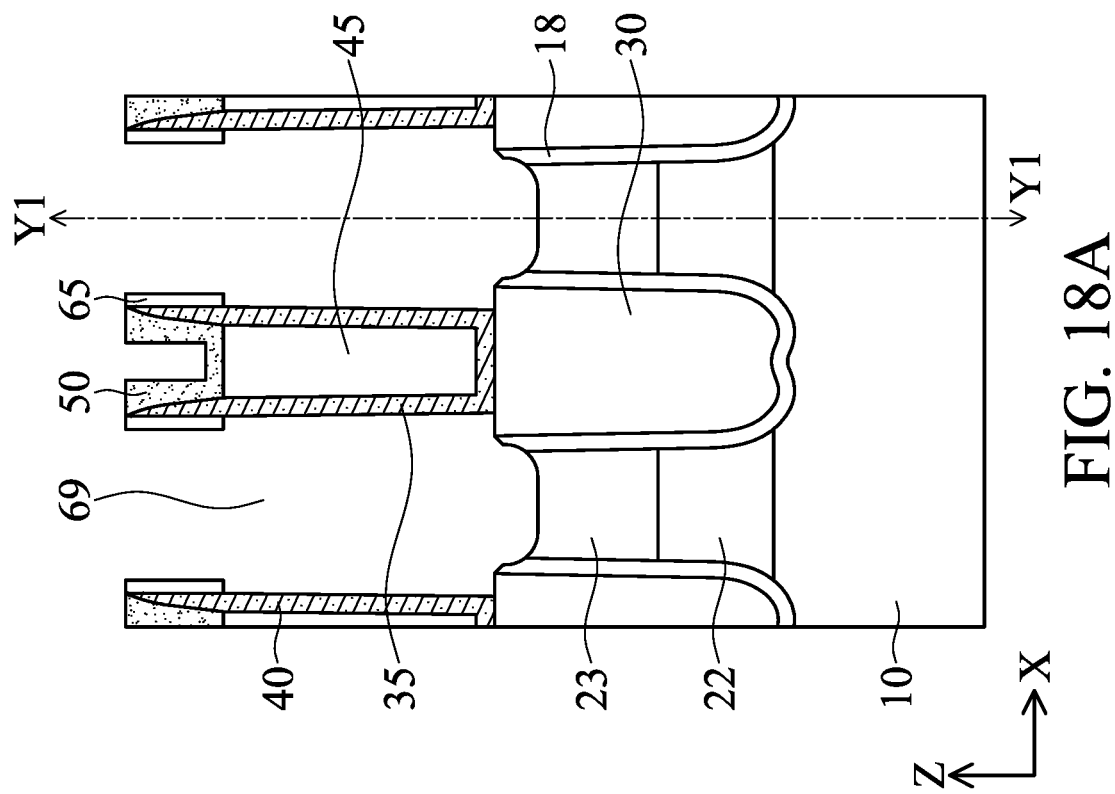
FIG. 18B
FIG. 18A

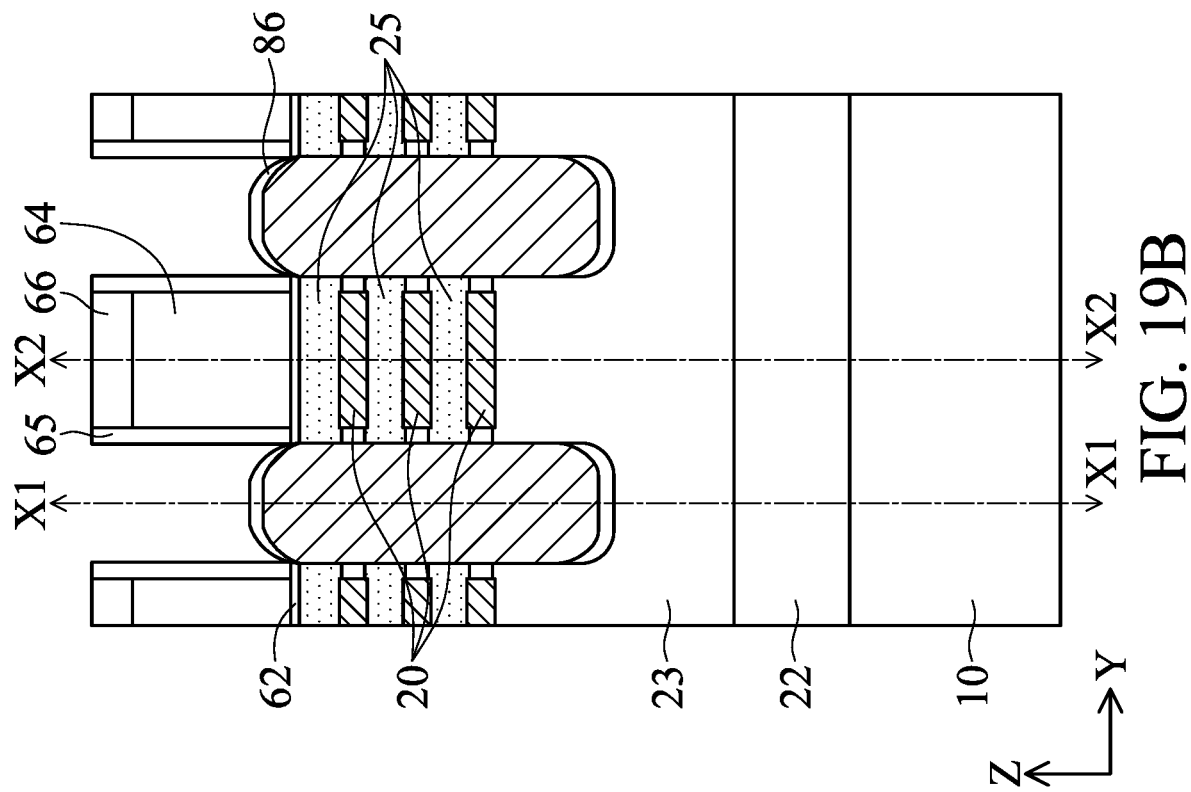
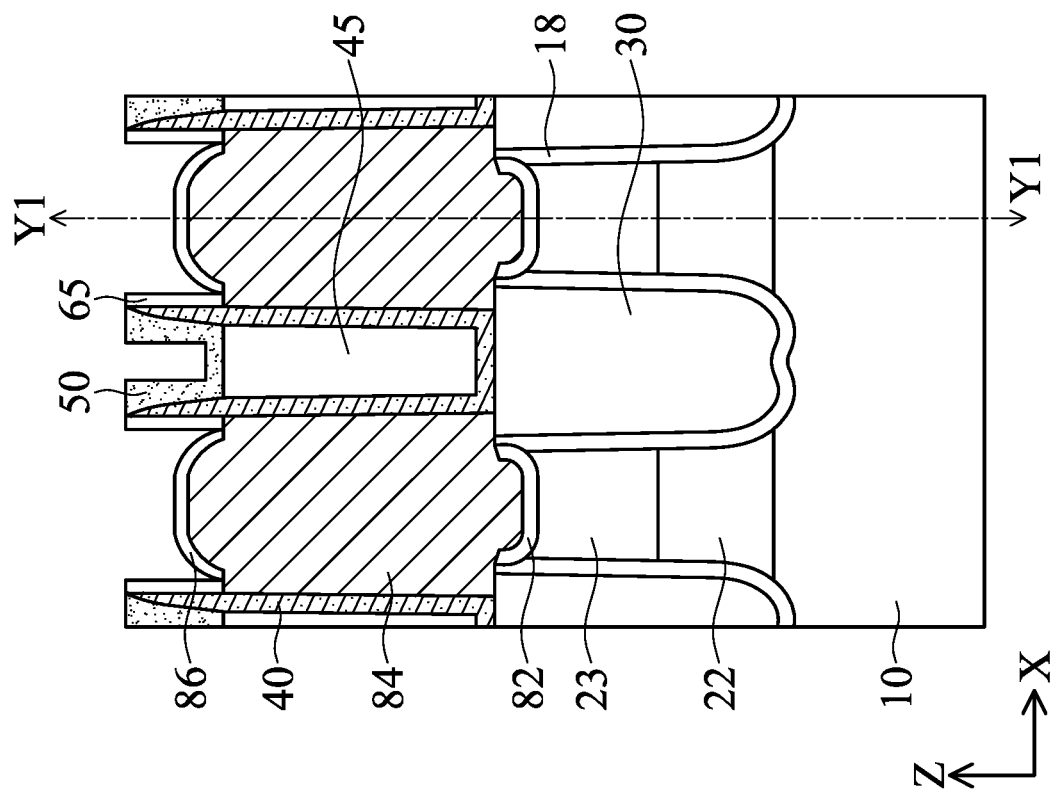
FIG. 19B
FIG. 19A

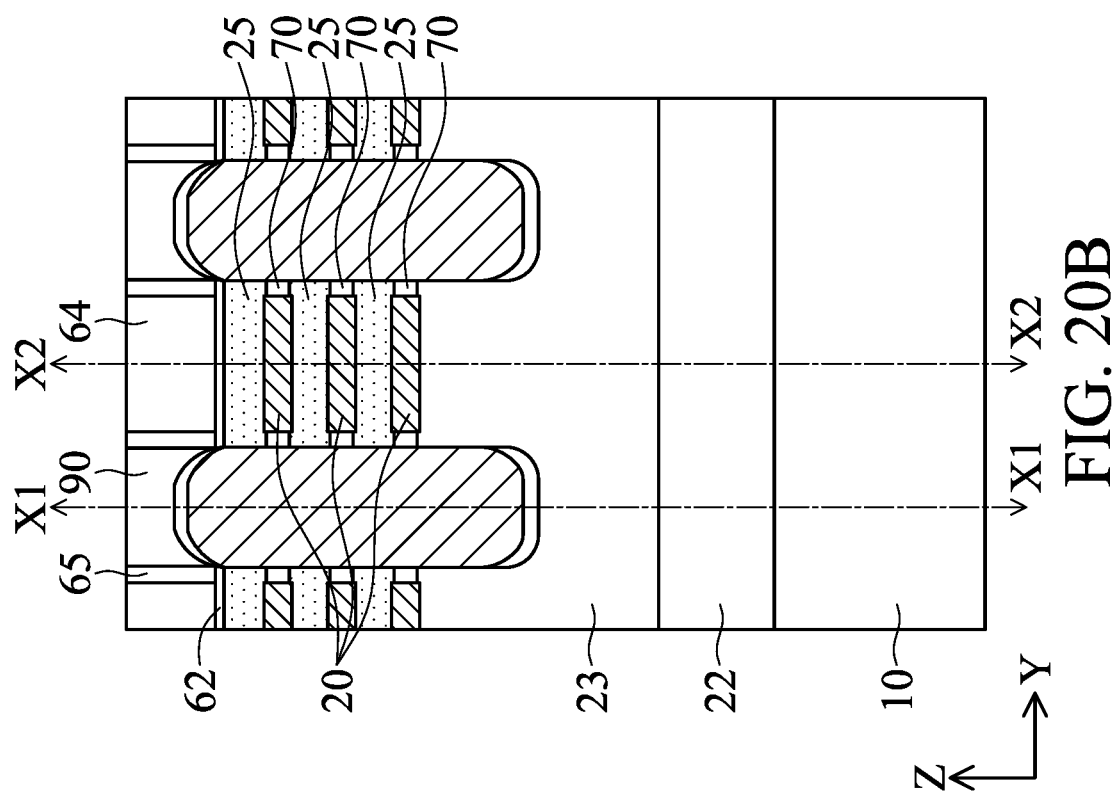
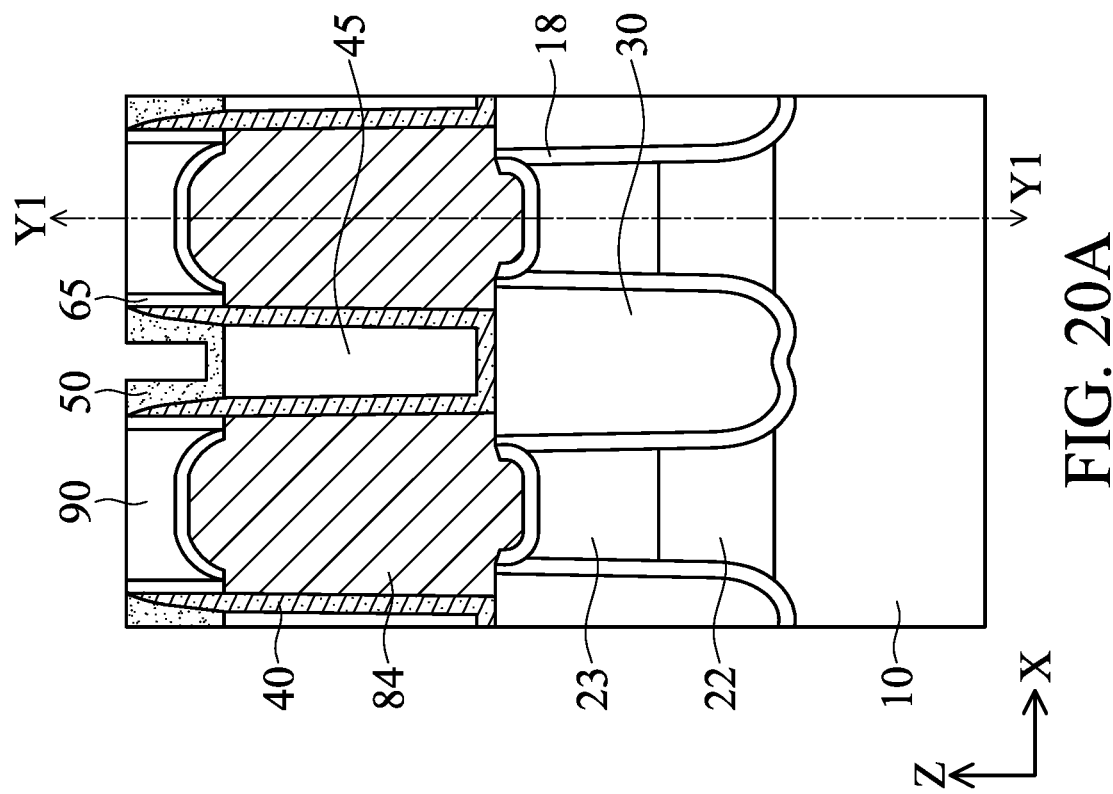
FIG. 20B
FIG. 20A

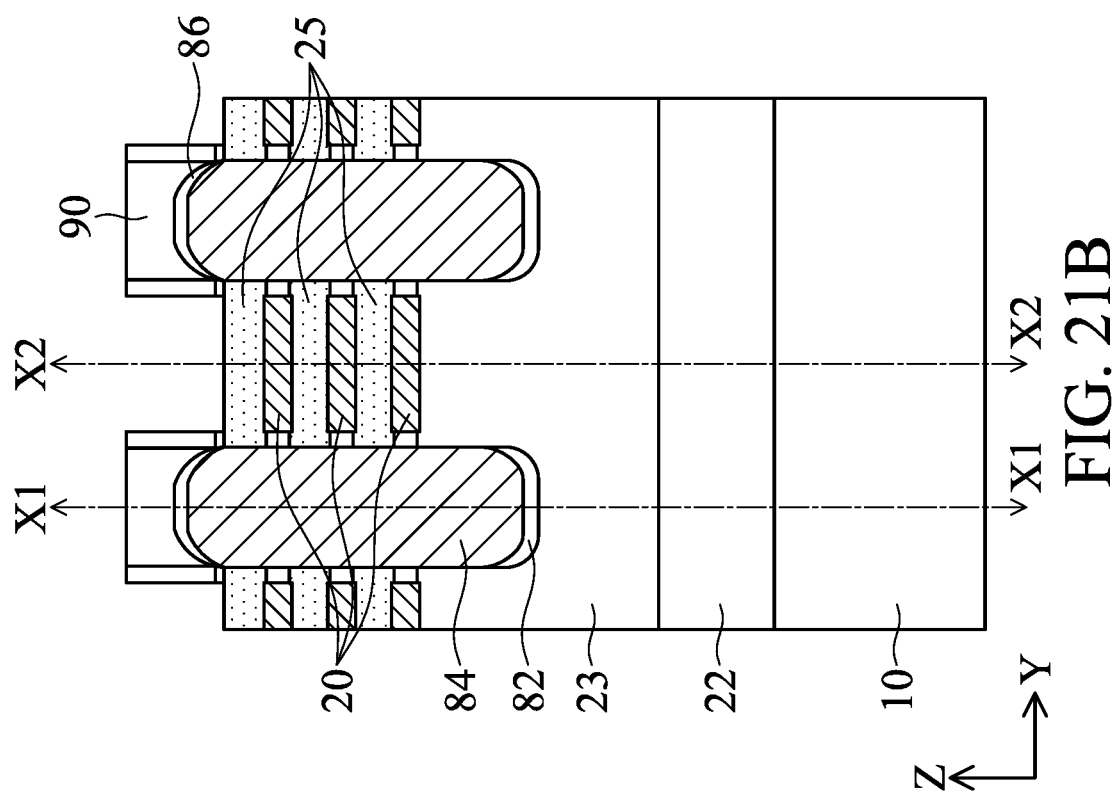
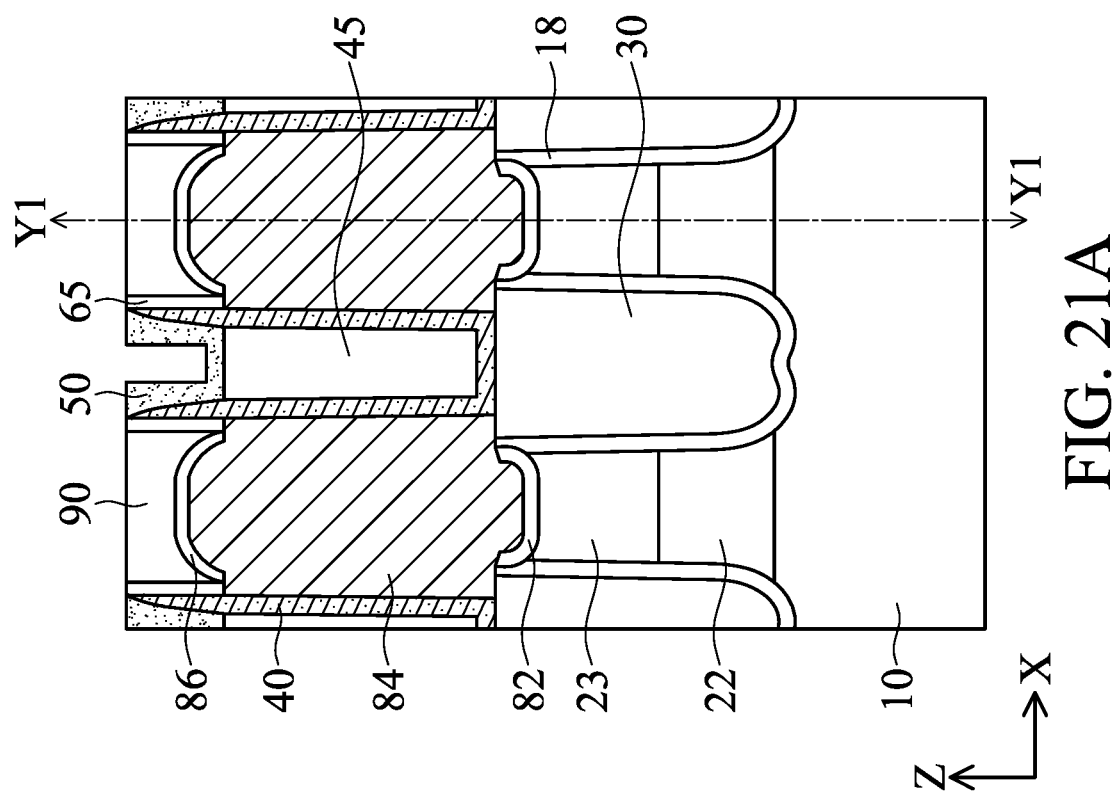

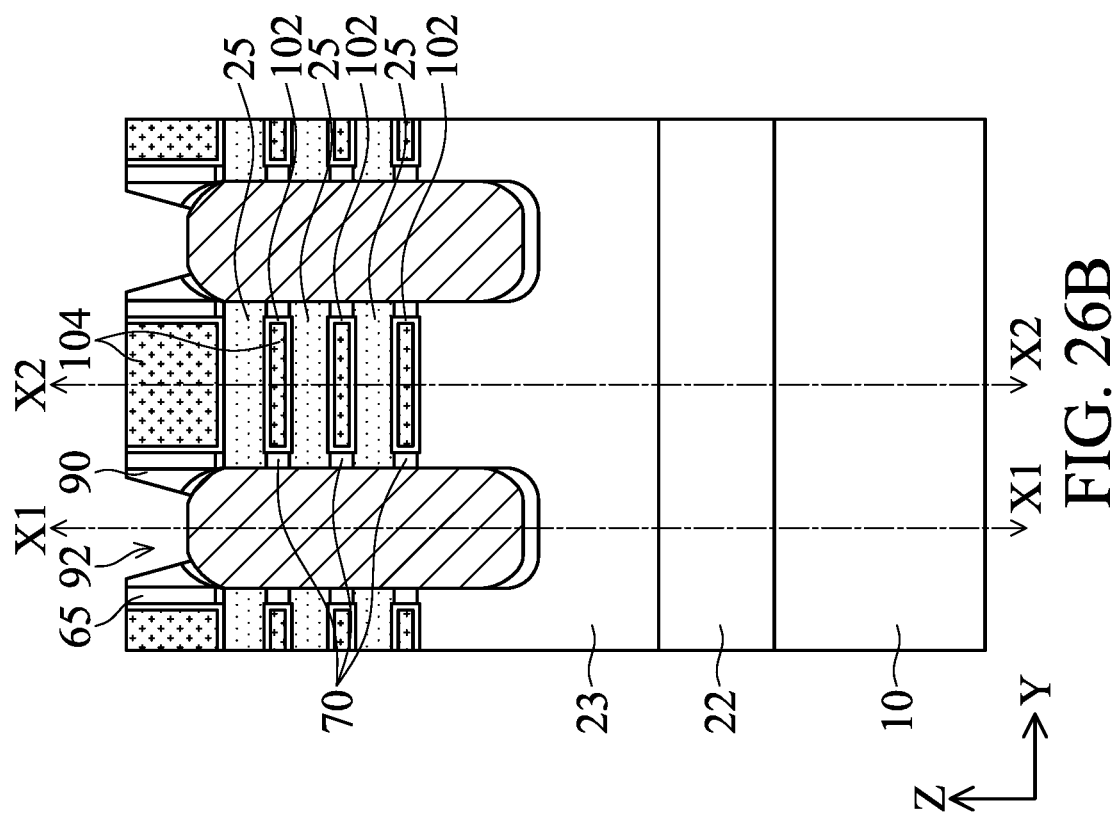
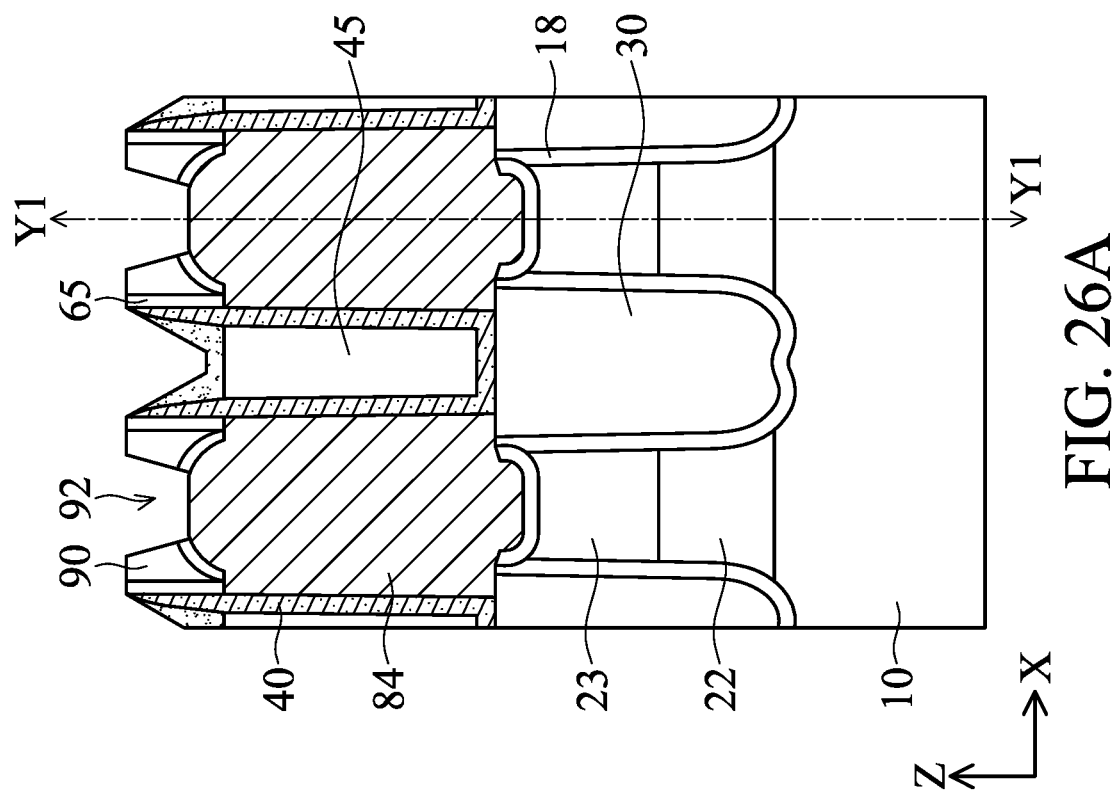
FIG. 26B
FIG. 26A

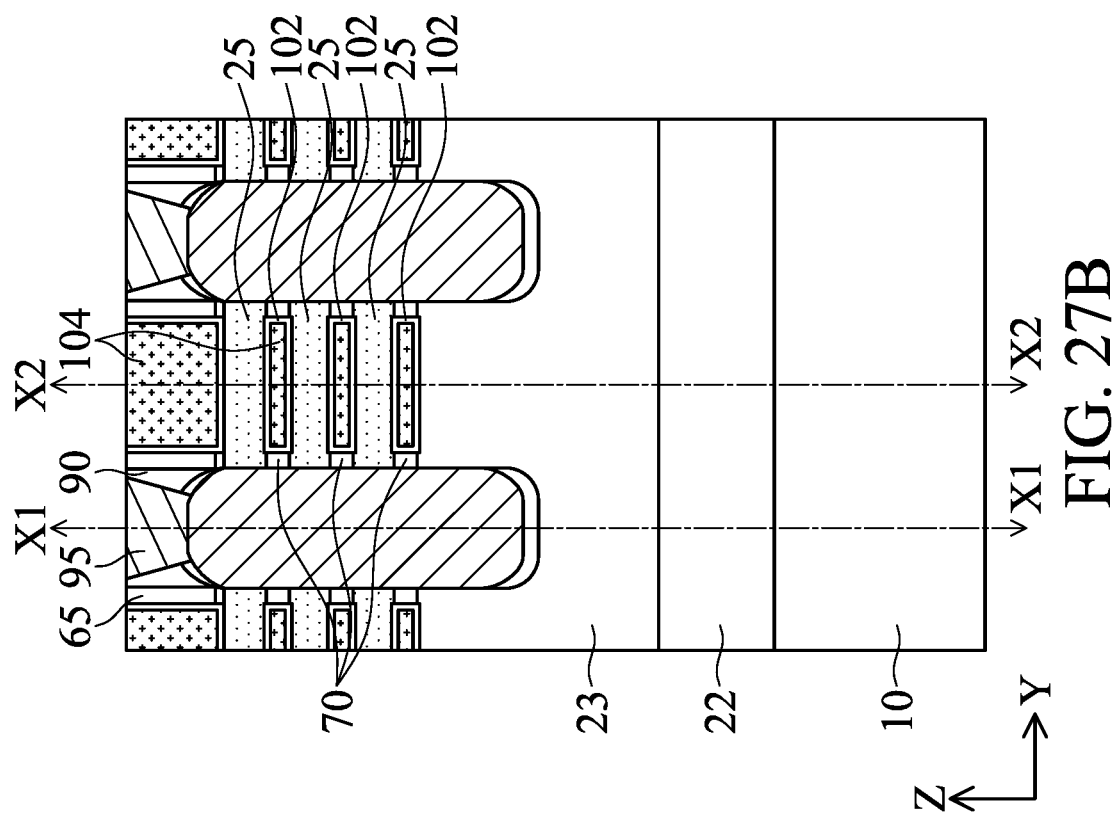
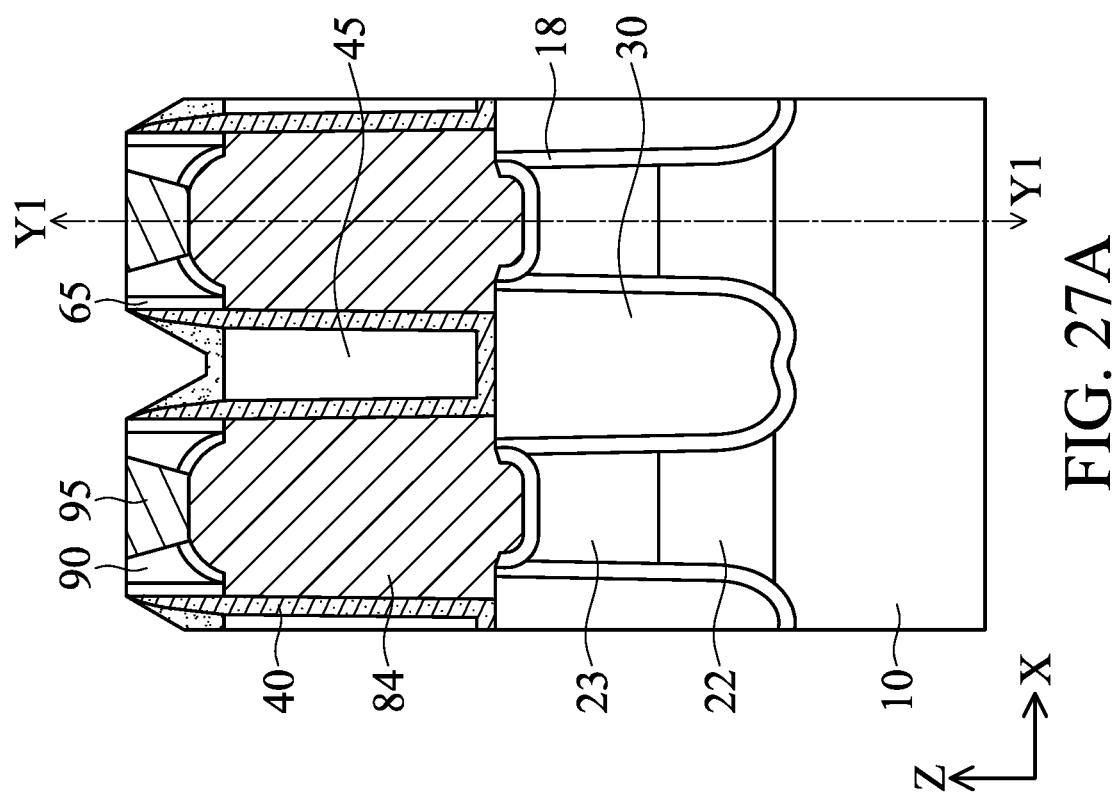
FIG. 27A
FIG. 27B

METHOD OF MANUFACTURING A SEMICONDUCTOR DEVICE AND A SEMICONDUCTOR DEVICE

CROSS-REFERENCE TO RELATED APPLICATIONS

This application claims priority to U.S. Provisional Patent Application No. 63/225,339 filed on Jul. 23, 2021, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (Fin FET) and a gate-all-around (GAA) FET.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 2A, 2B, 3, 4, 5, 6, 7, and 8 show cross sectional views of various stages of manufacturing a semiconductor device according to embodiments of the disclosure.

FIGS. 10A, 10B and 10C show various views of one of the various stages of manufacturing a fin FET device according to an embodiment of the present disclosure.

FIGS. 11A, 11B and 11C show various views of one of the various stages of manufacturing a fin FET device according to an embodiment of the present disclosure.

FIGS. 17A, 17B, 17C and 17D show various views of one of the various stages of manufacturing a fin FET device according to an embodiment of the present disclosure.

FIGS. 18A, 18B and 18C show various views of one of the various stages of manufacturing a fin FET device according to an embodiment of the present disclosure.

FIGS. 19A, 19B and 19C show various views of one of the various stages of manufacturing a fin FET device according to an embodiment of the present disclosure.

FIGS. 20A, 20B and 20C show various views of one of the various stages of manufacturing a fin FET device according to an embodiment of the present disclosure.

FIGS. 21A, 21B and 21C show various views of one of the various stages of manufacturing a fin FET device according to an embodiment of the present disclosure.

FIGS. 26A, 26B and 26C show various views of one of the various stages of manufacturing a fin FET device according to an embodiment of the present disclosure.

FIGS. 27A, 27B, 27C, 27D, 27E and 27F show various views of one of the various stages of manufacturing a fin FET device according to an embodiment of the present disclosure.

DETAILED DESCRIPTION

Figure 1B:
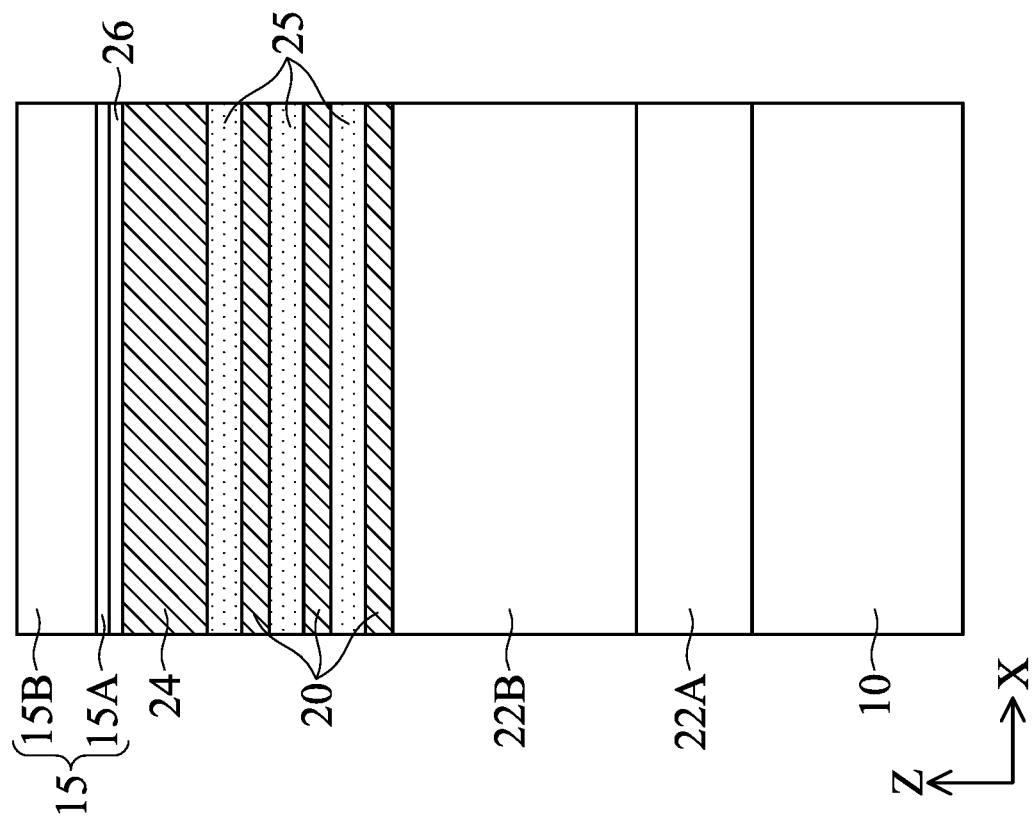

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Fin field effect transistors (Fin FETs) are non-planar, multi-gate transistors having "fins" that perpendicularly extend from the gate and form the source and the drain of the transistor. Multiple Fin FETs may be coupled to one another to provide an integrated circuit device. One of the factors that determine device performance of a fin FET (Fin FET), or similar devices, is a capacitance between adjacent fins. An increase in the parasitic capacitance degrades circuit speed, and thereby reduce device performance In this disclosure, a source/drain refers to a source and/or a drain. It is noted that in the present disclosure, a source and a drain are interchangeably used and the structures thereof are substantially the same.

FIGS. 1-9D show various stages of manufacturing a semiconductor FET device according to an embodiment of the present disclosure. It is understood that additional operations can be provided before, during, and after processes shown by FIGS. 1-9D, and some of the operations described below can be replaced or eliminated, for additional embodiments of the method. The order of the operations/processes may be interchangeable.

Figure 1A:
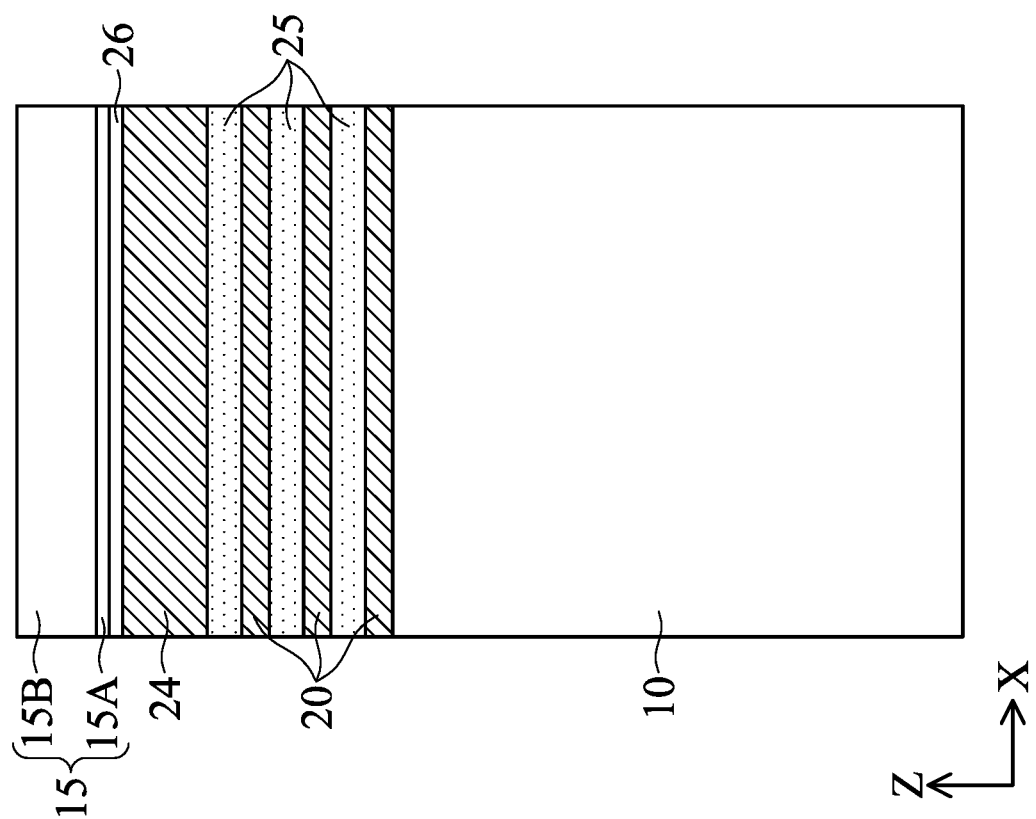

As shown in FIG. 1A, first semiconductor layers 20 and second semiconductor layers 25 are alternately formed over a semiconductor substrate 10. In some embodiments, the semiconductor substrate 10 is a crystalline Si substrate. In other embodiments, the substrate 10 includes another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is equal to or more than about 0.2 and equal to or less than about 0.6, and the second semiconductor layers 25 are Si or $Si_{1-y}Ge_y$, where y is smaller than x and equal to or less than about 0.1. In this disclosure, an "M" compound" or an "M based compound" means the majority of the compound is M.

The thickness of the first semiconductor layers 20 may be equal to or smaller than that of the second semiconductor layers 25, and is in a range from about 4 nm to about 30 nm in some embodiments, and is in a range from about 5 nm to about 20 nm in other embodiments. The thickness of the second semiconductor layers 25 is in a range from about 4 nm to about 30 nm in some embodiments, and is in a range from about 5 nm to about 20 nm in other embodiments. The thicknesses of the first semiconductor layers 20 may be the same as, or different from each other and the thicknesses of the second semiconductor layers 25 may be the same as, or different from each other. Although three first semiconductor layers 20 and three second semiconductor layers 25 are shown in FIG. 1A, the numbers are not limited to three, and are 1, 2 or more than 3, and less than 10 in some embodiments.

Moreover, in some embodiments, a top semiconductor layer 24 is epitaxially formed over the stacked structure of the first semiconductor layers 20 and the second semiconductor layers 25. In some embodiments, the top semiconductor layers 24 are $Si_{1-z}Ge_z$, where z is equal to or more than about 0.2 and equal to or less than about 0.7. In some embodiments, z=x. The thickness of the top semiconductor layer 24 is greater than that of each of the first semiconductor layers 20 and the second semiconductor layers 25. In some embodiments, the thickness of the top semiconductor layer 24 is in a range from about 10 nm to about 100 nm, and is in a range from about 20 nm to about 50 nm in other embodiments. Further, in some embodiments, a cap semiconductor layer 26 made of a different material than the top semiconductor layer 24 is epitaxially formed on the top semiconductor layer 24. In some embodiments, the cap semiconductor layer is made of Si and has a thickness in a range from about 0.5 nm to about 10 nm. The cap semiconductor layer 26 is used to control Ge out-diffusion from the top semiconductor layer 24, and to maintain the quality of the surface of the top semiconductor layer 24 during a chemical mechanical polishing (CMP) process subsequently performed.

Further, a hard mask layer 15 including one or more layers of an insulating material or an amorphous semiconductor material (e.g., a-Si) is formed over the cap semiconductor layer 26. In some embodiments, the hard mask layer 15 includes a first hard mask layer 15A and a second hard mask layer 15B. In some embodiments, the first hard mask layer 15A is silicon oxide having a thickness in a range from 1 nm to about 20 nm and the second hard mask layer 15B is silicon nitride having a thickness in a range from about 10 nm to about 100 nm.

Figure 2B:
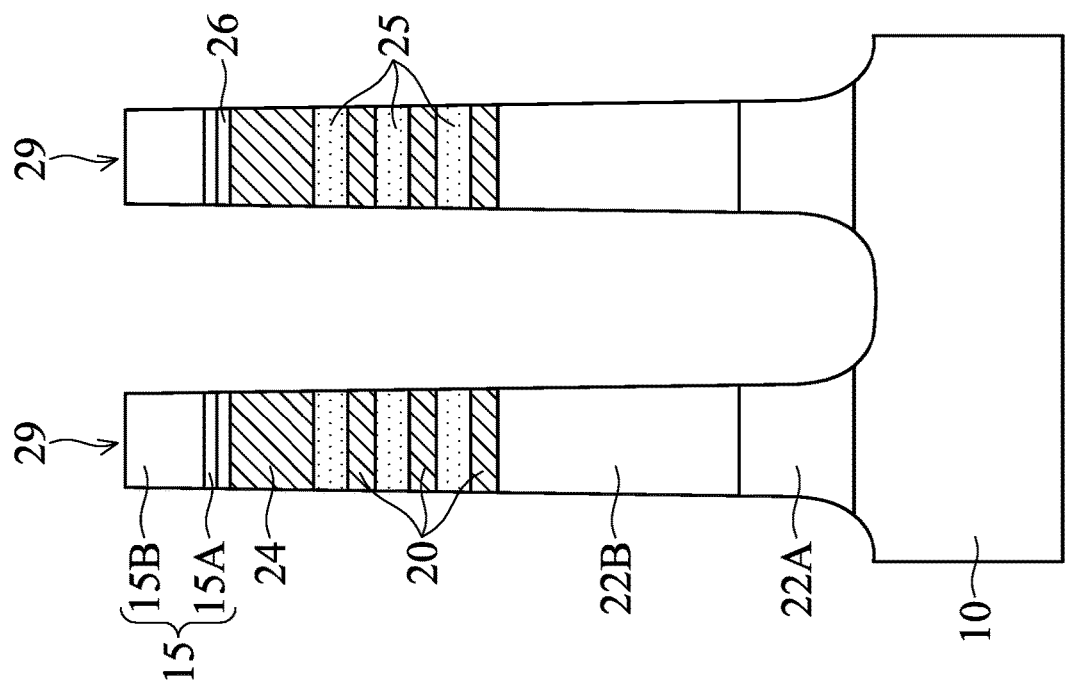
Figure 2A:
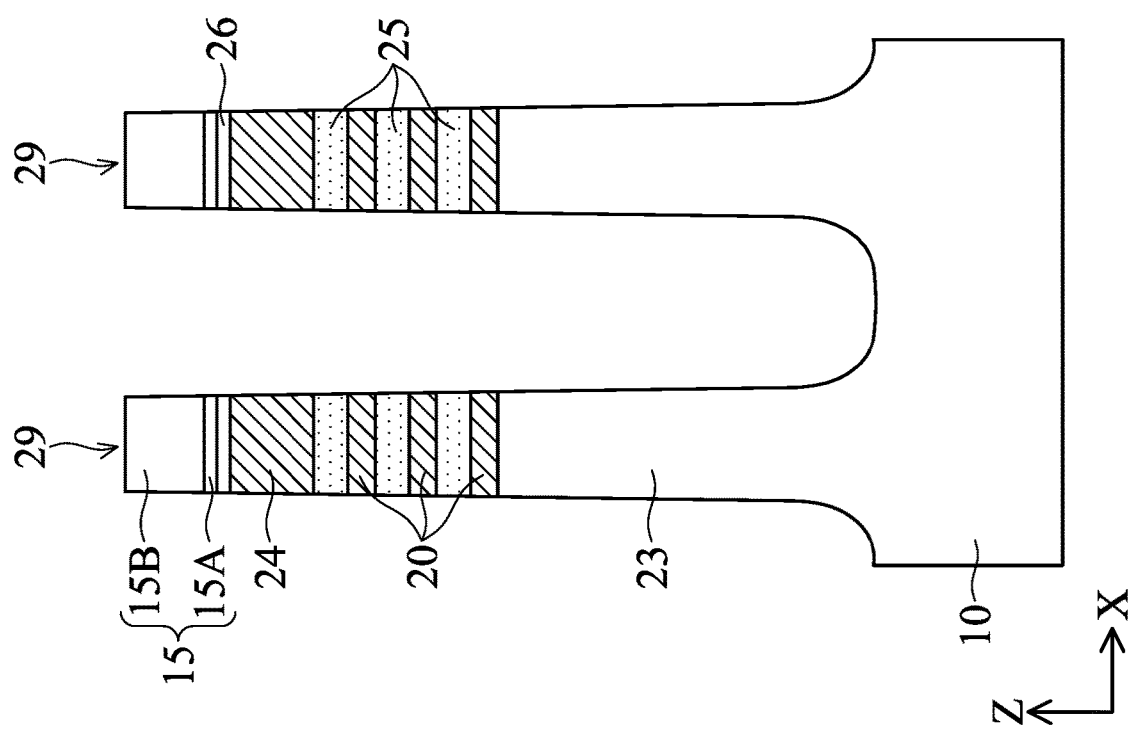

After the stacked layers as shown in FIG. 1A are formed, fin structures are formed by using one or more lithography and etching operations, as shown in FIG. 2A. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the hard mask layer 15. By using the patterned hard mask layer as an etching mask, the stacked semiconductor layers are patterned into fin structures 29 as shown in FIG. 2A. In some embodiments, the top semiconductor layer 24 and the cap semiconductor layer 26 are part of the hard mask layer and an etch stop layer for a CMP process subsequently performed.

In FIG. 2A, the fin structures 29 extend in the Y direction and are arranged in the X direction. The number of the fin structures is not limited to two as shown in FIG. 2A, and may be as small as one and three or more. In some embodiments, one or more dummy fin structures are formed on both sides of the fin structures 29 to improve pattern fidelity in the patterning operations. As shown in FIG. 2A, the alternate stack of the first and second semiconductor layers is disposed on a bottom fin structure 23.

The width of the upper portion of the fin structure 29 along the Y direction is in a range from about 5 nm to about 40 nm in some embodiments, and is in a range from about 10 nm to about 30 nm in other embodiments.

In some embodiments, a first bottom semiconductor layer 22A is epitaxially formed on a semiconductor substrate 10 before the alternate stack of the first and second semiconductor layers are formed. The first bottom semiconductor layer 22A is made of different material than the substrate 10. When the substrate 10 is a Si substrate, the first bottom semiconductor layer 22A includes SiGe, where a Ge content is about 10 atomic % to about 60 atomic % ($Si_{0.9}Ge_{0.1}$—$Si_{0.4}Ge_{0.6}$) in some embodiments. The thickness of the first bottom semiconductor layer 22A is in a range from about 4 nm to about 30 nm in some embodiments, and is in a range from about 5 nm to about 25 nm in other embodiments.

Further, a second bottom semiconductor layer 22B is epitaxially formed over the first bottom semiconductor layer 22A. The second bottom semiconductor layer 22B is made of different material than the first bottom semiconductor layer 22A. When the first bottom semiconductor layer 22A is made of SiGe, the second bottom semiconductor layer 22B includes Si or SiGe, where a Ge content is smaller than the first bottom semiconductor layer 22B and is more than 0 atomic % to about 10 atomic % in some embodiments. The thickness of the second bottom semiconductor layer 22B is in a range from about 40 nm to about 200 nm in some embodiments, and is in a range from about 50 nm to about 150 nm in other embodiments.

Then, as shown in FIG. 1B, the first semiconductor layers 20 and second semiconductor layers 25 are alternately formed over the second bottom semiconductor layer 22B. Further similar to FIG. 2A, the fin structures 29 are formed as shown in FIG. 2B.

After the fin structures 29 are formed as shown in FIG. 2A, one or more liner insulating layers 18 are formed over the fin structures 29, and an insulating material layer 30 including one or more layers of insulating material is formed over the substrate so that the fin structures 29 with the liner layer 18 are fully embedded in the insulating layer 30.

Figure 3:
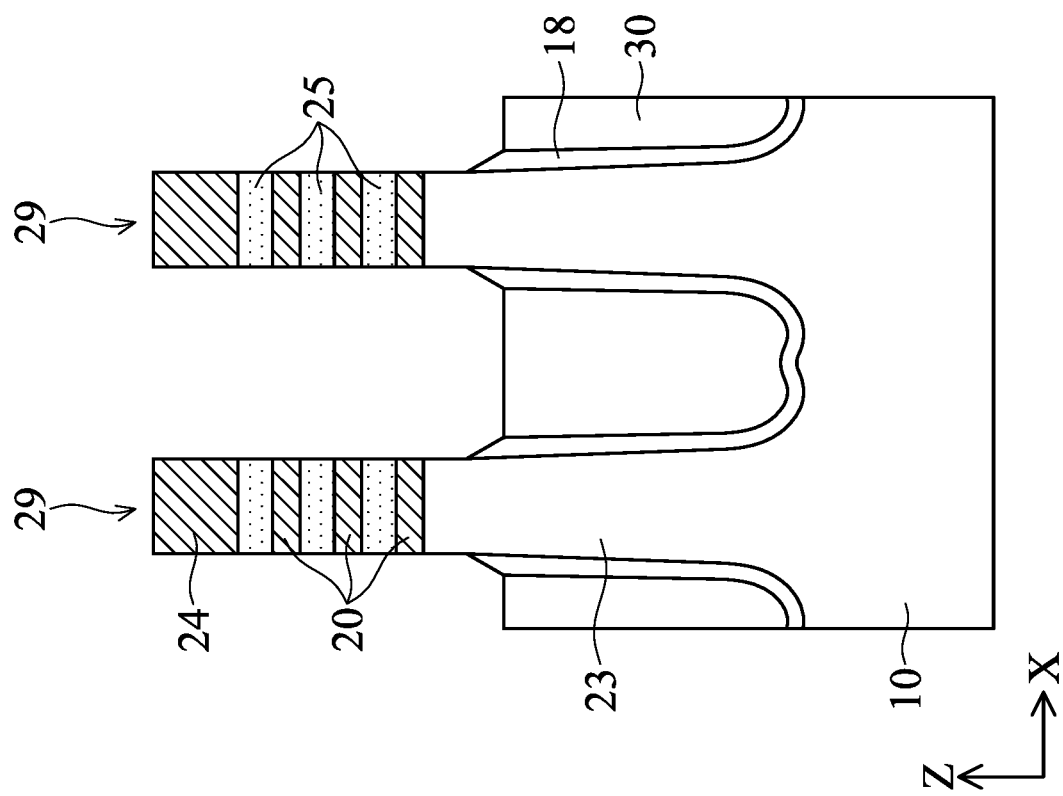

The insulating material for the liner layer 18 and the insulating layer 30 are the same or different from each other, and include one or more of silicon oxide, silicon nitride, silicon oxynitride (SiON), SiOCN, SiOC, SiCN, fluorine-doped silicate glass (FSG), or a low-k dielectric material. In some embodiments, the liner layer 18 is made of silicon oxide or silicon nitride, and the insulating layer 30 is made of silicon oxide. The insulating material is formed by LPCVD (low pressure chemical vapor deposition), plasma-enhanced CVD (PECVD), flowable CVD and/or atomic layer deposition (ALD). An anneal operation may be performed after the formation of the insulating layer 30. Then, a planarization operation, such as a chemical mechanical polishing (CMP) method and/or an etch-back method, is performed such that the upper surface of the hard mask layer 15 (the second hard mask layer 15B) is exposed from the insulating material layer 30, as shown in FIG. 3.

Figure 4:
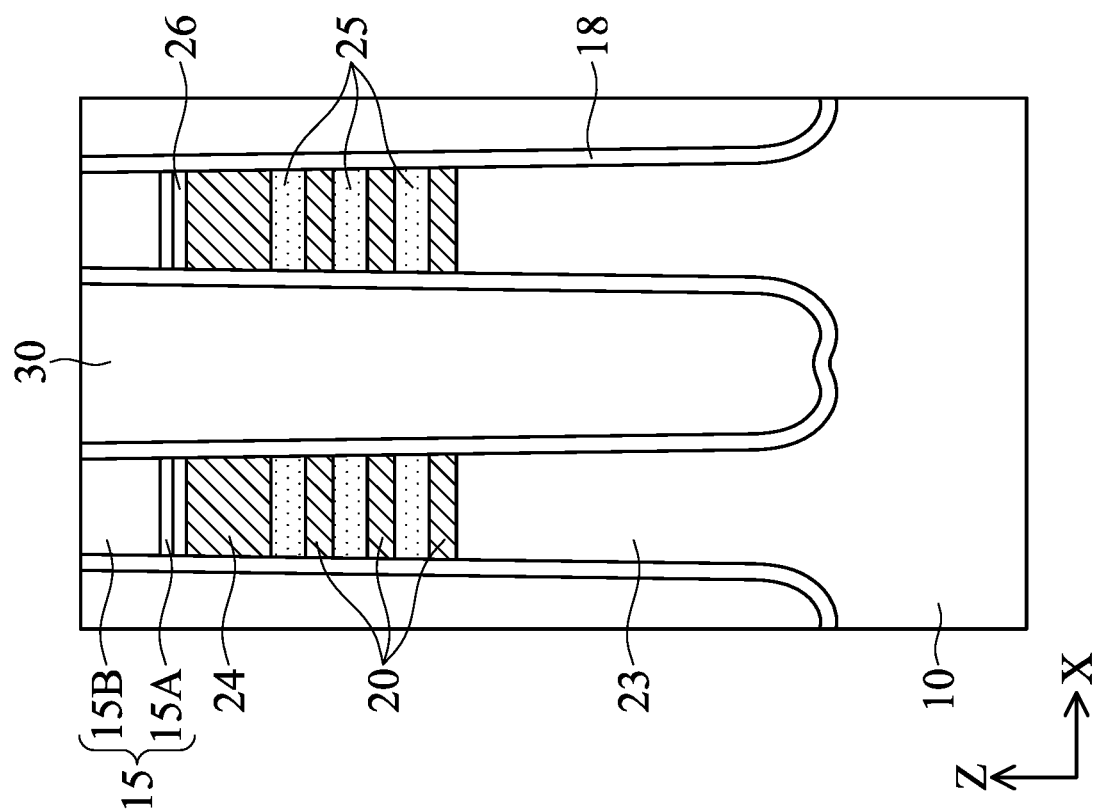

Then, as shown in FIG. 4, the insulating material layer is recessed to form an isolation insulating layer 30 so that the upper portions of the fin structures 29 are exposed. With this operation, the fin structures 29 are separated from each other by the isolation insulating layer 30, which is also called a shallow trench isolation (STI).

In some embodiments, the insulating material layer 30 is recessed until the upper portion of the bottom fin structure 23 is exposed. The first semiconductor layers 20 are sacrificial layers which are subsequently removed, and the second semiconductor layers 25 are subsequently formed into semiconductor wires or sheets (nano-bodies or nano-structures) as channel layers of a GAA FET. In some embodiments, during or after the recess etching of the insulating layer 30, the liner layer 18, the hard mask layer 15 and the cap semiconductor layer 26 are removed, thereby exposing the top semiconductor layer 24, as shown in FIG. 4.

After the isolation insulating layer 30 is formed, a sacrificial cladding layer 35 is formed over the exposed portion of the fin structures 29, as shown in FIG. 5. The sacrificial cladding layer 35 includes one or more insulating materials or semiconductor materials. In some embodiments, the sacrificial cladding layer 35 includes amorphous or poly crystalline semiconductor material (e.g., Si, SiC, SiGe or Ge). In certain embodiments, the sacrificial cladding layer 35 is amorphous SiGe, having a Ge concentration in a range from about 20 atomic % to about 40 atomic %. In some embodiments, the Ge concentration of the sacrificial cladding layer 35 is the same as or similar to (difference within ±5%) the Ge concentration of the first semiconductor layer 20. In some embodiments, the thickness of the sacrificial cladding layer 35 is in a range from about 5 nm to about 50 nm. If the thickness of the sacrificial cladding layer 35 is smaller than this range, a space for a metal gate formation is too small and some of the layers of the metal gate structure would not be properly formed. If the thickness of the sacrificial cladding layer 35 is larger than this range, electrical separation between adjacent fin structures would be insufficient. In some embodiments, before forming the sacrificial cladding layer 35, a thin semiconductor layer is formed over the exposed portion of the fin structures 29. In some embodiments, the thin semiconductor layer is non-doped Si. In some embodiments, the non-doped Si is crystalline Si. In some embodiments, the thickness of the thin semiconductor layer is in a range from about 2 nm to about 3 nm. The sacrificial cladding layer 35 is conformally formed by CVD or ALD in some embodiments. The deposition temperature of the sacrificial cladding layer 35 is less than or similar to the deposition temperature of the first semiconductor layers 20, in some embodiments. In some embodiments, the deposition temperature of the sacrificial cladding layer 35 is in a range from about 500° C. to 650° C. The source gas includes a mixture of $SiH_4$, $GeH_4$, and HCl with $H_2$ or $N_2$ as a carrier gas. The sacrificial cladding layer 35 controls stress in the isolation area.

Then, as shown in FIG. 6, one or more etch-back operations are performed to remove horizontal portions of the sacrificial cladding layer 35 so as to expose the upper surface of the top semiconductor layer 24 and the upper surface of the isolation insulating layer 30. In some embodiments, after the deposition-etching operation, a wet cleaning process to remove residuals is performed.

Figure 7:
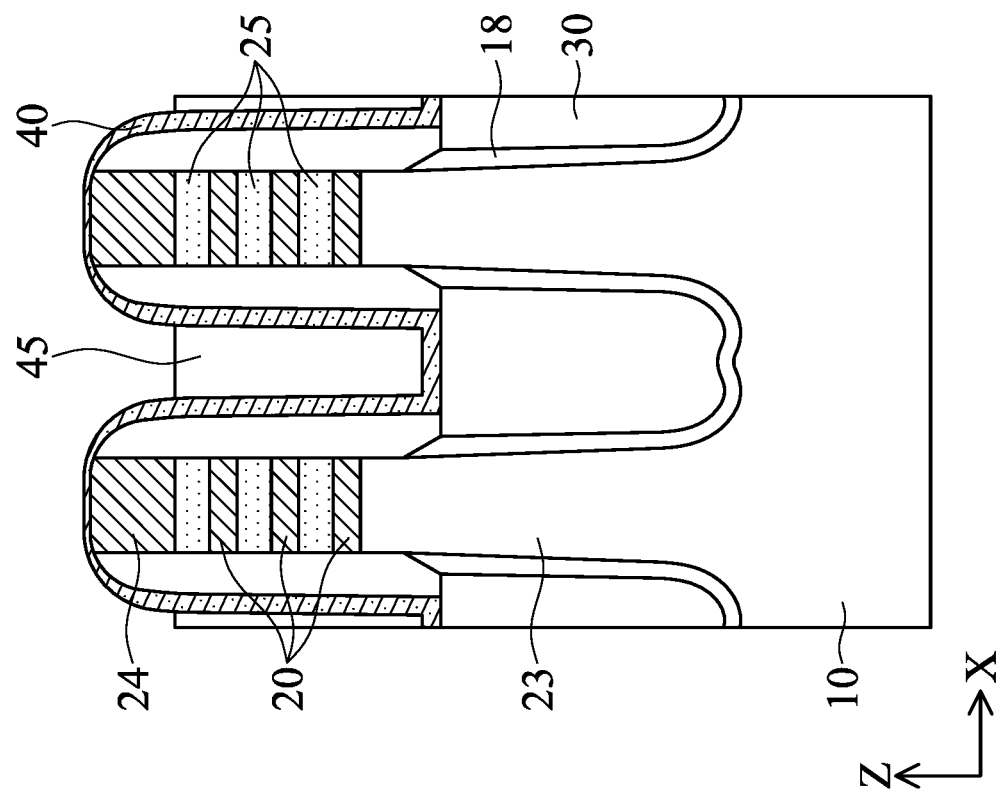

Subsequently, a first dielectric layer 40 is formed over the fin structures, and a second dielectric layer 45 is formed over the first dielectric layer 40 such that the fin structures are fully embedded in the second dielectric layer 45, as shown in FIG. 7. The first dielectric layer 40 includes one or more layers of insulating materials such as silicon oxide, silicon oxynitride, silicon nitride, SiOC, SiCN or SiOCN, formed by LPCVD (low pressure chemical vapor deposition), plasma-CVD or atomic layer deposition (ALD), or any other suitable film formation method. In certain embodiments, SiCN or SiOCN is used as the first dielectric layer 40. In some embodiments, as shown in FIG. 7, the first dielectric layer 40 is conformally formed over the fin structures such that a space is formed between adjacent fin structures. The thickness of the first dielectric layer 40 is in a range of about 2.5 nm to about 20 nm in some embodiments, and is in a range from about 5 nm to about 10 nm in other embodiments.

The material of the second dielectric layer 45 is different from the material of the first dielectric layer 40. In some embodiments, the second dielectric layer 45 includes one or more layers of insulating materials such as silicon oxide, silicon oxynitride, silicon nitride, SiOC, SiCN or SiOCN formed by LPCVD, plasma-CVD or ALD, or any other suitable film formation method. In some embodiments, the second dielectric layer 45 is made of silicon nitride or silicon oxide. In some embodiments, the second dielectric layer 45 includes a first layer and a second layer. The first layer is silicon oxide formed by, for example, a flowable CVD process followed by a thermal annealing process at 400° C. to 800° C. in an inert gas ambient. The second layer is also silicon oxide formed by a plasma CVD process. The thickness of the second dielectric layer 45 is in a range of about 60 nm to about 500 nm in some embodiments. As shown in FIG. 7, the second dielectric layer 45 fully fills the space between adjacent fin structures, in some embodiments. In other embodiments, a void is formed in the bottom part of the space. In some embodiments, one or more additional dielectric layers are formed between the first dielectric layer 40 and the second dielectric layer 45.

Figure 8:
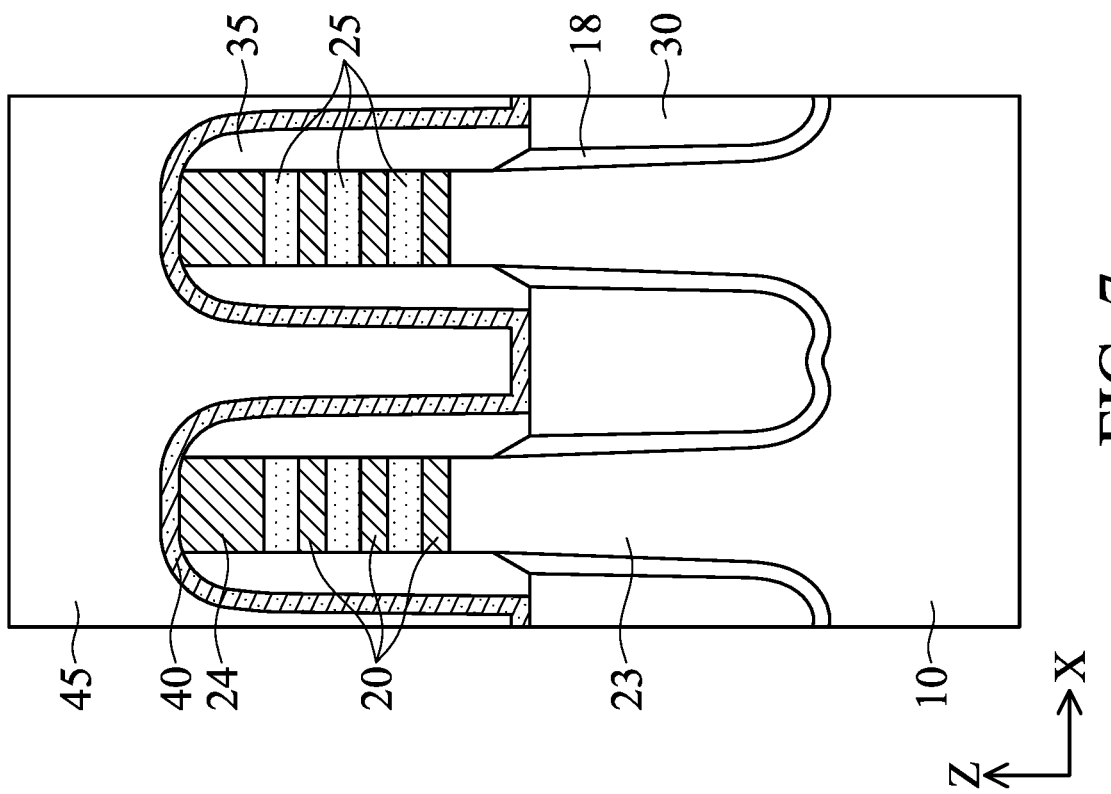

After the second dielectric layer 45 is formed, a planarization operation, such as an etch-back process or a chemical mechanical polishing (CMP) process, is performed to planarize the second dielectric layer 45 and to expose the upper surface of the top semiconductor layer 24. In some embodiments, the top semiconductor layer 24 is slightly etched by about 5 nm to about 10 nm. Further, one or more additional etch-back operations are performed to recess the second dielectric layer 45 as shown in FIG. 8. The second dielectric layer 45 is recessed to a level substantially equal (within ±5 nm) to the interface between the top semiconductor layer 24 and the uppermost one of the second semiconductor layers 25. In some embodiments, subsequently, the first dielectric layer 40 is further trimmed (etched) to expose a part of the sacrificial cladding layer 35.

Figure 9B:
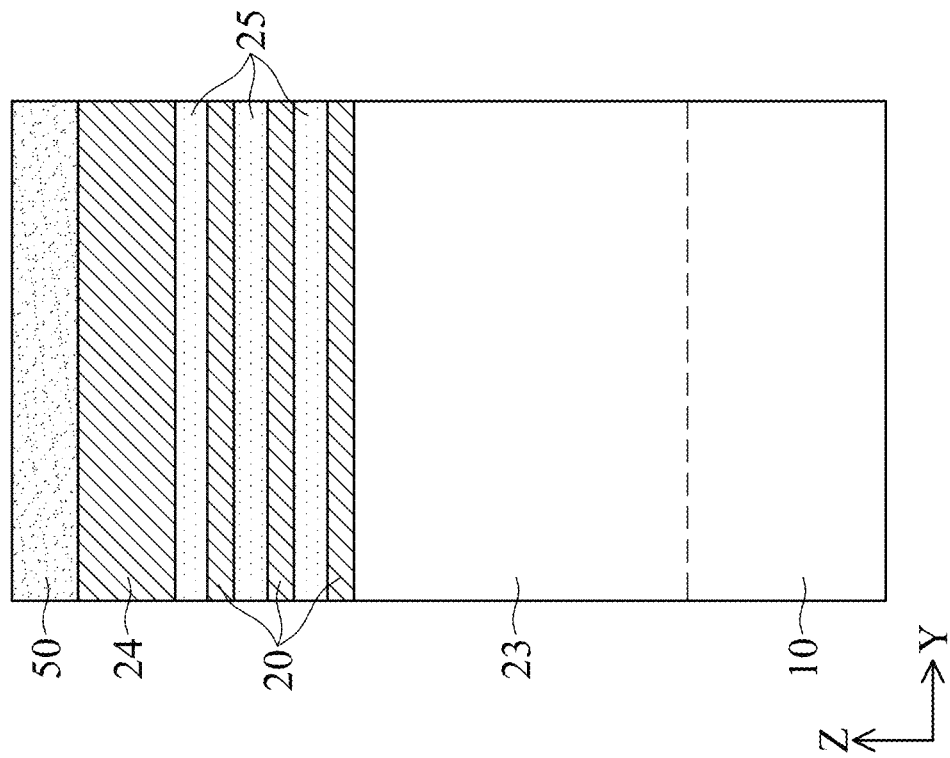
FIGS. 9A, 9B, 9C, and 9D show various views of one of the various stages of manufacturing a fin FET device according to an embodiment of the disclosure.
Figure 9A:
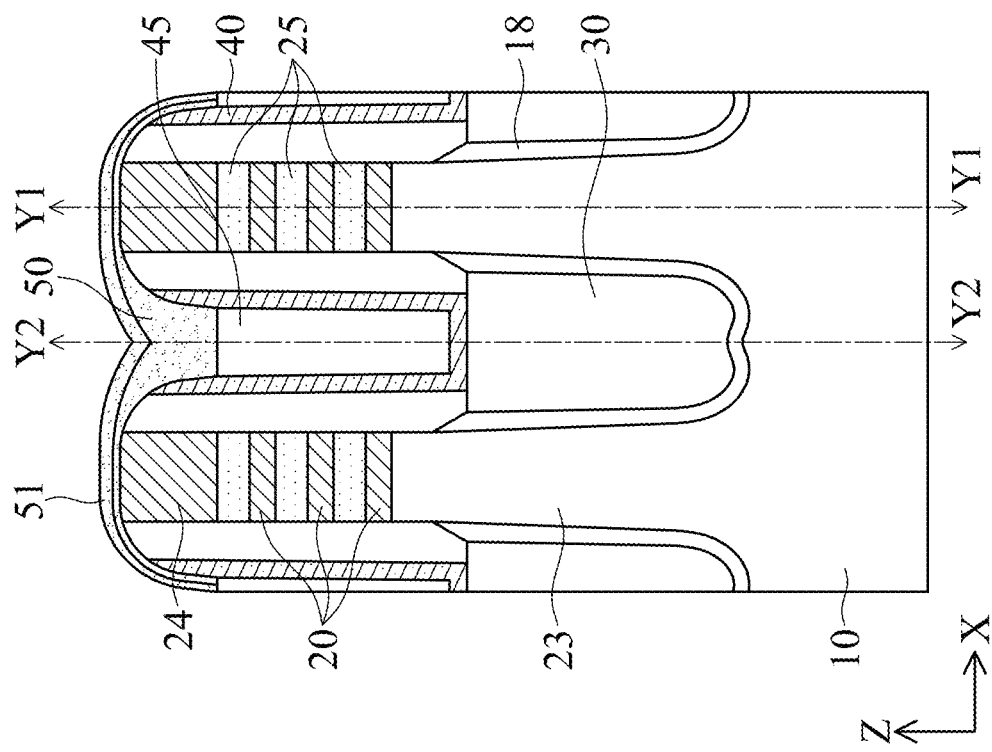

Next, multiple layers including a third dielectric layer 50 and an oxide insertion layer 51 in an alternating order are formed (stacked) on the recessed second dielectric layer 45. FIG. 9A is a cross sectional view along the X direction, FIG. 9B is a cross sectional view along the Y direction corresponding to line Y1-Y1 of FIG. 9A, and FIG. 9C is a cross sectional view along the Y direction corresponding to line Y2-Y2 of FIG. 9A.

The material of the third dielectric layer 50 is different from the materials of the first dielectric layer 40 and the second dielectric layer 45. In some embodiments, the third dielectric layer 50 includes a material having a lower etching rate than the second dielectric layer against a polysilicon or an amorphous SiGe etching. In some embodiments, the third dielectric layer 50 includes a high-k dielectric material. In some embodiments, the third dielectric layer 50 includes a dielectric material having a higher dielectric constant (k) than the second dielectric layer 45 and/or the first dielectric layer 40.

In some embodiments, the third dielectric layer 50 includes one or more of hafnium oxide (e.g., $HfO_x$, $0<x\le2$), hafnium oxide doped with one or more other elements (e.g., HfSiO, HfSiON, HfTaO, HfSiO or HfZrO), zirconium oxide, aluminum oxide, titanium oxide, and a hafnium dioxide-alumina ($HfO_2$—$Al_2O_3$) alloy. In some embodiments, the oxide insertion layer 51 includes silicon dioxide ($SiO_2$). In other embodiments, the oxide insertion layer 51 includes silicon-based oxide, silicon-based nitride, silicon-based carbide, or metal-based oxide, metal-based nitride, and metal-based carbide.

In some embodiments, the third dielectric layer 50 includes a lower layer on the second dielectric layer 45 and an upper layer, with the oxide insertion layer 51 therebetween. The third dielectric layer 50 can be formed by LPCVD, plasma-CVD or ALD, or any other suitable film formation method. As shown in FIG. 9A, the third dielectric layer 50 fully fills the space between adjacent fin structures.

Figure 9D:
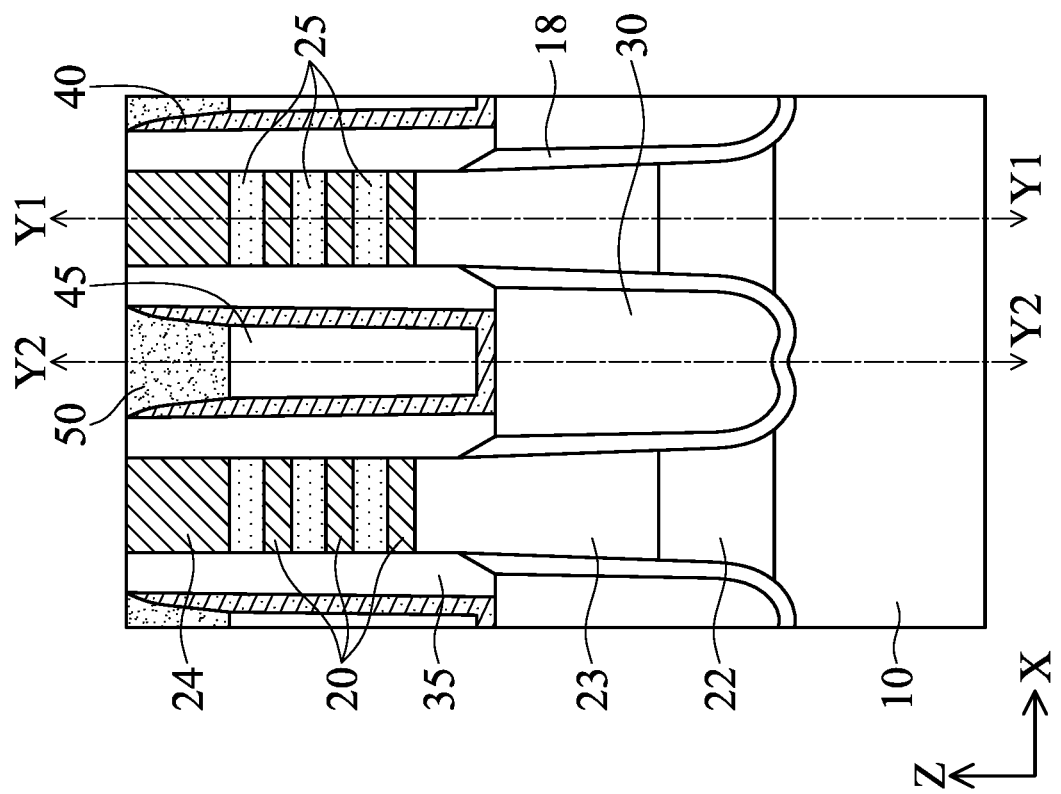
Figure 9C:
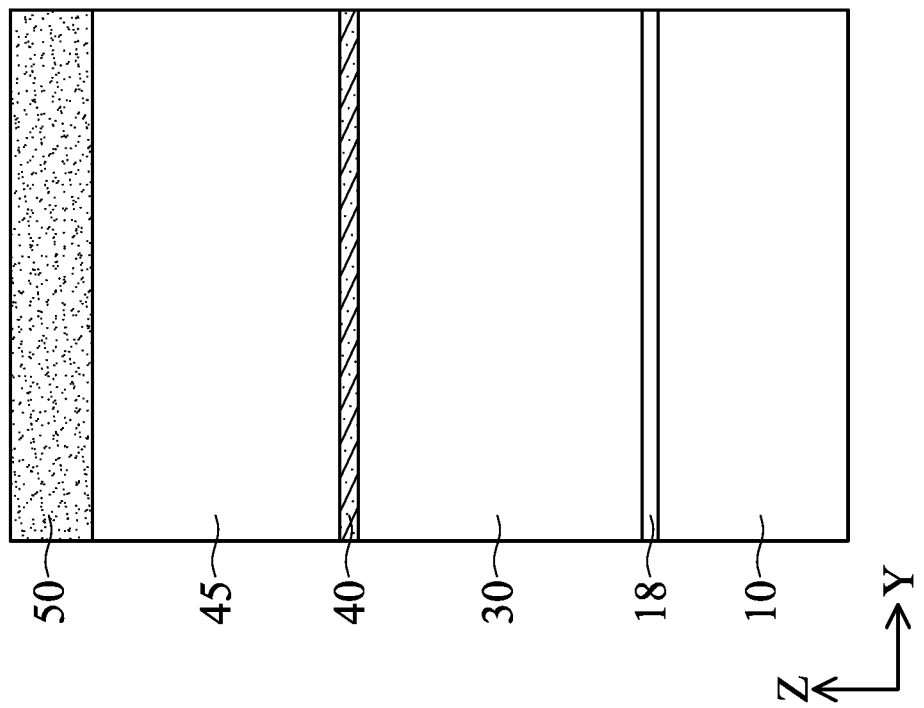

After the third dielectric layer 50 is formed to fully cover the fin structures, a planarization operation, such as an etch-back process or a CMP process, is performed to planarize the upper surface of the third dielectric layer 40 to expose the upper surface of the top semiconductor layer 24, as shown in FIG. 9D. In some embodiments, the thickness of the third dielectric layer 50 remaining on the top semiconductor layer 24 is in a range from about 5 nm to about 100 nm, the width of the third dielectric layer 50 at the top thereof is in a range from about 10 nm to about 80 nm, depending on device and/or process requirements. Accordingly, a wall fin structure (a dummy fin structure) is formed by layers 40, 45 and 50 between adjacent fin structures.

In some embodiments, the second dielectric layer 45 is omitted and the dielectric layers 50 and the oxide insertion layers 51 are formed on the first dielectric layer 40. In other embodiments, the first dielectric layer 40 and the second dielectric layer 45 are both omitted, and the dielectric layers 50 and the oxide insertion layers 51 are formed on the isolation insulating layer 30.

In some embodiments, the separation between the adjacent fins is about 20 nm to about 300 nm. In some embodiments, the thickness of the dielectric layer 50 is in a range from about 4 nm to about 10 nm. In some embodiments, the thickness of the oxide insertion layer 51 is in a range from about 0.5 nm to about 1 nm.

Figure 10C:
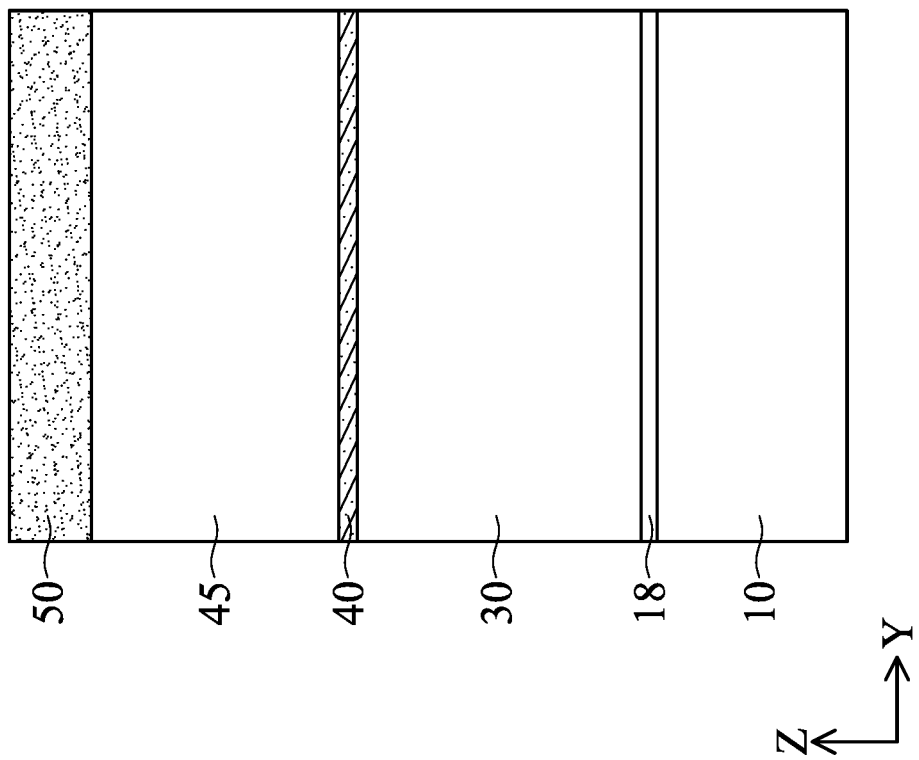

Then, as shown in FIGS. 10A-10C, the top semiconductor layer 24 is removed by one or more dry or wet etching operations. In FIGS. 10A-10C to 21A-21C, the "B" figures are cross sectional views along the Y direction corresponding to line Y1-Y1 of the "A" figures, and the "C" figures are cross sectional view along the Y direction corresponding to line Y2-Y2 of the "A" figures. As shown in FIG. 10A, a groove having sidewalls formed by the cladding layers 35 is formed. After the top semiconductor layer 24 is removed, a sacrificial gate dielectric layer 62 is formed on the uppermost one of the second semiconductor layers 25, the sidewalls of the first dielectric layer, and on the third dielectric layer 50 as shown in FIGS. 10A-10C. The sacrificial gate dielectric layer 62 includes one or more layers of insulating material, such as a silicon oxide-based material. In one embodiment, silicon oxide formed by CVD is used. The thickness of the sacrificial gate dielectric layer 62 is in a range from about 1 nm to about 5 nm in some embodiments.

Figure 11C:
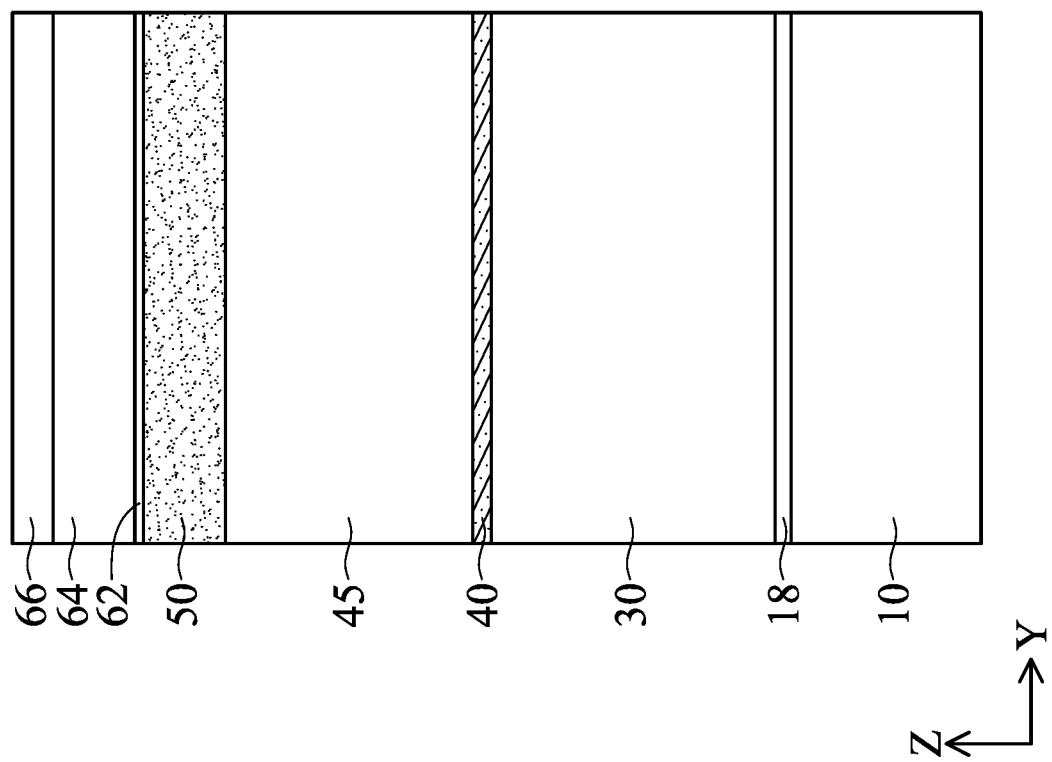

Further, as shown in FIGS. 11A-11C, a sacrificial (dummy) gate electrode layer 64 is formed, and a hard mask layer 66 is formed on the sacrificial gate electrode layer 64. The sacrificial gate electrode layer 64 is blanket deposited on the sacrificial gate dielectric layer 62 and over the third dielectric layer 50, such that the third dielectric layer 50 is fully embedded in the sacrificial gate electrode layer 64. The sacrificial gate electrode layer 64 includes silicon, such as polycrystalline silicon or amorphous silicon. The thickness of the sacrificial gate electrode layer 64 is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, the hard mask layer 66 is formed over the sacrificial gate electrode layer. The hard mask layer 66 includes one or more layers of silicon nitride layer or silicon oxide.

Figure 12B:
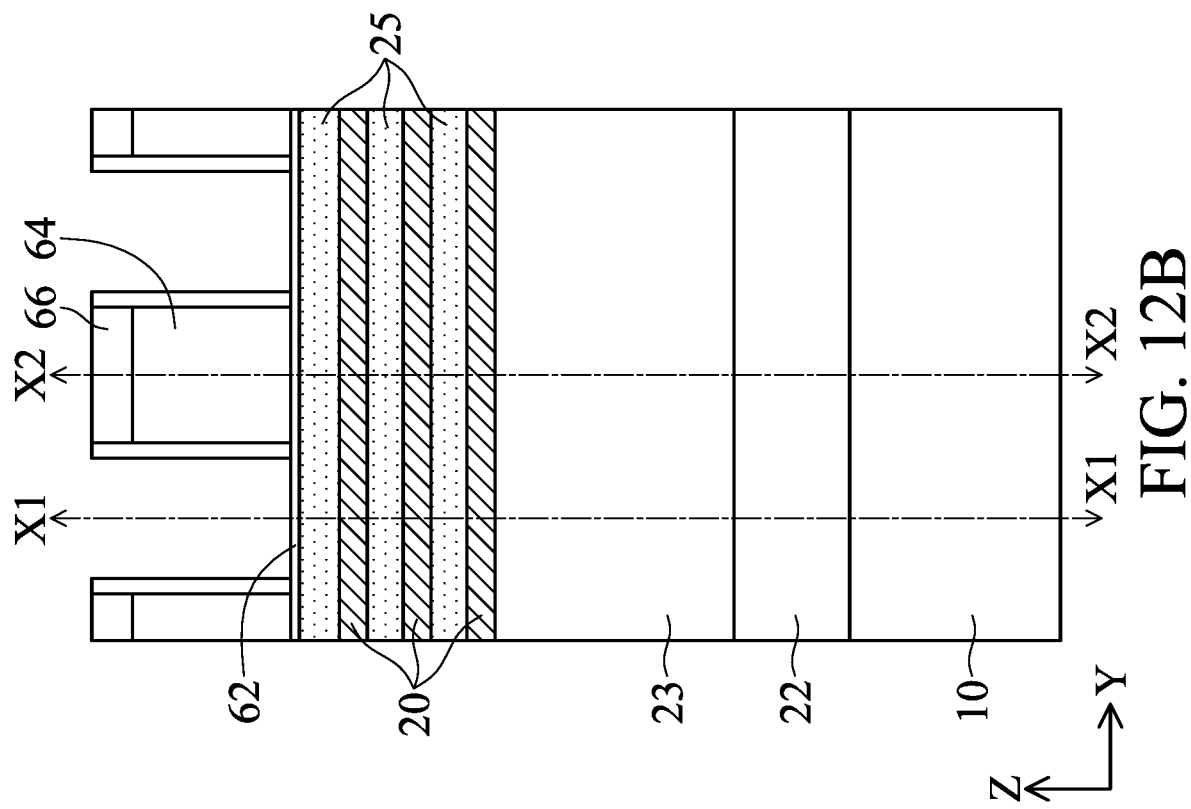
FIGS. 12A, 12B and 12C show various views of one of the various stages of manufacturing a fin FET device according to an embodiment of the present disclosure.
Figure 12A:
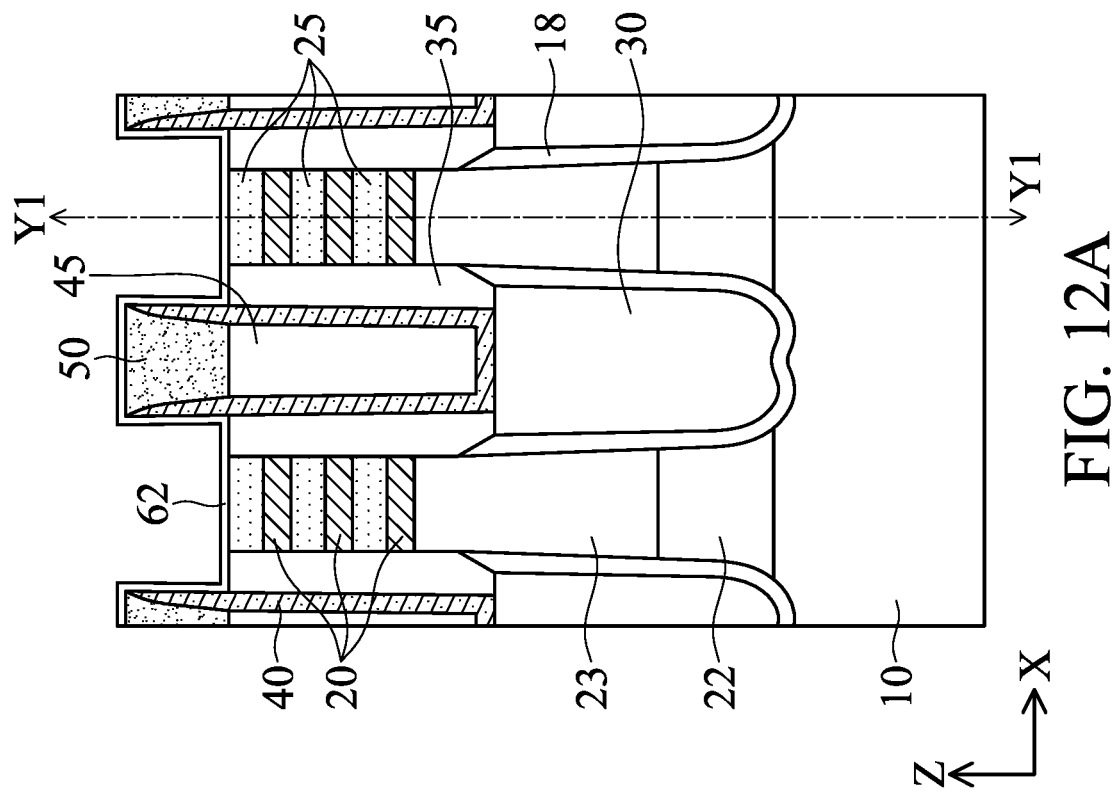
Figure 12C:
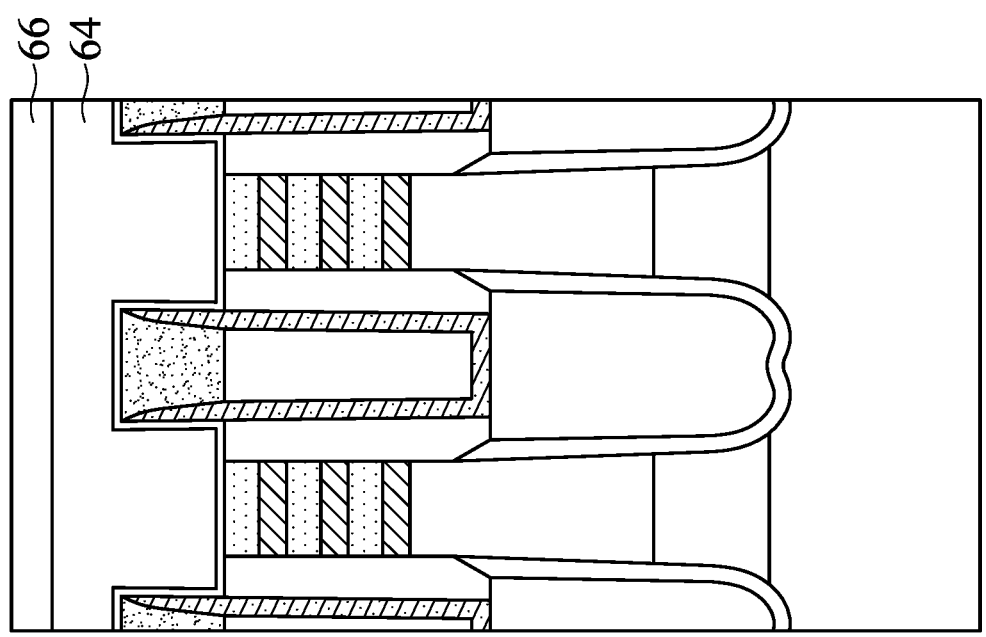

Next, a patterning operation is performed on the hard mask layer 66 and the sacrificial gate electrode layer 64 is patterned into sacrificial gate electrodes, as shown in FIGS. 12A-12C. In some embodiments, the width of the sacrificial gate electrode 64 is in a range from about 5 nm to about 30 nm and is in a range from about 10 nm to about 20 nm. Two or more sacrificial gate electrodes are arranged in the Y direction in some embodiments. In certain embodiments, one or more dummy sacrificial gate electrodes are formed on both sides of the sacrificial gate electrodes to improve pattern fidelity.

Figure 13B:
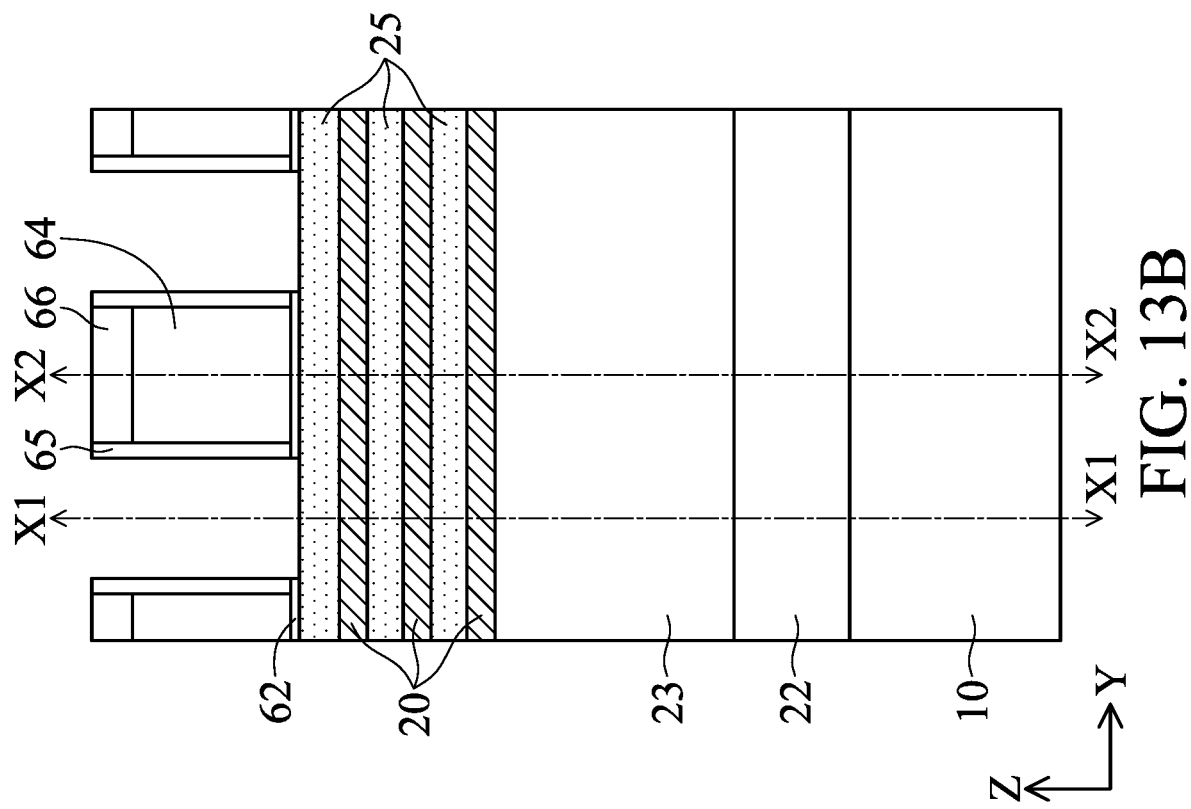
FIGS. 13A, 13B, 13C and 13D show various views of one of the various stages of manufacturing a fin FET device according to an embodiment of the present disclosure.
Figure 13A:
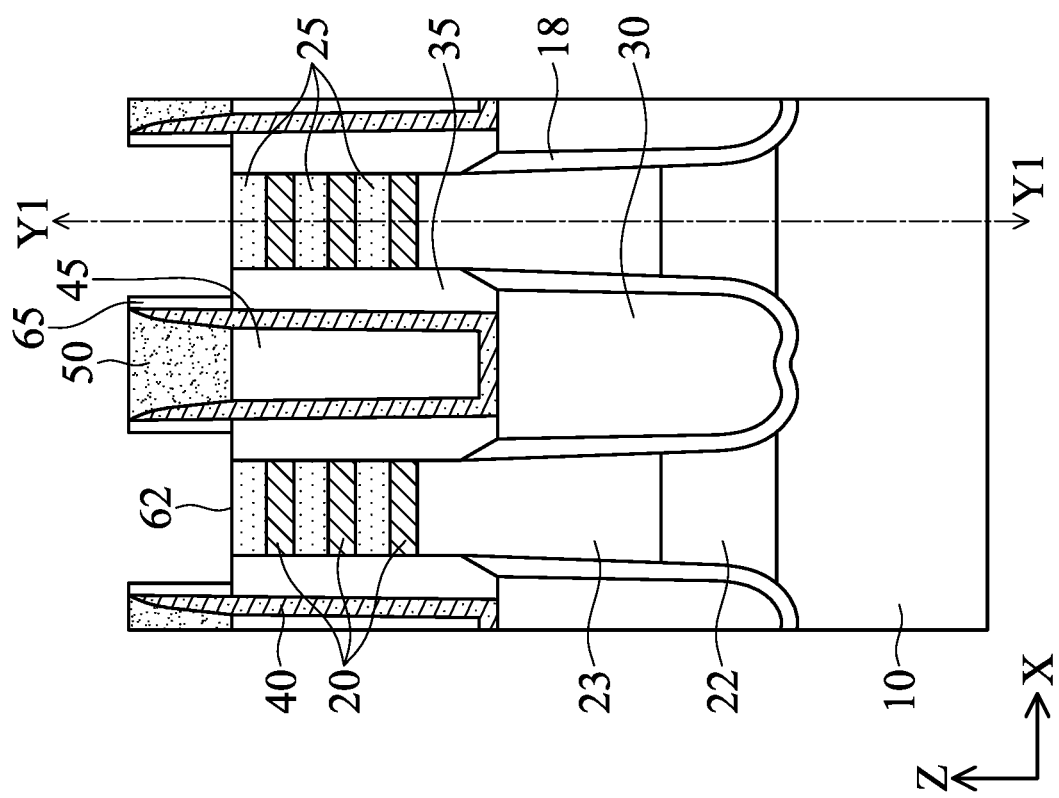
Figure 13C:
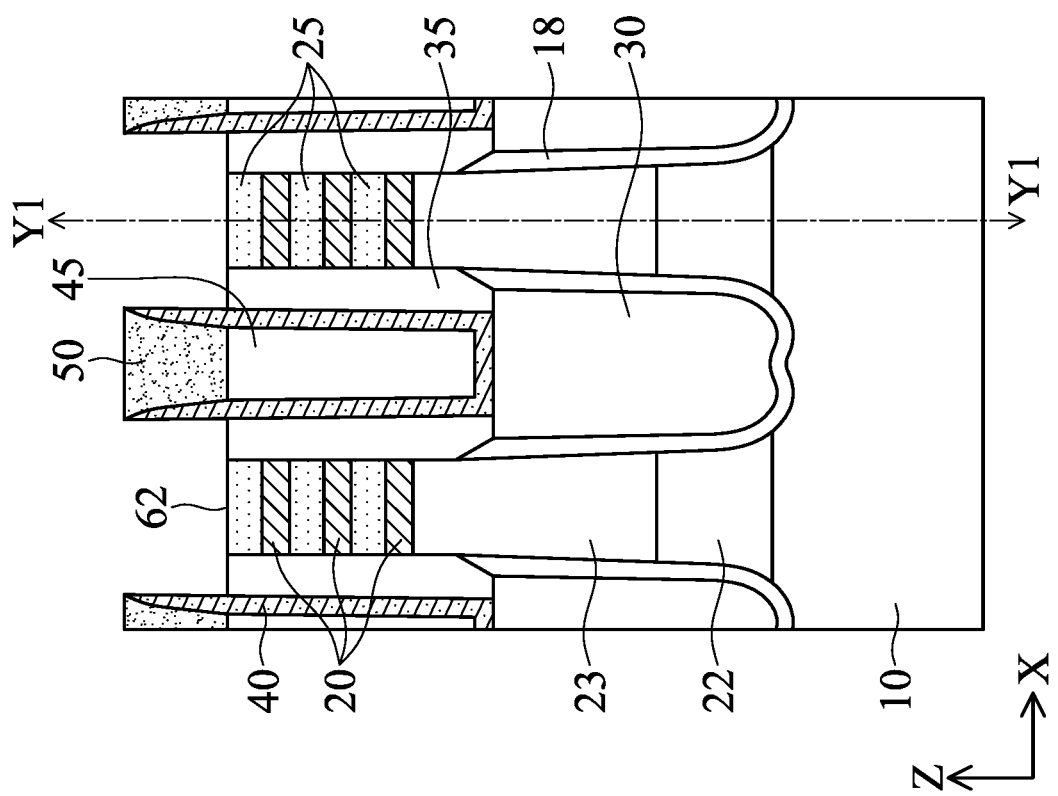
Figure 13D:
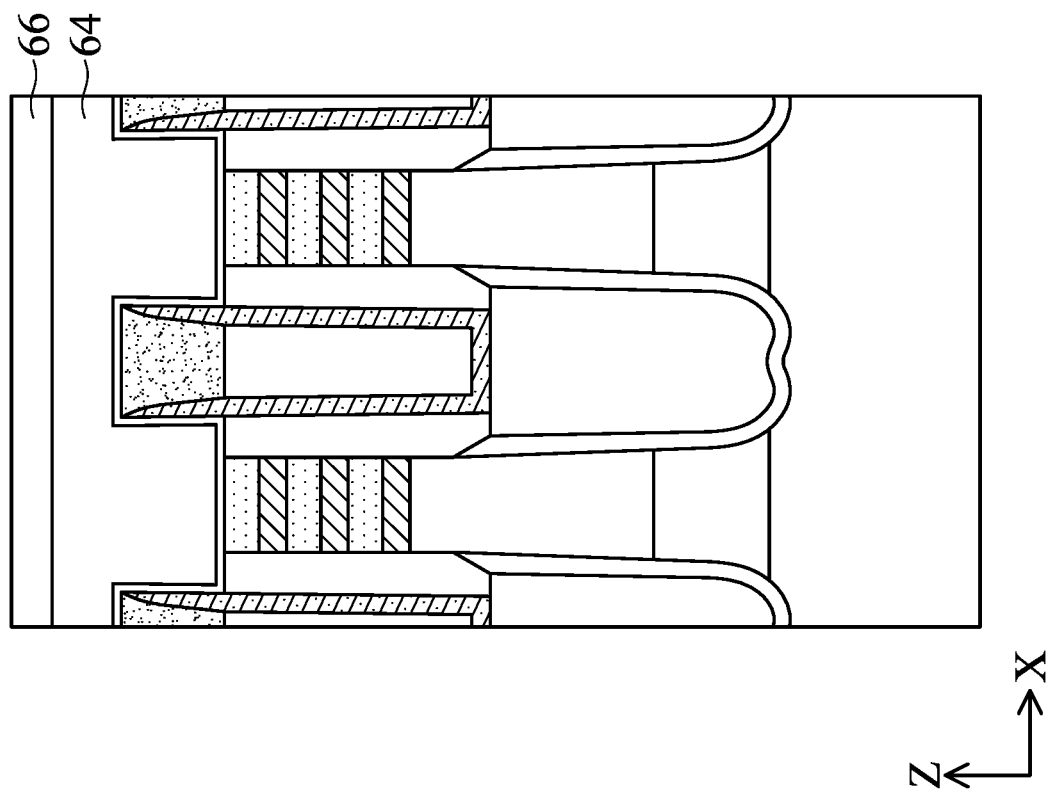

Further, sidewall spacers 65 are formed over the sacrificial gate electrodes 64, as shown in FIG. 13A-13C. One or more insulating layers are deposited in a conformal manner to have substantially equal thicknesses on vertical surfaces, such as the sidewalls, horizontal surfaces, and the top of the sacrificial gate electrode and the sidewalls by the first dielectric layer 40, respectively. Then, by using anisotropic etching, the sidewall spacers 65 are formed. In some embodiments, the sidewall spacer has a thickness in a range from about 3 nm to about 20 nm. The sidewall spacers 65 include one or more of silicon nitride, SiON, SiCN, SiCO, SiOCN or any other suitable dielectric material. In some embodiments, since the height of the third dielectric layer 50 is much smaller than the height of the sacrificial gate electrode layer 64 with the hard mask layer, the thickness of the sidewall spacers on sidewalls of the first dielectric layer which is on the third dielectric layer 50 is smaller than the thickness of the sidewall spacers on the sacrificial gate electrode 64, or no sidewall spacer is formed on sidewalls of the first dielectric layer which is on the third dielectric layer 50 as shown in FIG. 13D.

In order to reduce the capacitance, an annealing operation is performed to convert the third dielectric layers 50 and the oxide insertion layers 51 from an amorphous form to crystalline form. The annealing is performed at a temperature of about 800° C. to about 1000° C. for about 1 sec to about 60 sec in an inert gas ambient, such as an $O_2$ $N_2$, Ar or He ambient, in some embodiments. In some embodiments, the degree of crystallization of the third dielectric layers 50 is determined based on the annealing temperature and concentration of the inert ambient gas.

In some other embodiments, the degree of crystallization is determined based on the thickness of the third dielectric layer 50. In some embodiments, the third dielectric layer 50 having a thickness about 3 nm or greater turns crystalline. The third dielectric layer 50 having a thickness less than about 3 nm remains amorphous. In some embodiments, Nanobeam Beam Diffraction (NBD) is used to determine the crystalline and amorphous portions of the third dielectric layers 50.

After the annealing operation, an etching operation is performed to remove the amorphous third dielectric layers 50. The crystalline and amorphous third dielectric layers 50 have different etching rates, and as a result, in an etching operation, the amorphous third dielectric layers 50 is removed while the crystalline portion is retained. The third dielectric layers 50 can be selectively etched by isotropic etching, such as wet etching. A wet etchant includes a mixed solution of $H_2O_2$, $CH_3COOH$ and HF, followed by $H_2O$ cleaning in some embodiments. In some embodiments, the etching by the mixed solution and cleaning by water is repeated 10 to 20 times. The etching time using the mixed solution is in a range from about 1 min to about 2 min in some embodiments. The mixed solution is used at a temperature in a range from about 60° C. to about 90° C. in some embodiments.

In some embodiments, the etching operation includes a plasma etching operation using a source gas including carbon and fluorine atoms. In some embodiments, the source gas is a mixture of $C_4F_6$ and $CHF_3$. Etching the amorphous third dielectric layers 50 creates a concavity (recess).

Figure 14:
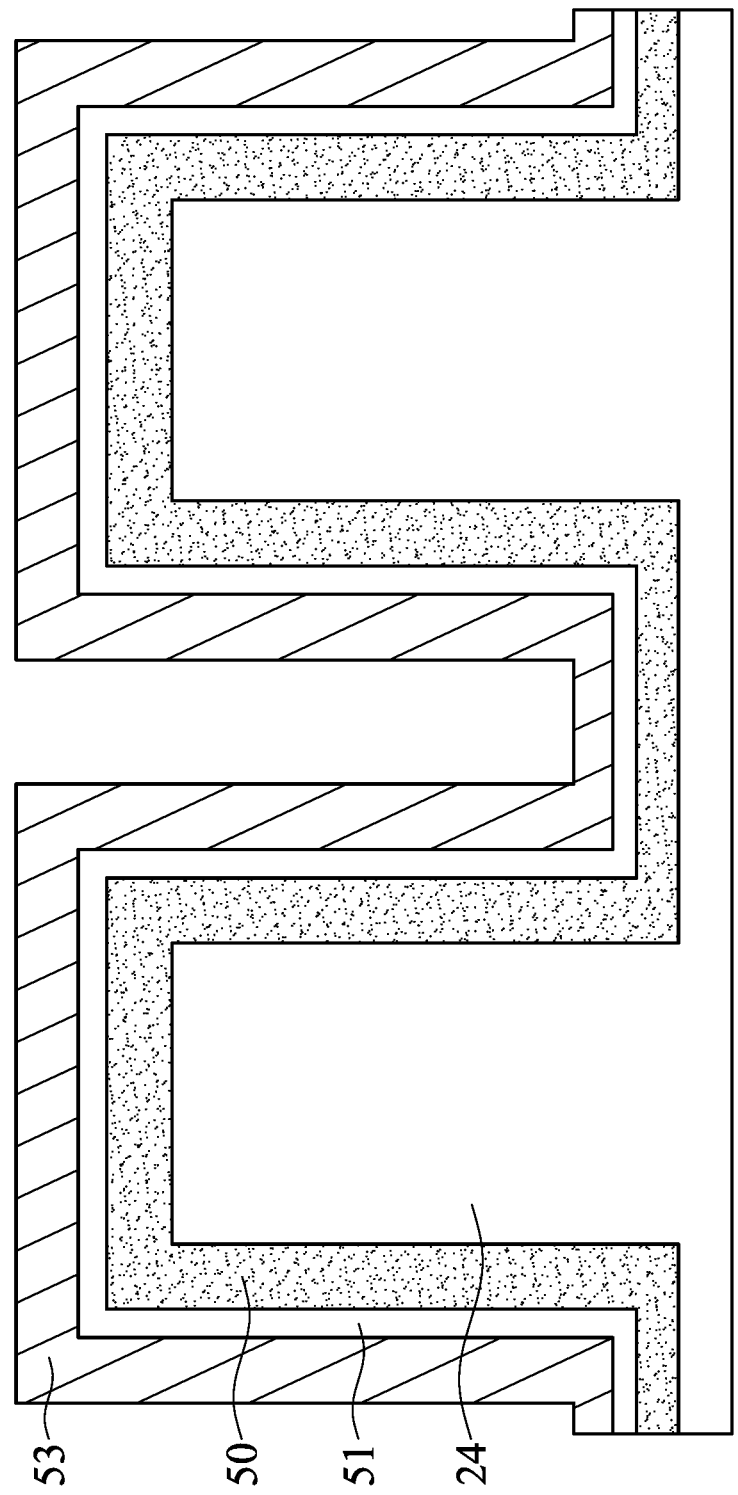
FIG. 14 illustrates the third dielectric layers and the oxide insertion layers of FIG. 13A in relative detail.

FIG. 14 illustrates the third dielectric layers 50 and the oxide insertion layers 51 of FIG. 13A in relative detail. The dielectric layer 50 has a crystalline structure and the dielectric layer 53 has an amorphous structure. As illustrated, the dielectric layer 50 forms a "shell" around the dielectric layer 53. For the sake of explanation and clarity of illustration, the first dielectric layer 40 and the second dielectric layer 45 are both omitted in FIG. 14.

Figure 15A:
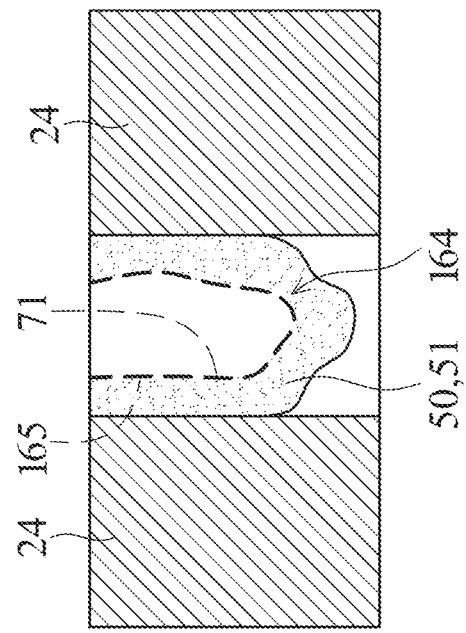
FIG. 15A illustrates the third dielectric layers and the oxide insertion layers after the annealing operation and FIG. 15B illustrates a concavity in the third dielectric layers after the etching operation.
Figure 15B:
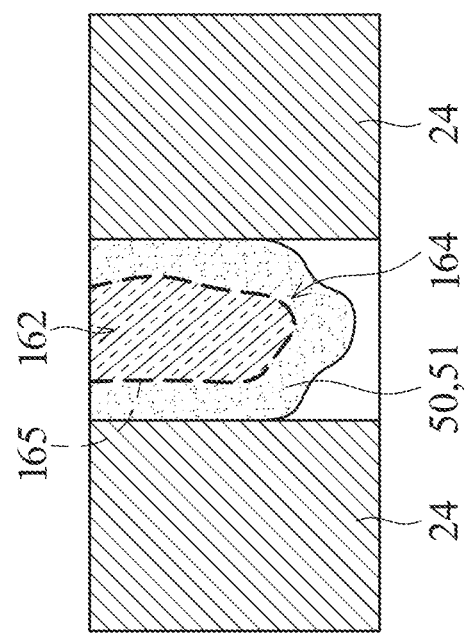
Figure 16:
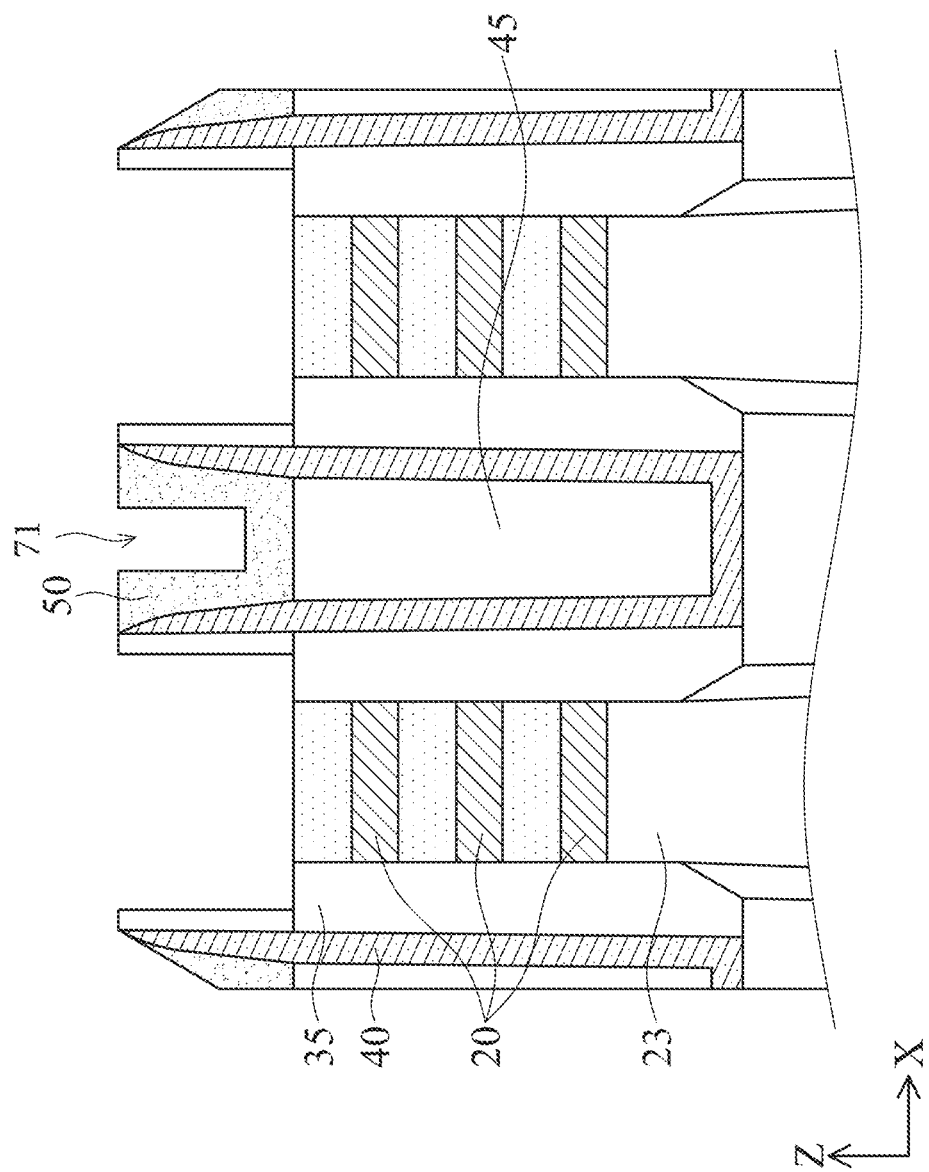
FIG. 16 illustrates the semiconductor device of FIG. 13D after the etching operation.

FIG. 15A illustrates the third dielectric layers 50 and the oxide insertion layers 51 after the annealing operation and FIG. 15B illustrates a concavity in the third dielectric layers after the etching operation. As illustrated in FIG. 15A, the annealing operation results in a crystalline shell 164 and an amorphous core 162, each including third dielectric layers 50 and oxide insertion layers 51. The general boundary between the crystalline shell 164 and the amorphous core 162 is indicated by the dashed line 165. As illustrated in FIG. 15B, after the etching operation removes the amorphous core 162, a concavity 71 is obtained. The concavity 71 is surrounded by (or otherwise defined by) the crystalline shell 164. FIG. 16 illustrates the semiconductor device of FIG. 13D after the etching operation. The shape of the concavity 71 reduces metal gate capacitance due to the presence of the third dielectric layer 50 (e.g., including hafnium oxide).

In some embodiments, ions (dopants) are implanted in the third dielectric layers 50 to limit crystallization of the third dielectric layers 50 prior to the annealing operation. The ions are implanted in the relatively central portion of the third dielectric layers 50 between the adjacent fins. After the annealing operation, the portion of the third dielectric layers 50 including the ions remains relatively amorphous, while portions of the third dielectric layers 50 closer to the fins are crystallized. The amorphous portion has a relatively higher etching rate than the crystalline part, and is removed (etched) during the etching operation to form the concavity 71. In some embodiments, the dopants include silicon (Si), argon (Ar), carbon (C), and/or phosphorus (P) ions. In some embodiments, the dopant concentration is about 0.1% to 50%.

In some embodiments, when the ion implantation operation is used, the oxide insertion layer is not formed. The ion implantation is performed to convert the structure of an upper layer of third dielectric layer 50, which is more easily converted to an amorphous state by the annealing than the remaining bottom layer.

Figure 17D:
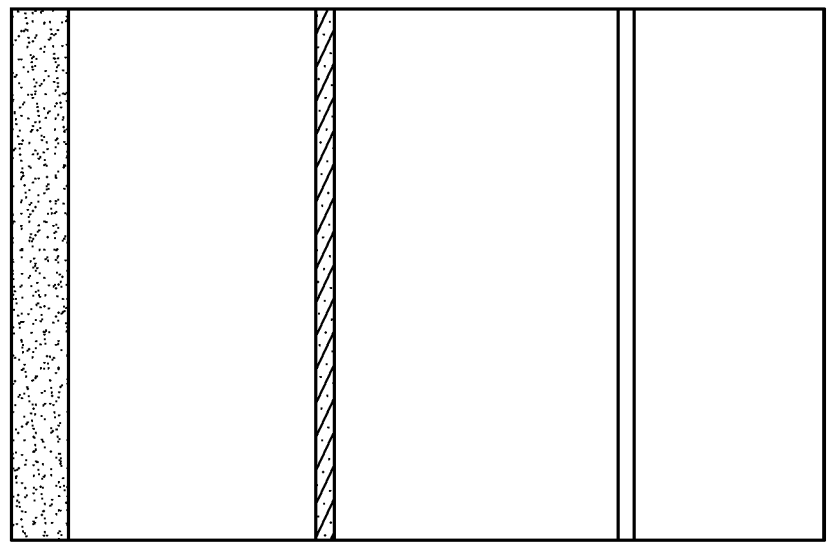
Figure 17C:
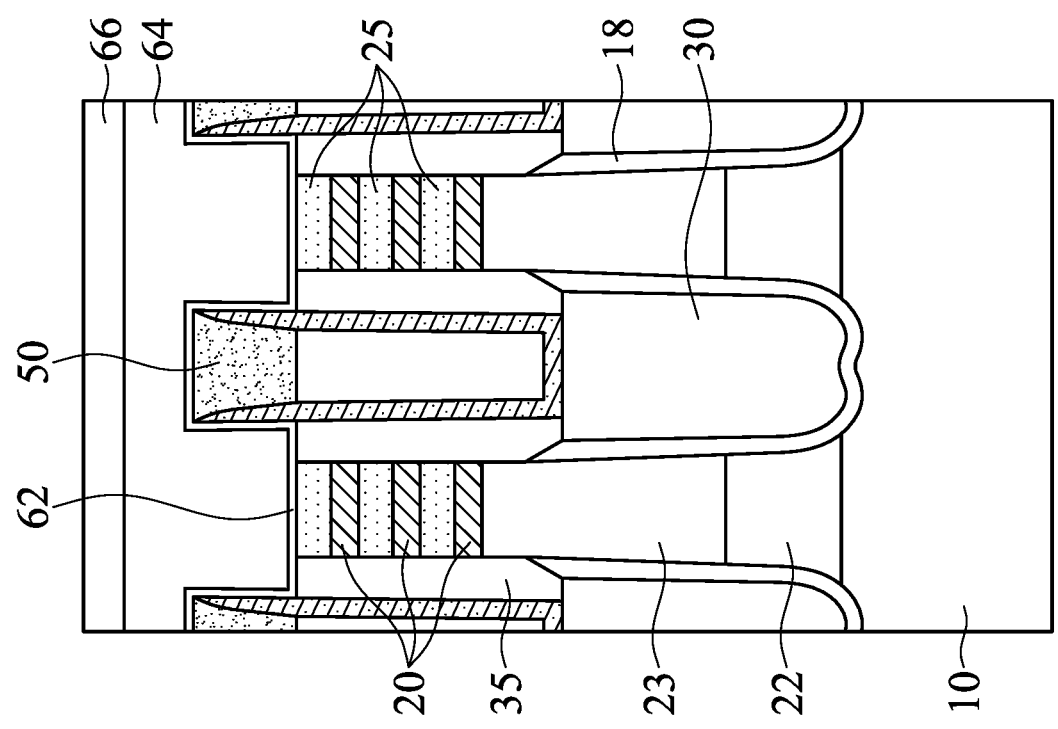

Then, the stacked structure of the first semiconductor layers 20 and the second semiconductor layers 25 is etched down at the source/drain regions, by using one or more etching operations, thereby forming a source/drain space 69, as shown in FIGS. 17A-17D. FIG. 17D shows a cross section corresponding to line Y2-Y2 of FIG. 17A. In some embodiments, the bottom fin structure 23 is also partially etched. In some embodiments, during the etching, the sacrificial cladding layer 35 is partially or fully removed. In some embodiments, when no or thin sidewall spacer is formed on sidewalls of the first dielectric layer which is on the third dielectric layer 50, the sacrificial cladding layer 35 is also removed during the etching to form the source/drain space 69. In some embodiments, the operations explained with respect to FIGS. 14, 15A and 15B (annealing and removal of the amorphous layer) are performed before the sacrificial gate structures are formed, and in such a case, a recess formed by removing the amorphous layer exist under the sacrificial gate structures (the recess is filled by a sacrificial gate electrode layer 64).

Figure 18C:
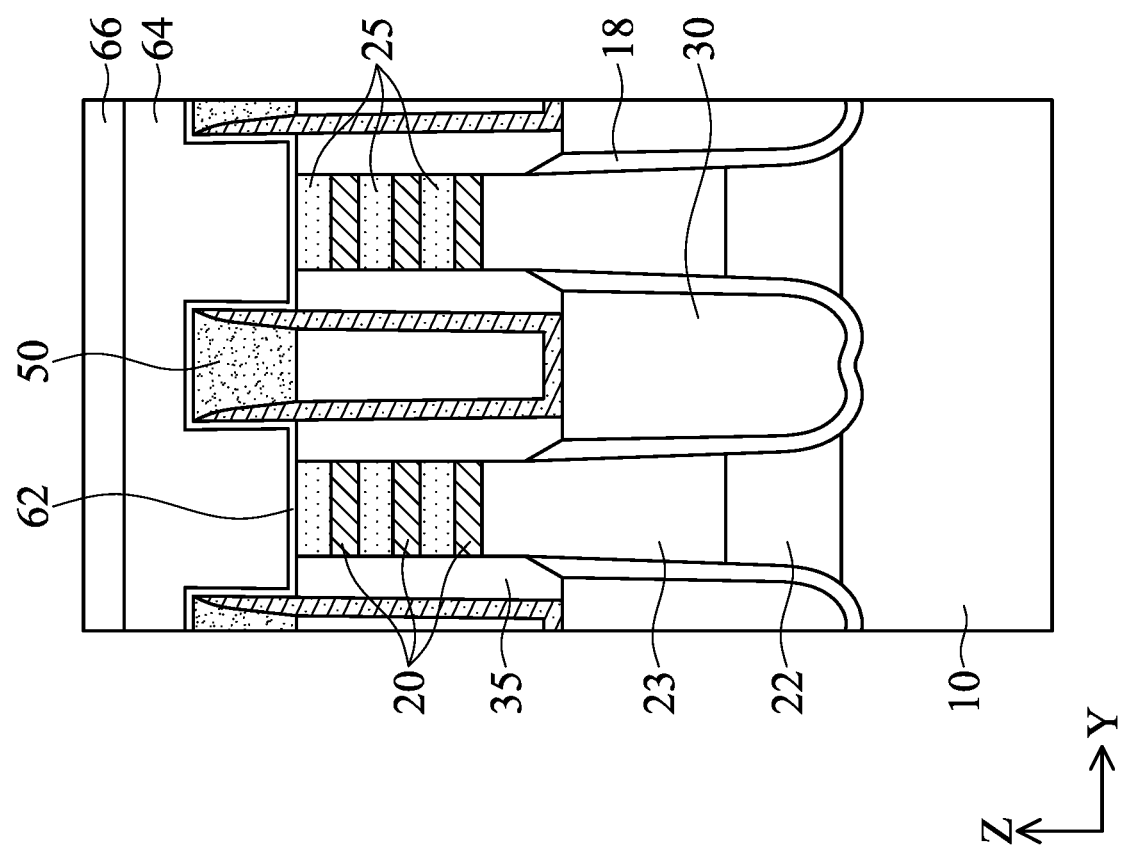

Further, inner spacers are formed a shown in FIGS. 18A-18C. The first semiconductor layers 20 are laterally etched in the Y direction within the source/drain space 69, thereby forming cavities. The lateral amount of etching of the first semiconductor layer 20 is in a range from about 0.5 nm to about 10 nm in some embodiments, and is in a range from about 1 nm to about 5 nm in other embodiments.

When the first semiconductor layers 20 are SiGe and the second semiconductor layers 25 are Si, the first semiconductor layers 20 can be selectively etched by isotropic etching, such as wet etching. A wet etchant includes a mixed solution of $H_2O_2$, $CH_3COOH$ and HF, followed by $H_2O$ cleaning in some embodiments. In some embodiments, the etching by the mixed solution and cleaning by water is repeated 10 to 20 times. The etching time using the mixed solution is in a range from about 1 min to about 2 min in some embodiments. The mixed solution is used at a temperature in a range from about 60° C. to about 90° C. in some embodiments.

Then, a fifth dielectric layer is conformally formed on the etched lateral ends of the first semiconductor layers 20 and on end faces of the second semiconductor layers 25 in the source/drain space 69. The fifth dielectric layer includes one of silicon nitride and silicon oxide, SiON, SiOC, SiCN and SiOCN, or any other suitable dielectric material. The fifth dielectric layer is made of a different material than the sidewall spacers 65 in some embodiments. The fifth dielectric layer can be formed by ALD or any other suitable methods.

After the fifth dielectric layer is formed, an etching operation is performed to partially remove the fifth dielectric layer, thereby forming inner spacers 70, as shown in FIG. 18B. In some embodiments, the end face of the inner spacers 70 is recessed more than the end face of the second semiconductor layers 25. The recessed amount is in a range from about 0.2 nm to about 3 nm and in in a range from about 0.5 nm to about 2 nm in other embodiments. In other embodiments, the recessed amount is less than 0.5 nm and may be equal to zero (the end face of the inner spacer 70 and the end face of the second semiconductor layers 25 are flush with each other). In some embodiments, before forming the fifth dielectric layer, an additional dielectric layer having a smaller thickness than the fifth dielectric layer is formed, and thus the inner spacers 70 have a two-layer structure.

Figure 19C:
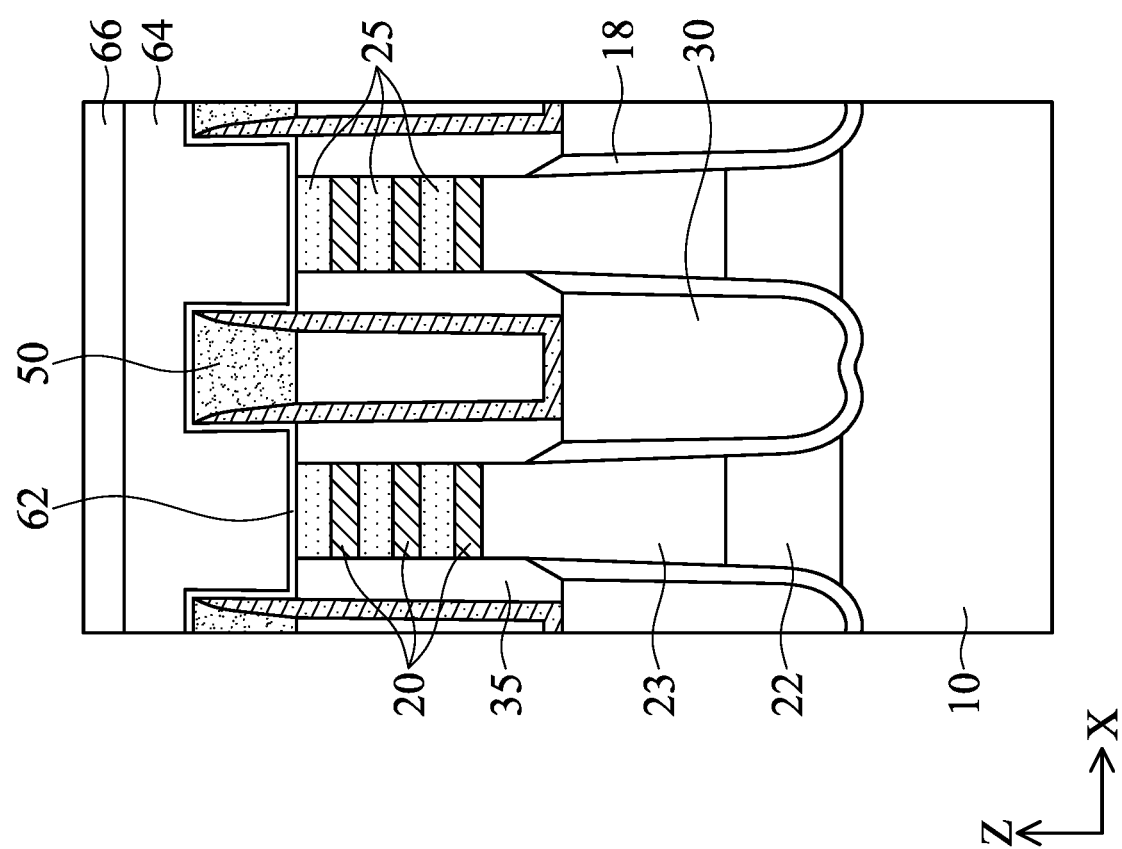

Subsequently, as shown in FIGS. 19A-19C, a source/drain epitaxial layer is formed in the source/drain space 69. The source/drain epitaxial layer includes one or more layers of SiP, SiAs, SiCP, SiPAs and/or SiC for an n-type FET, and SiGe, GeSn and/or SiGeSn for a p-type FET. For the p-type FET, the source/drain epitaxial layer is doped with B (boron) in some embodiments. In some embodiments, the source/drain epitaxial layer includes multiple layers.

In some embodiments, the source/drain epitaxial layer of an n-type FET includes a first epitaxial layer 82, a second epitaxial layer 84 and a third epitaxial layer 86. In some embodiments, the first epitaxial layer 82 is made of SiP, SiAs or SiAs:P or combination thereof. In some embodiments, the P concentration of the first epitaxial layer 82 is in a range from about $0.5 \times 10^{19}$ atoms/cm$^3$ to about $5 \times 10^{20}$ atoms/cm$^3$, and is in a range from about $0.8 \times 10^{19}$ atoms/cm$^3$ to about $2 \times 10^{20}$ atoms/cm$^3$ in other embodiments. In some embodiments, the second epitaxial layer 84 is made of SiP. In some embodiments, the P concentration of the second epitaxial layer 84 is higher than that of the first SiP epitaxial layer 82, and is in a range from about $1 \times 10^{21}$ atoms/cm$^3$ to about $5 \times 10^{21}$ atoms/cm$^3$, and is in a range from about $2 \times 10^{21}$ atoms/cm$^3$ to about $4 \times 10^{21}$ atoms/cm$^3$ in other embodiments. In some embodiments, the third epitaxial layer 86 is made of SiGeP. In some embodiments, the P concentration of the third epitaxial layer 86 is equal to or lower than that of the second SiP epitaxial layer 84 and higher than that of the first SiP epitaxial layer 82, and is in a range from about $0.5 \times 10^{21}$ atoms/cm$^3$ to about $4 \times 10^{21}$ atoms/cm$^3$, and is in a range from about $1 \times 10^{21}$ atoms/cm$^3$ to about $3 \times 10^{21}$ atoms/cm$^3$ in other embodiments. In some embodiments, the Ge concentration of the third epitaxial layer 86 is in a range from about 0.5 atomic % to 10 atomic %, and is in a range from about 1 atomic % to about 5 atomic % in other embodiments.

In some embodiments, the source/drain epitaxial layer of a p-type FET includes a first epitaxial layer 82, a second epitaxial layer 84 and a third epitaxial layer 86. In some embodiments, the first epitaxial layer 82 is made of SiGe doped with B. In some embodiments, the Ge content is in a range from about 15 atomic % to about 30 atomic %. In some embodiments, the B concentration of the first epitaxial layer 82 is in a range from about $1 \times 10^{19}$ atoms/cm$^3$ to about $1 \times 10^{21}$ atoms/cm$^3$, and is in a range from about $5 \times 10^{19}$ atoms/cm$^3$ to about $5 \times 10^{20}$ atoms/cm$^3$ in other embodiments. In some embodiments, the second epitaxial layer 84 is made of SiGe doped with B. In some embodiments, the Ge content of the second epitaxial layer 84 is in a range from about 20 atomic % to about 35 atomic %. In some embodiments, the B concentration of the second epitaxial layer 84 is equal to or higher than the largest B concentration of the first epitaxial layer 82, and is in a range from about $0.5 \times 10^{20}$ atoms/cm$^3$ to about $1 \times 10^{21}$ atoms/cm$^3$, and is in a range from about $1 \times 10^{20}$ atoms/cm$^3$ to about $5 \times 10^{20}$ atoms/cm$^3$ in other embodiments. In some embodiments, the third epitaxial layer 86 is made of SiGe doped with B. In some embodiments, the Ge content is in a range from 25 atomic % to about 60 atomic %. In some embodiments, the average Ge content of the third epitaxial layer is greater than the Ge content of the second epitaxial layer. In some embodiments, the B concentration of the third epitaxial layer 86 is in a range from about $5 \times 10^{19}$ atoms/cm$^3$ to about $5 \times 10^{21}$ atoms/cm$^3$, and is in a range from about $1 \times 10^{20}$ atoms/cm$^3$ to about $3 \times 10^{21}$ atoms/cm$^3$ in other embodiments.

The source/drain epitaxial layers are formed by an epitaxial growth method using CVD, ALD or molecular beam epitaxy (MBE).

Figure 20C:
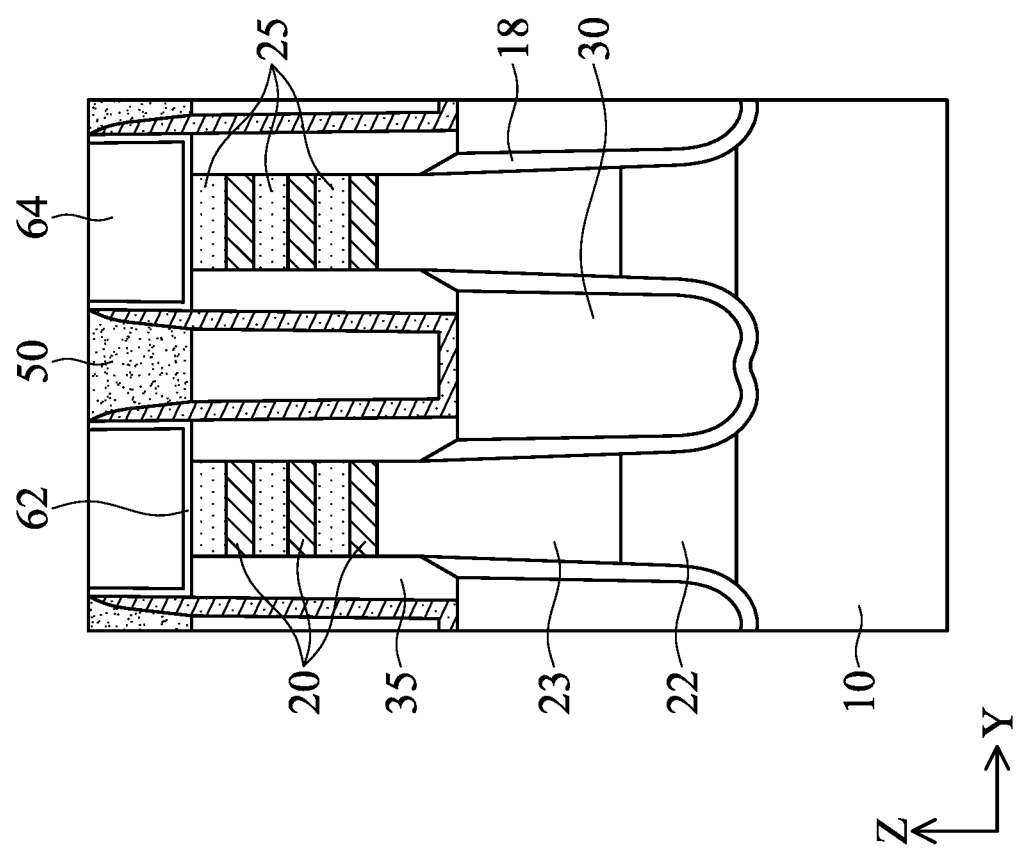

After the source/drain epitaxial layers are formed, a sixth dielectric layer 90 is formed over the source/drain epitaxial layers, as shown in FIGS. 20A-20C. The sixth dielectric layer 90 includes one of silicon nitride and silicon oxide, SiON, SiOC, SiCN and SiOCN, or any other suitable dielectric material. Then, one or more planarization operations, such as a CMP operation, are performed to expose the upper surface of the sacrificial gate electrode 64 as shown in FIGS. 20B and 20C.

Figure 21C:
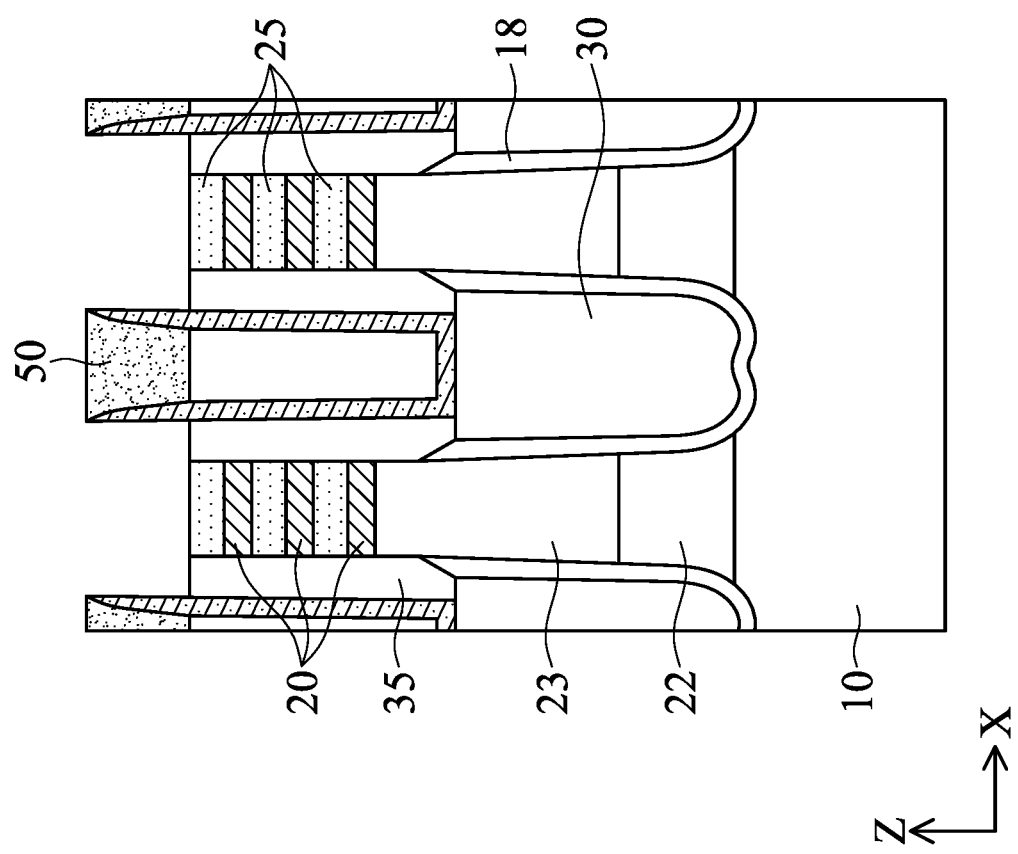

Then, the sacrificial gate electrode 64 and sacrificial gate dielectric layer 62 are removed as shown in FIGS. 21A-21C. The sixth dielectric layer 90 protects the source/drain epitaxial layers during the removal of the sacrificial gate structures. The sacrificial gate structures can be removed using plasma dry etching and/or wet etching. When the sacrificial gate electrode 64 is polysilicon, a wet etchant such as a TMAH solution can be used to selectively remove the sacrificial gate electrode 64. The sacrificial gate dielectric layer 62 is thereafter removed using plasma dry etching and/or wet etching.

Figure 22B:
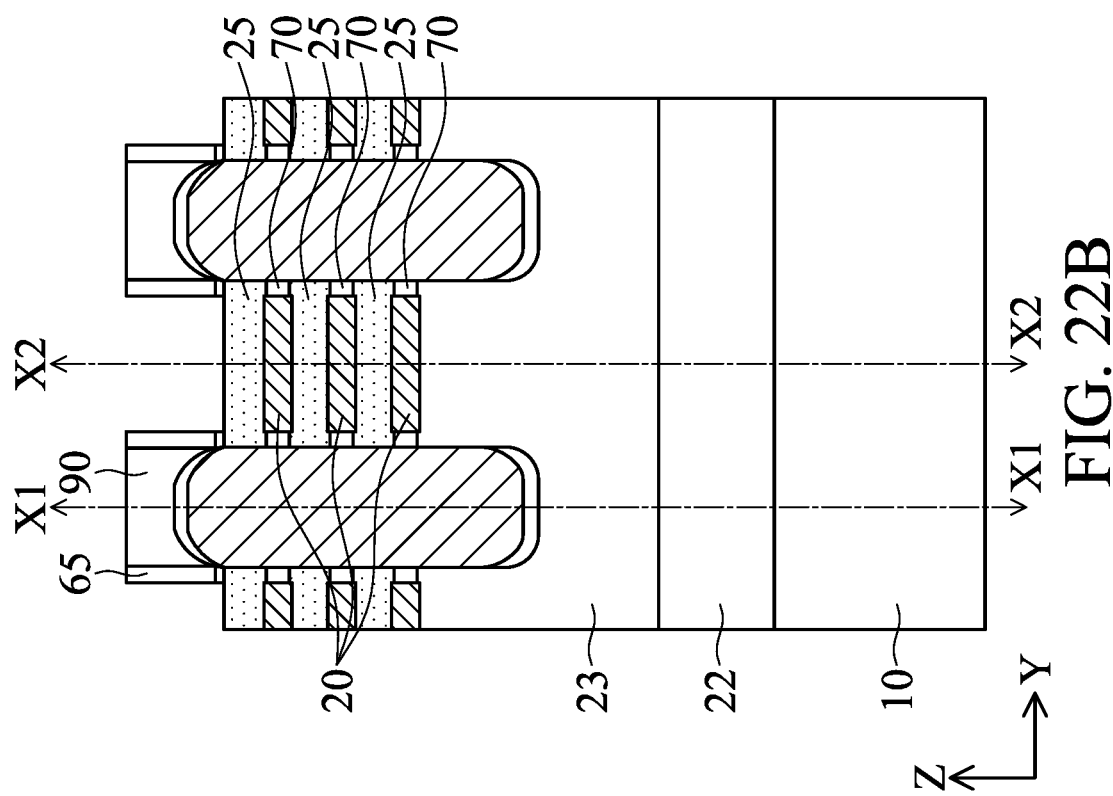
FIGS. 22A, 22B and 22C show various views of one of the various stages of manufacturing a fin FET device according to an embodiment of the present disclosure.
Figure 22A:
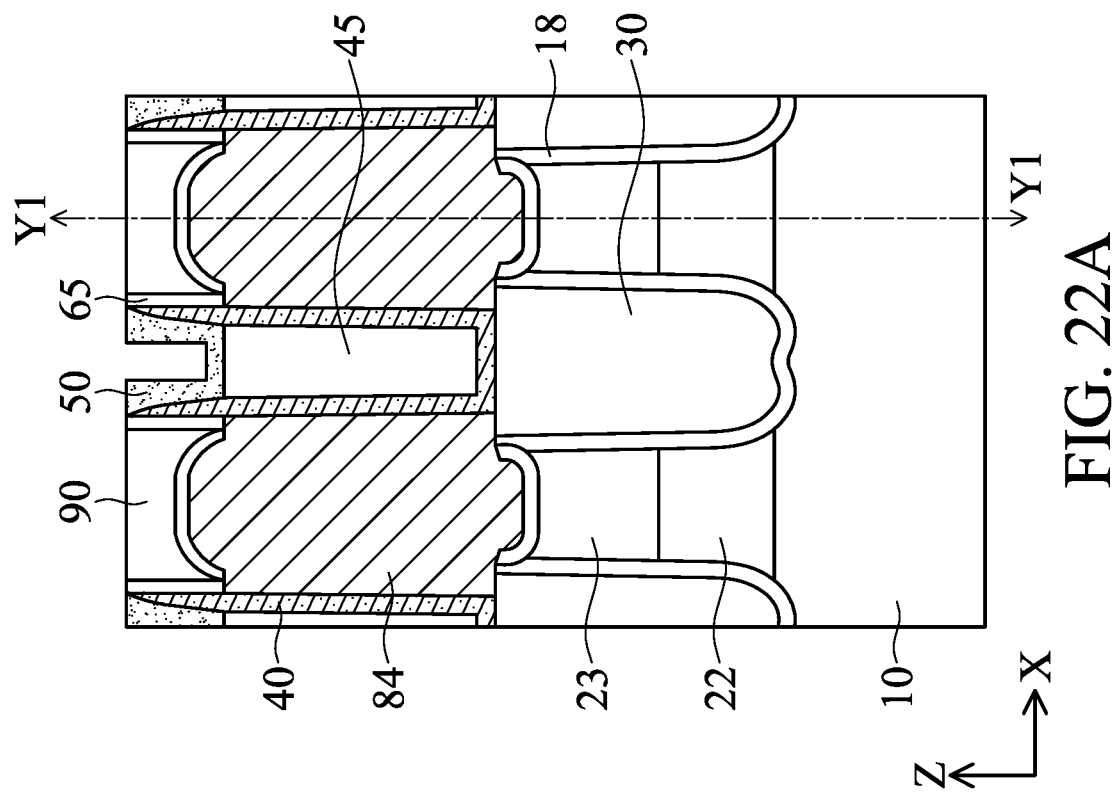
Figure 22C:
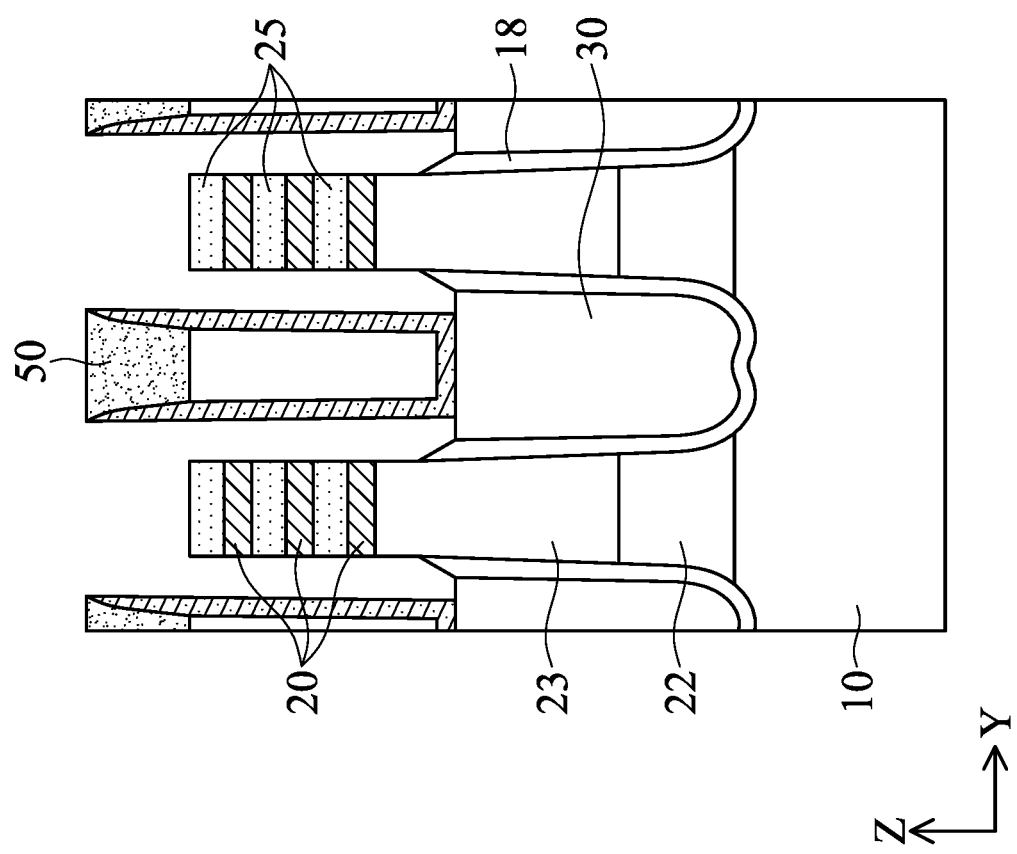

After the sacrificial gate structures are removed, the sacrificial cladding layer 35 is removed by one or more dry and/or wet etching operations, as shown in FIGS. 22A-22C.

Figure 23B:
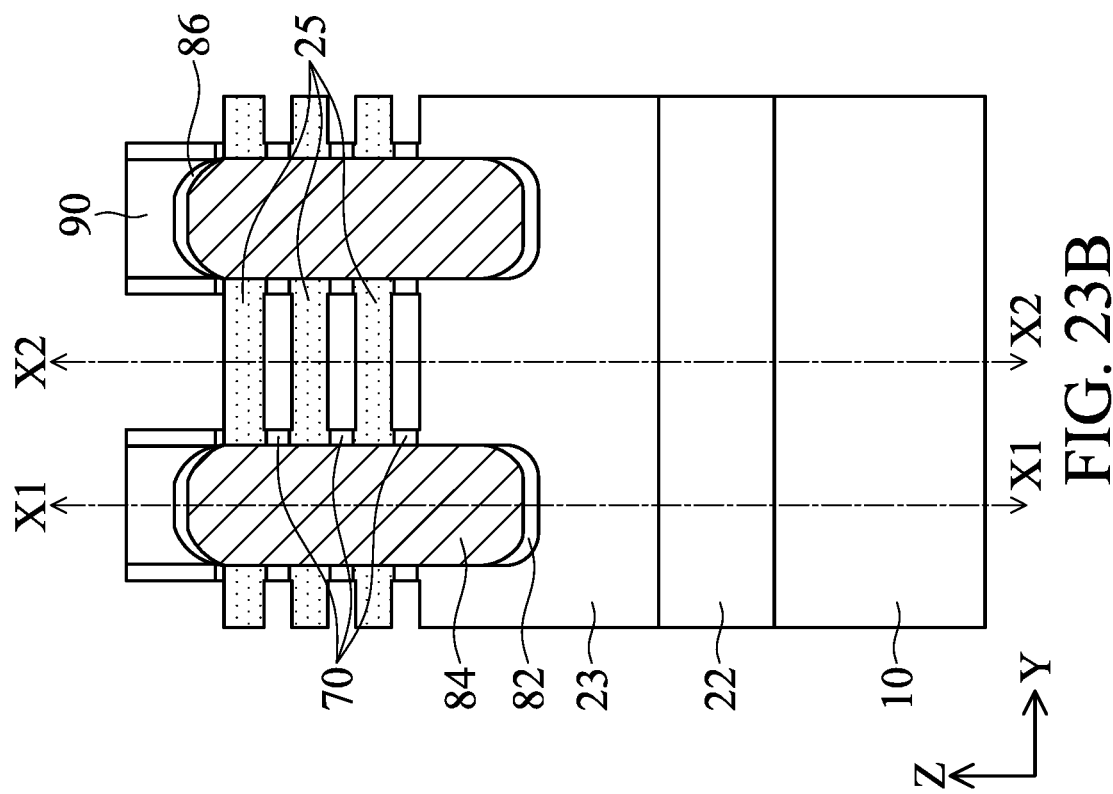
FIGS. 23A, 23B and 23C show various views of one of the various stages of manufacturing a fin FET device according to an embodiment of the present disclosure.
Figure 23A:
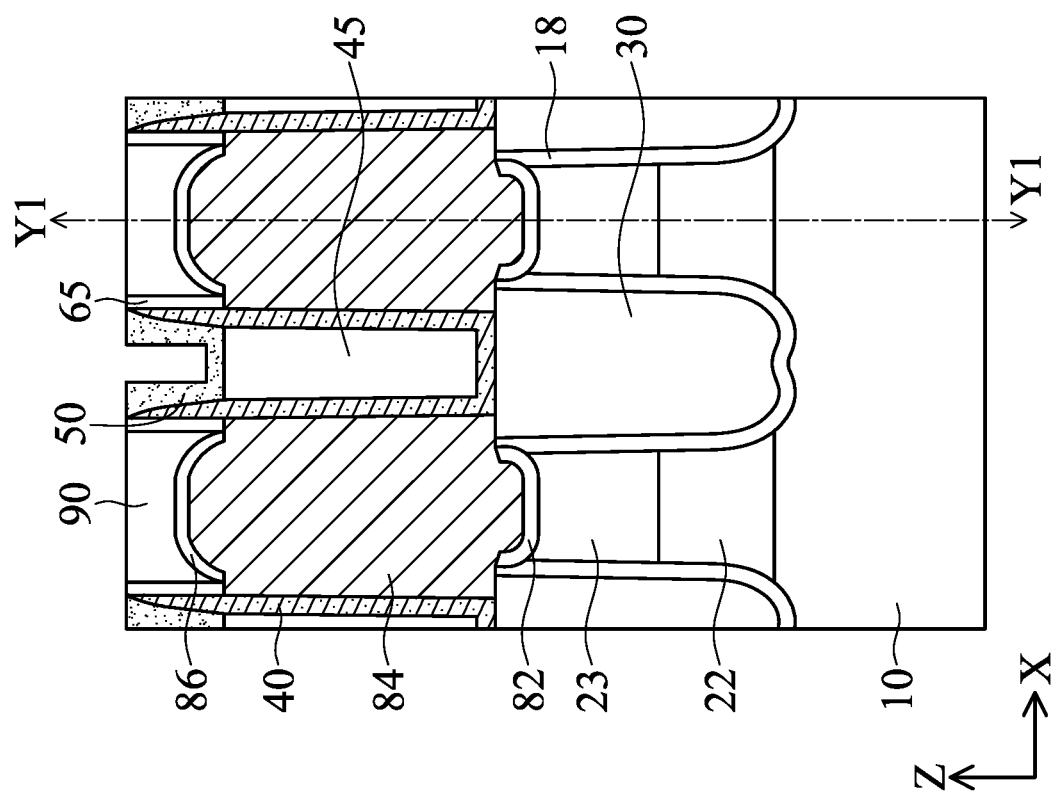
Figure 23C:
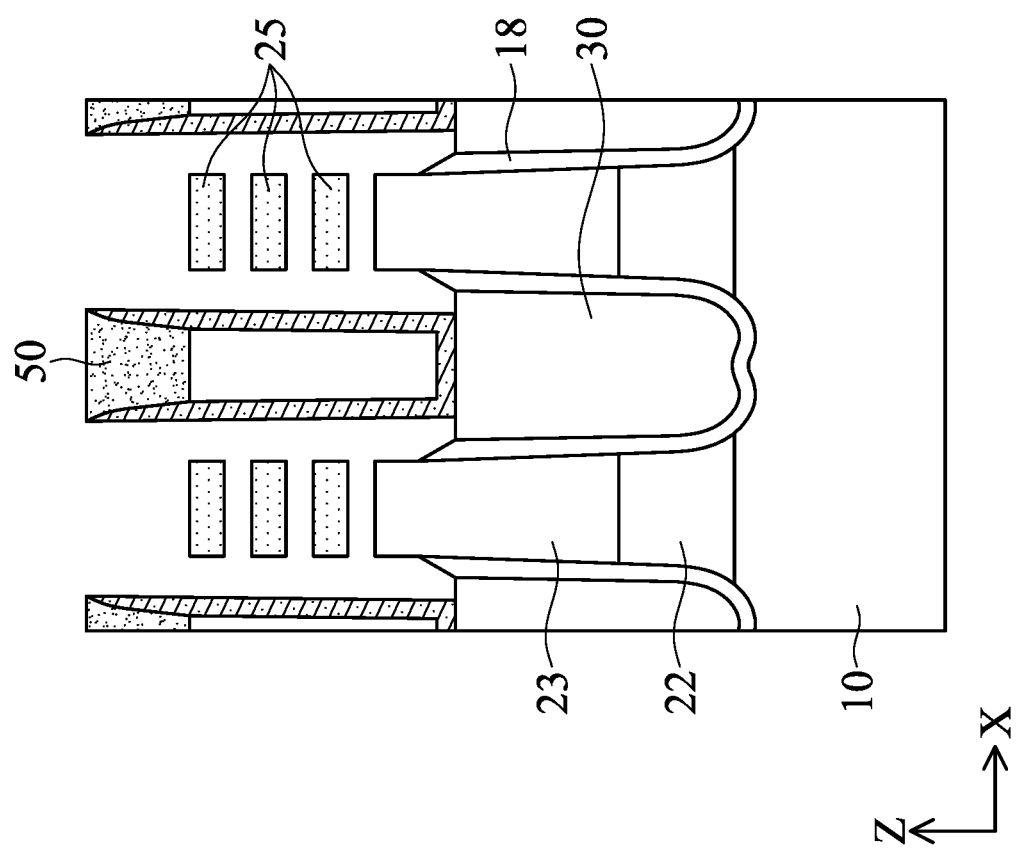

Then, the first semiconductor layers 20 are removed, thereby forming wires or sheets (channel regions) of the second semiconductor layers 25, as shown in FIGS. 23A-23C. The first semiconductor layers 20 can be removed or etched using an etchant that can selectively etch the first semiconductor layers 20 against the second semiconductor layers 25. As shown in FIG. 23B, since the inner spacers 70 are formed, the etching of the first semiconductor layers 20 stops at the inner spacers 70.

Figure 24B:
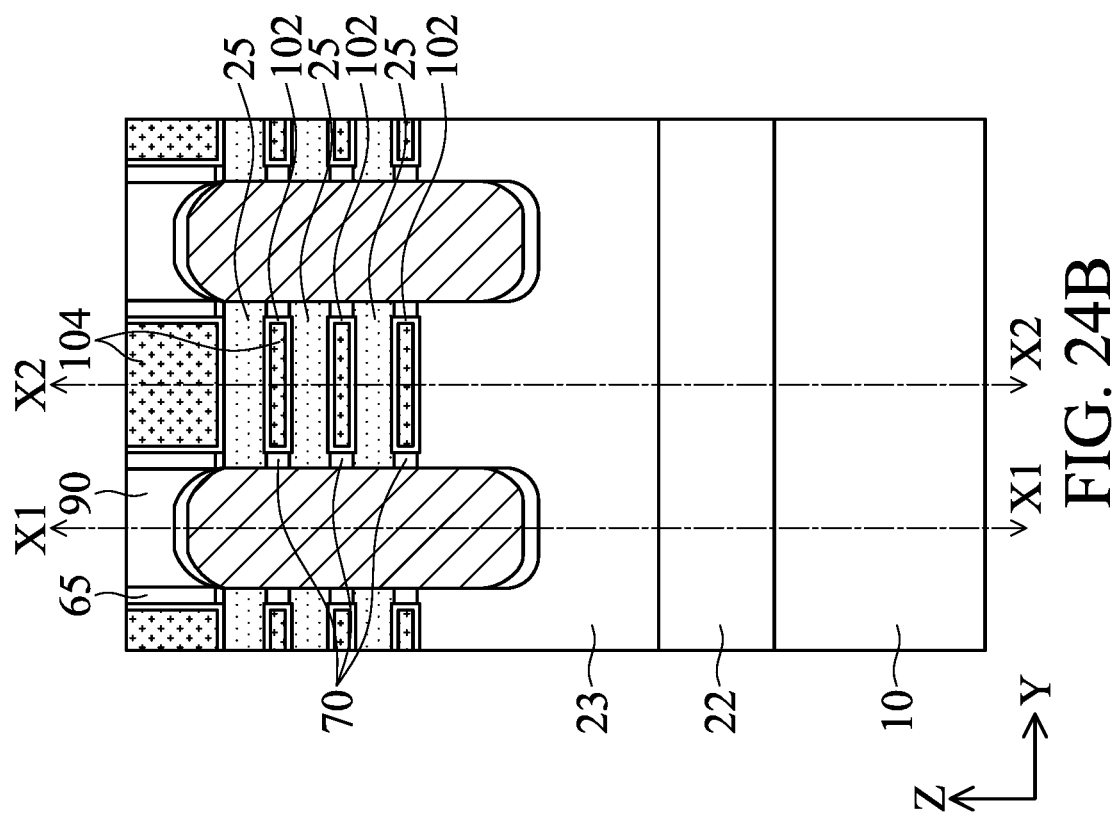
FIGS. 24A, 24B and 24C show various views of one of the various stages of manufacturing a fin FET device according to an embodiment of the present disclosure.
Figure 24A:
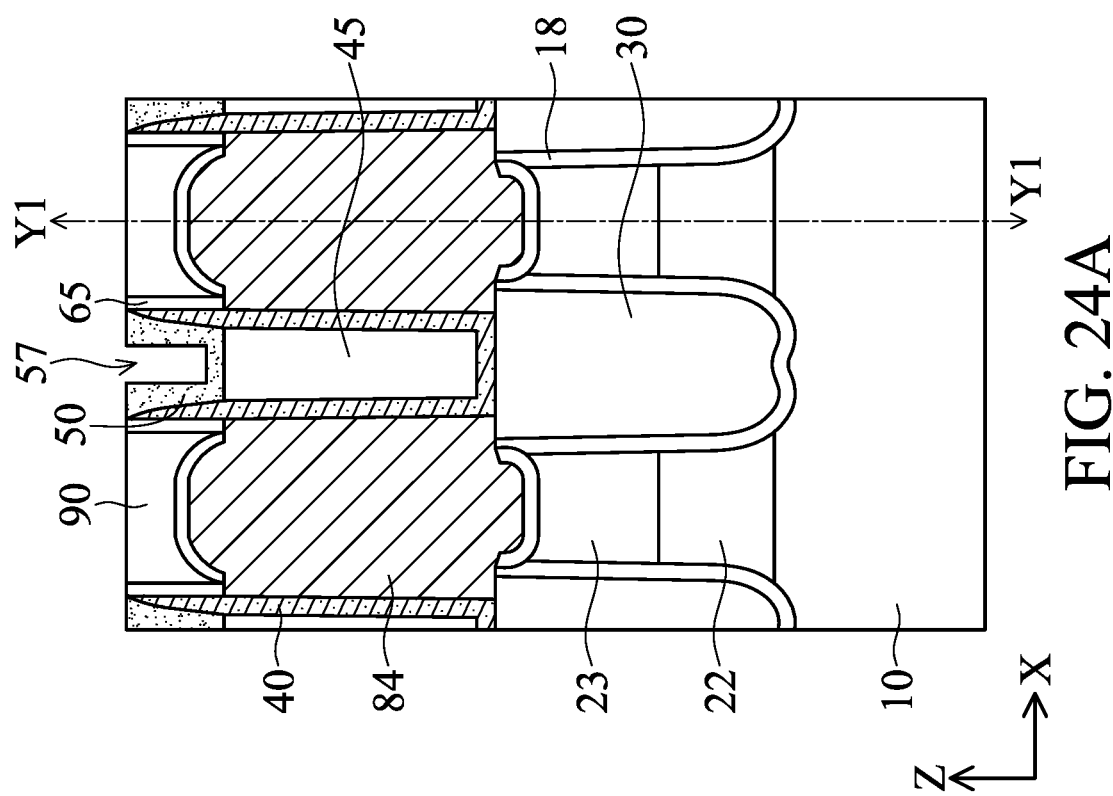
Figure 24C:
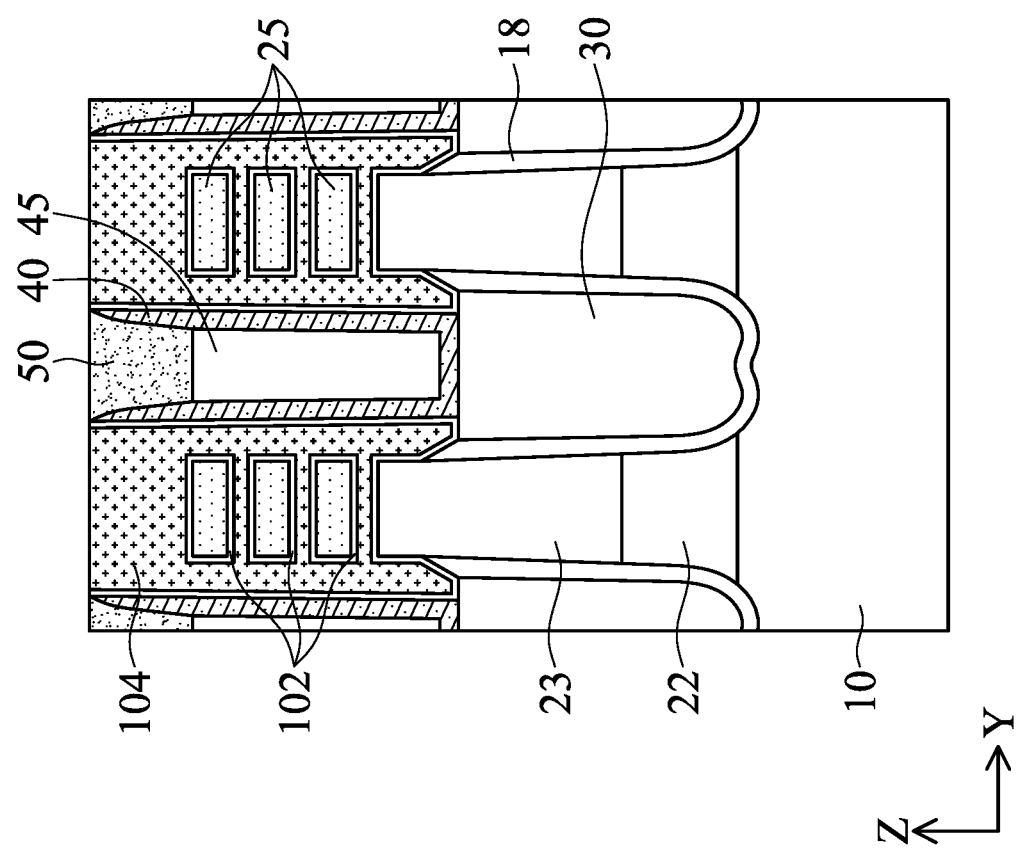

After the semiconductor wires or sheets (channel regions) of the second semiconductor layers 25 are released, a gate dielectric layer 102 is formed around each channel regions, and further, a gate electrode layer 104 is formed on the gate dielectric layer 102, as shown in FIGS. 24A-24C. In some embodiments, the structure and/or material of the gate electrode for the n-type GAA FET are different from the structure and/or material of the gate electrode for the p-type GAA FET.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 includes an interfacial layer (not shown) formed between the channel layers and the dielectric material. The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel layers. The thickness of the gate dielectric layer 102 is in a range from about 1 nm to about 6 nm in one embodiment.

The gate electrode layer 104 is formed on the gate dielectric layer 102 to surround each channel layer. The gate electrode 104 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 104 may be formed by CVD, ALD, electro-plating, or other suitable method. The gate dielectric layer and the gate electrode layer are then planarized by using, for example, CMP, until the top surfaces of the sixth dielectric layer 90 and the third dielectric layer 50 are revealed. In some embodiments, after the planarization operation, the gate electrode layer 104 is recessed and a cap insulating layer (not shown) is formed over the recessed gate electrode 104. The cap insulating layer includes one or more layers of a silicon nitride-based material, such as silicon nitride. The cap insulating layer can be formed by depositing an insulating material followed by a planarization operation.

In certain embodiments of the present disclosure, one or more work function adjustment layers (not shown) are interposed between the gate dielectric layer 102 and the gate electrode 104. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET, which may use different metal layers.

Next, as shown in FIGS. 24A-24C, the fourth dielectric layer 55 is removed by using a plasma etching operation. In some embodiments, the source gas of the plasma includes $C_4F_4$. In some embodiments, the fourth dielectric layer 55 is selectively removed from the third dielectric layer 50 to form a space 57.

Figure 25B:
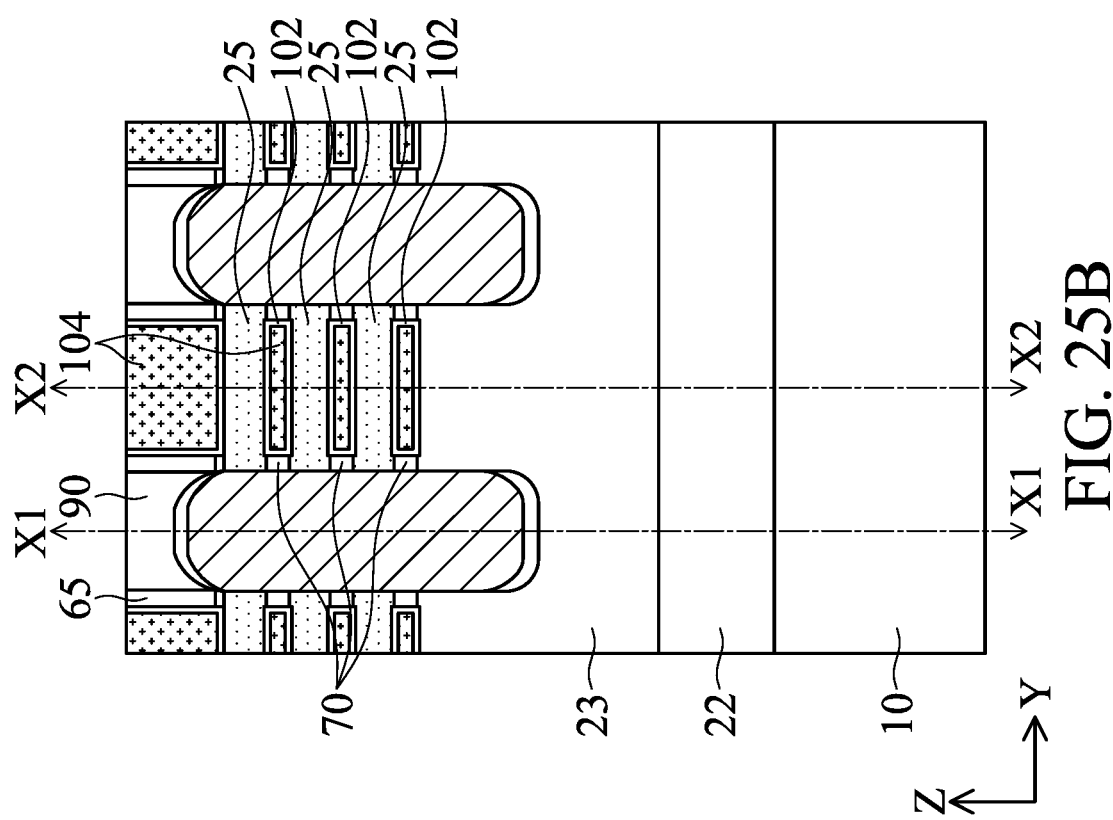
FIGS. 25A, 25B and 25C show various views of one of the various stages of manufacturing a fin FET device according to an embodiment of the present disclosure.
Figure 25A:
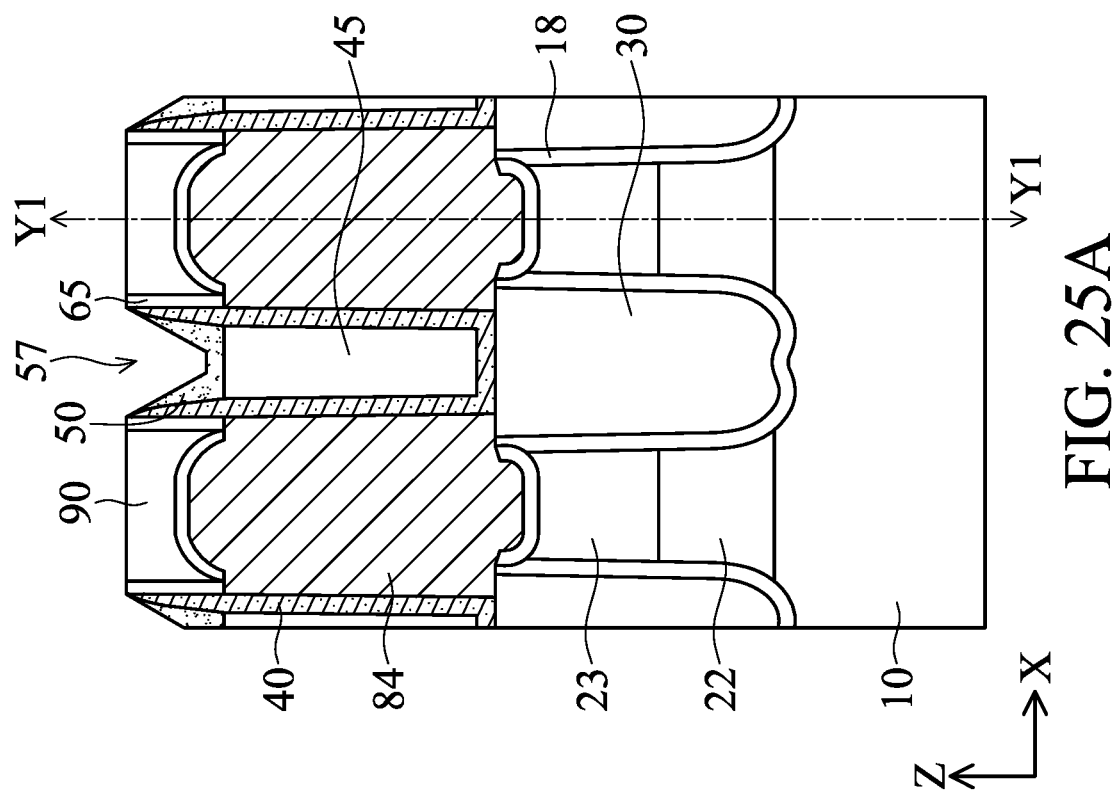
Figure 25C:
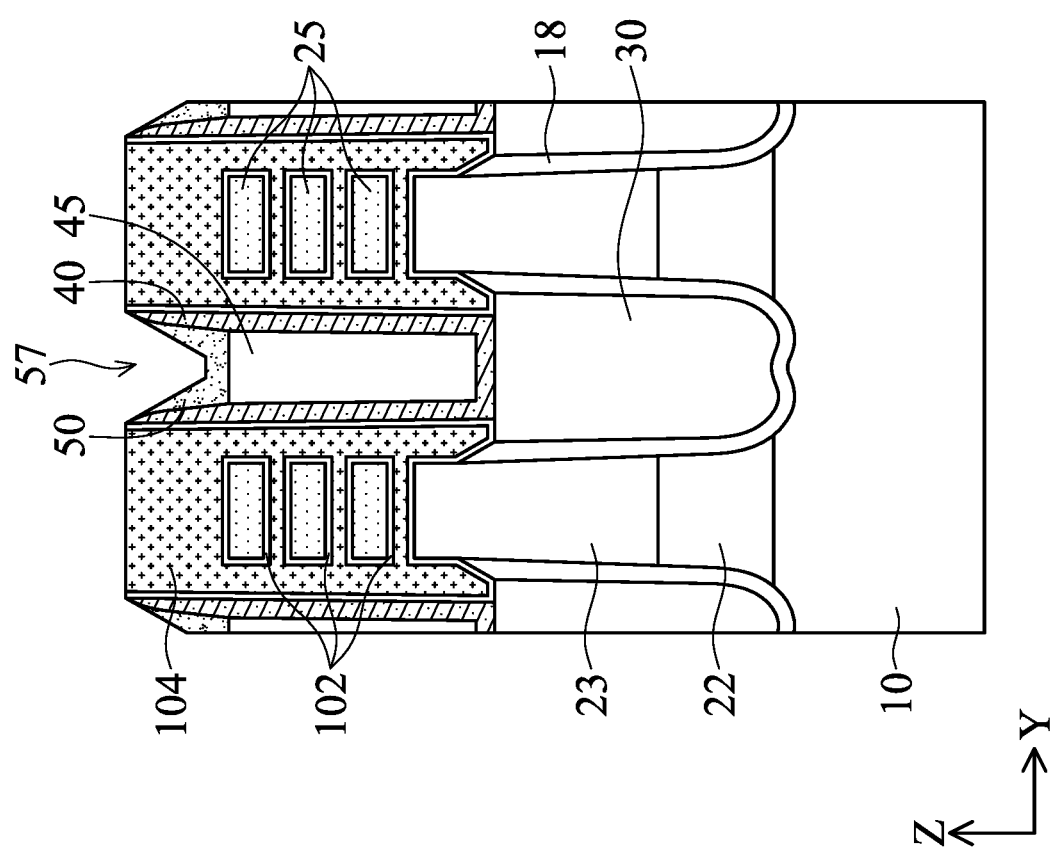

Further, as shown in FIGS. 25A-25C, the remaining third dielectric layer 50 is treated by plasma to form a V-shape space 57. In some embodiments, the height of the third dielectric layer 50 is reduced by about 30%-70% of the original height. In some embodiments, the remaining height of the third dielectric layer 50 is in a range from about 2 nm to about 6 nm. In some embodiments, the source gas of the plasma includes HBr.

Figure 26C:
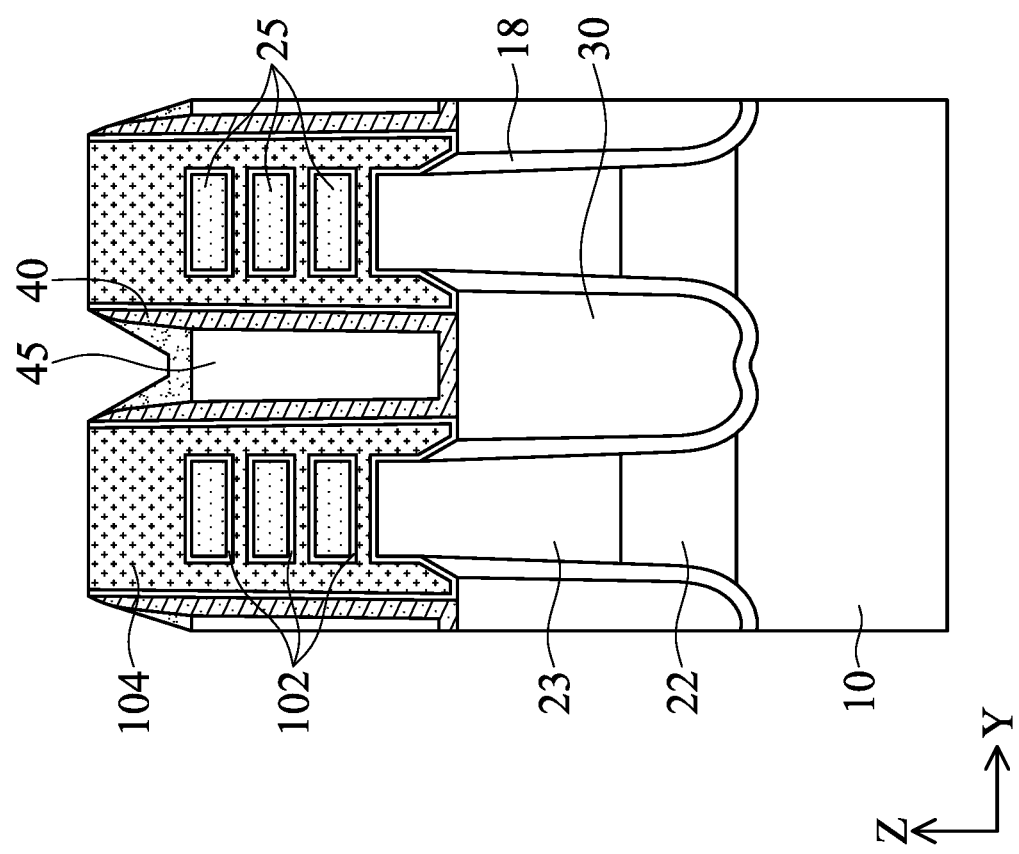

Then, as shown in FIGS. 26A-26C, a part of the sixth dielectric layer 90 above the source/drain epitaxial layer 84 is etched to form a contact opening 92.

Figure 27C:
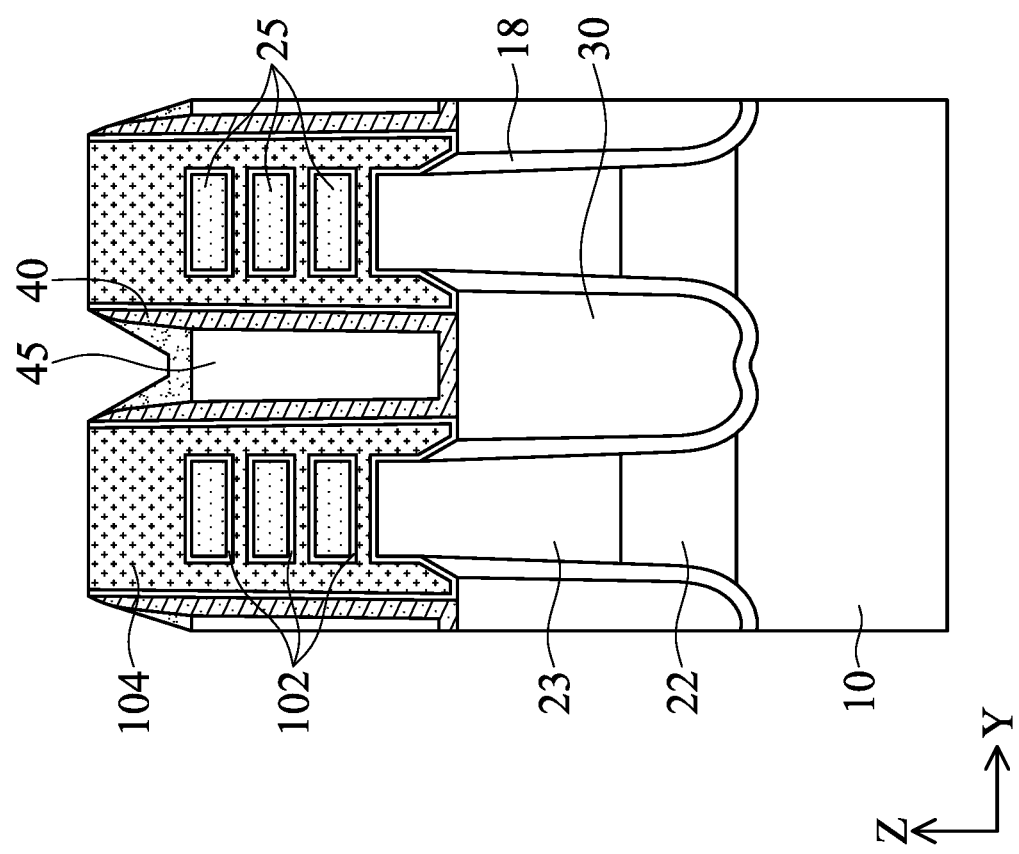

Subsequently, the contact opening 92 is filled with one or more conductive materials, thereby forming a source/drain contact 95, as shown in FIGS. 27A-27C. In some embodiments, the source/drain contact 95 includes a liner layer and a body metal layer. The liner layer includes one or more of Ti, TiN, WN, Ta, or TaN, and the body metal layer includes one or more of Cu, Al, Ni, Co, Ru, W or an alloy thereof.

Figure 27D:
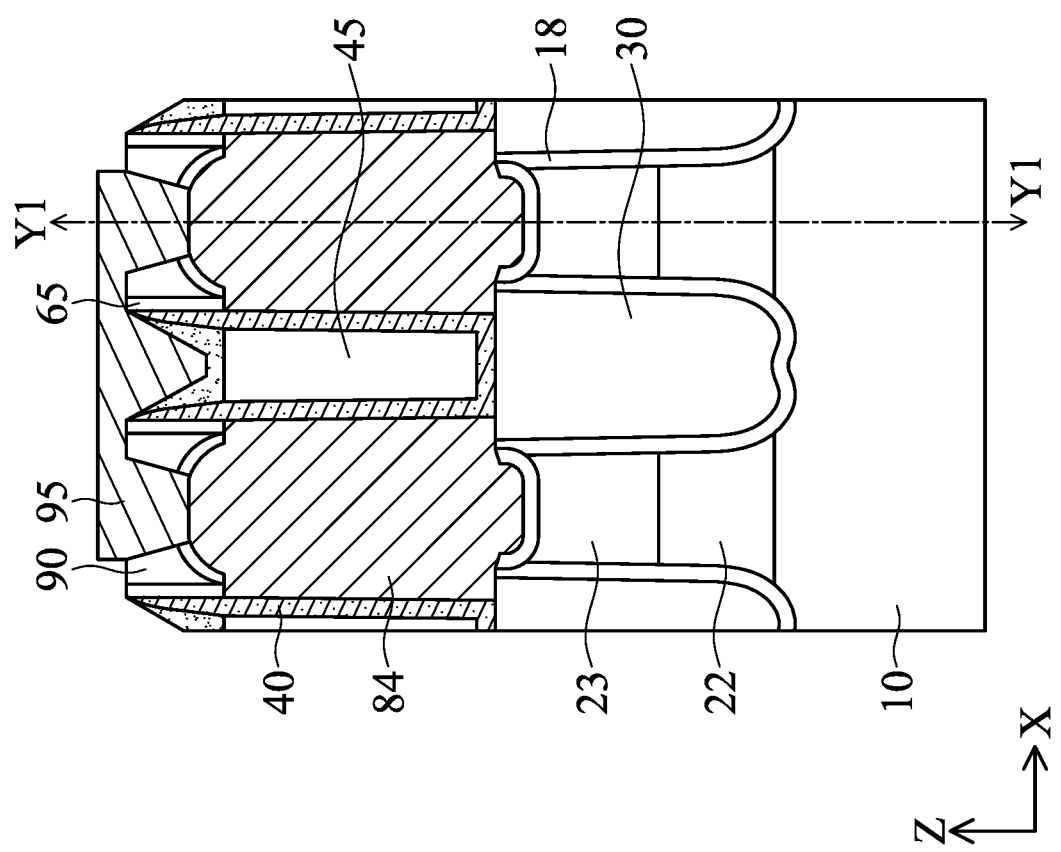
Figure 27E:
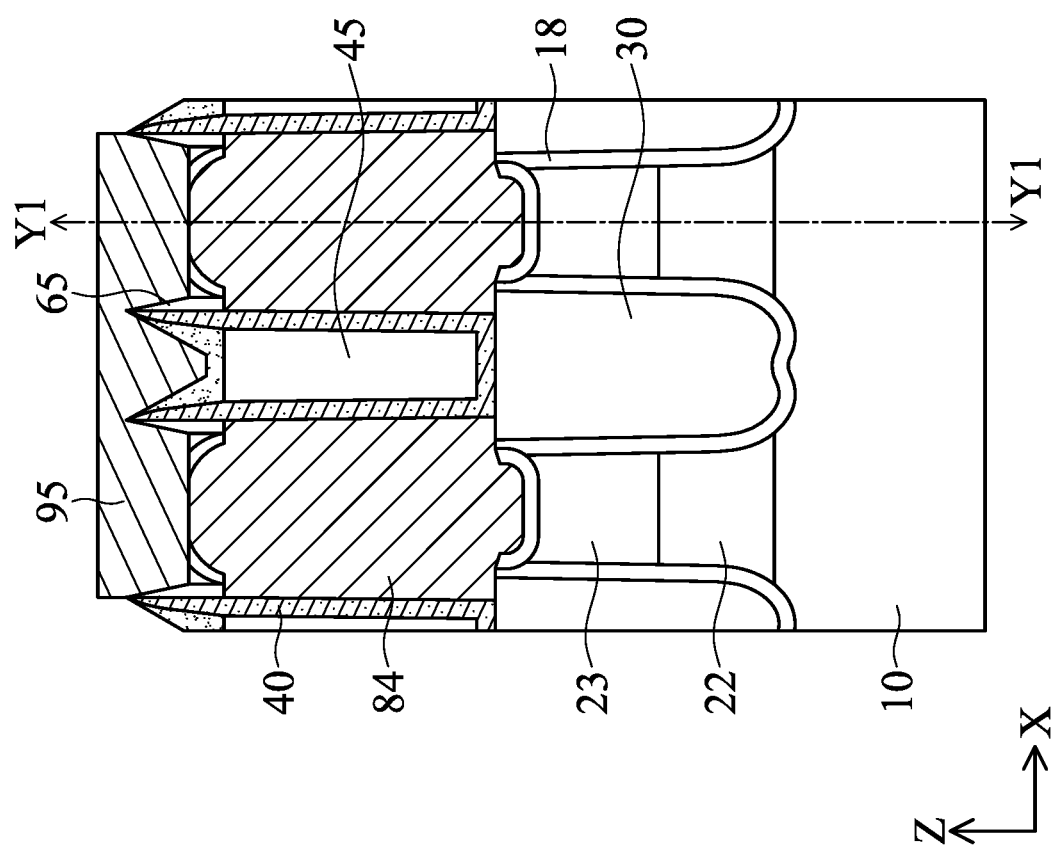
Figure 27F:
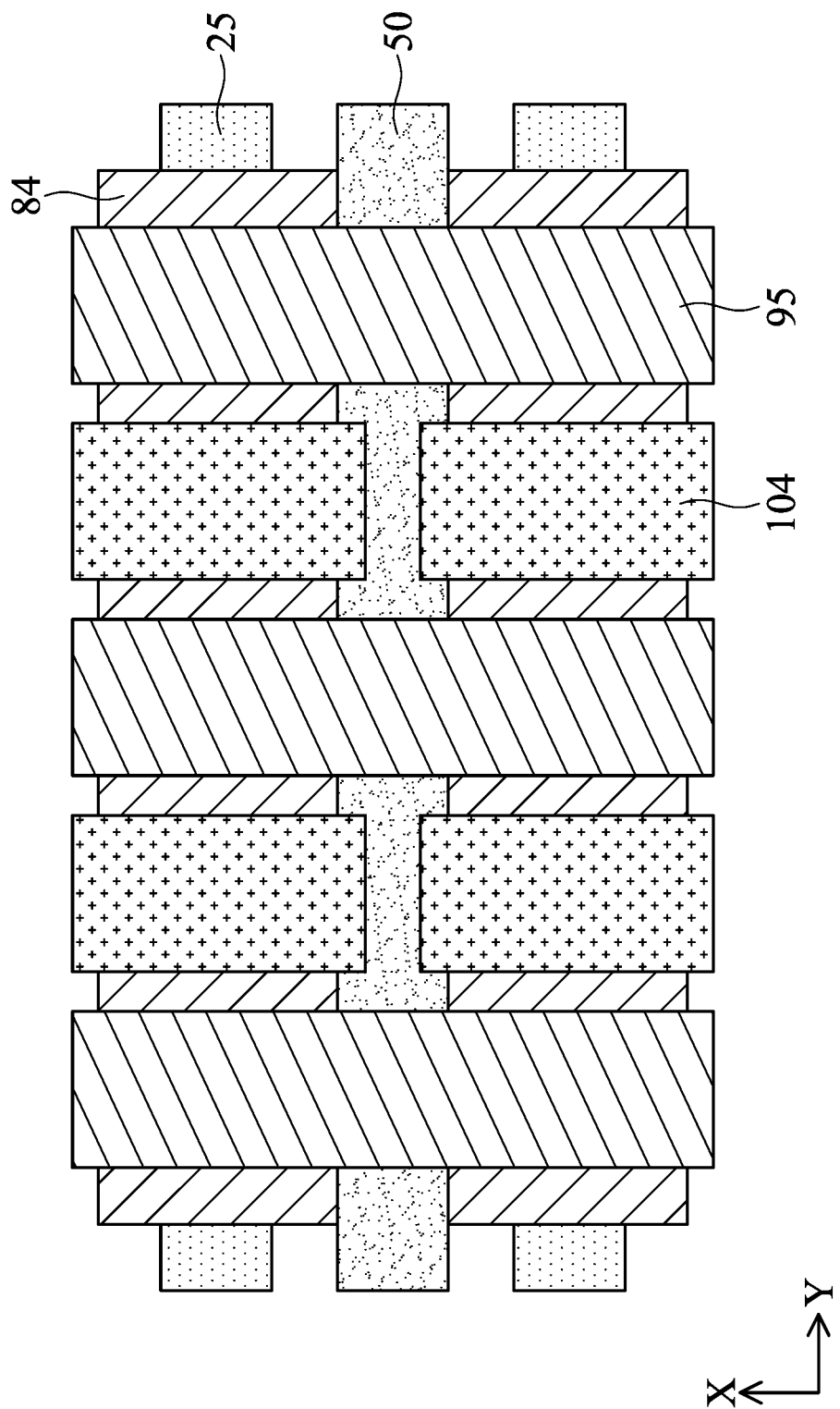

In some embodiments, as shown in FIG. 27D, the contact 95 connects adjacent source/drain regions. In such a case, a part of the contact 95 is disposed in the V-shape space 57 of the third dielectric layer. In some embodiments, as shown in FIG. 27E, when forming the contact opening 92, part of the sidewall spacer 65 and/or the sidewall spacers 40 are also etched to form a wider opening, and then contact metal is formed in the wider opening to form the contact 95. In such a case, since the third dielectric layer 50 is recessed to form the V-shape, the aspect ratio of the V-shape portion is small, which improves the contact landing over the third dielectric layer. FIG. 27F is a plan (top) view corresponding to FIGS. 27D and 27E.

Embodiments of the disclosure advantageously reduce the capacitive effects (e.g., parasitic capacitance) in finFET devices by creating a concave profile in the dielectric layer formed between adjacent fins. It will be understood that not all advantages have been necessarily discussed herein, no particular advantage is required for all embodiments or examples, and other embodiments or examples may offer different advantages.

In accordance with an aspect of the present disclosure, a method of manufacturing a semiconductor device includes forming a fin structure including a stacked layer of first semiconductor layers and second semiconductor layers disposed over a bottom fin structure and a hard mask layer over the stacked layer, forming an isolation insulating layer so that the hard mask layer and the stacked layer are exposed from the isolation insulating layer, forming a sacrificial cladding layer over at least sidewalls of the exposed hard mask layer and stacked layer, forming one or more layers of a first dielectric layer and an insertion layer over the sacrificial cladding layer and the fin structure, performing an annealing operation to convert a portion of the one or more layers of the first dielectric layer and the insertion layer from an amorphous form to a crystalline form, and removing the remaining amorphous portion of the one or more layers of the first dielectric layer and the insertion layer to form a recess. In some embodiments, prior to the annealing operation, the method includes implanting dopants in the one or more layers of the first dielectric layer and the insertion layer. In some embodiments, the dopants includes at least one of silicon (Si), argon (Ar), and phosphorus (P) ions. In some embodiments, the method further includes forming a second dielectric layer over the sacrificial cladding layer, forming a third dielectric layer made of a different material than the second dielectric layer over the second dielectric layer, recessing the third dielectric layer, and forming one or more layers of a first dielectric layer and an insertion layer over the recessed second dielectric layer. In some embodiments, wherein the first dielectric layer is made of a different material than the third dielectric layer. In some embodiments, wherein the second dielectric layer includes at least one of SiOC, SiOCN or SiCN. In some embodiments, wherein the third dielectric layer includes at least one of silicon nitride, silicon oxide or SiON. In some embodiments, wherein the first dielectric layer includes at least one of hafnium oxide, zirconium oxide, aluminum oxide or titanium oxide. In some embodiments, wherein the insertion layer includes silicon oxide. In some embodiments, wherein the sacrificial cladding layer is amorphous or polycrystalline Si or SiGe. In some embodiments, wherein a thickness of the crystalline first dielectric layer is 4 nm to 10 nm. In some embodiments, wherein a thickness of the insertion layer is 0.5 nm to 1 nm. In some embodiments, wherein the crystalline portion of first dielectric layer contacts sidewalls of the fin structure and surrounds the amorphous portion of first dielectric layer.

In accordance with another aspect of the present disclosure, a method of manufacturing a semiconductor device includes forming a fin structure, forming an isolation insulating layer so that an upper portion of the fin structure is exposed from the isolation insulating layer, forming a sacrificial layer over at least sidewalls of the exposed upper portion of the fin structure, forming a first dielectric layer over the sacrificial layer, forming a second dielectric layer made of a different material than the first dielectric layer over the first dielectric layer, recessing the second dielectric layer, forming two layers of hafnium oxide and an oxide insertion layer over the recessed second dielectric layer, implanting ions in a portion of the two layers of hafnium oxide and the oxide insertion layer, annealing the two layers of hafnium oxide and the oxide insertion layer to convert portions of the two layers of hafnium oxide and the oxide insertion layer not implanted with ions from amorphous to crystalline, wherein the portion of the two layers of hafnium oxide and the oxide insertion layer implanted with ions remains amorphous, and removing the amorphous plurality of layers to form a recess. In some embodiments, the oxide insertion layer includes silicon oxide. In some embodiments, the ions include at least one of silicon (Si), argon (Ar), and phosphorus (P) ions. In some embodiments, the crystalline portion surrounds the amorphous portion of first dielectric layer.

In accordance with another aspect of the present disclosure, a semiconductor device includes a first source/drain epitaxial layer and a second source/drain epitaxial layer, and a fin structure disposed between the first source/drain epitaxial layer and the second source/drain epitaxial layer and disposed on an isolation insulating layer. The fin structure includes a first dielectric layer, a second dielectric layer disposed over the first dielectric layer and a plurality of layers of a third dielectric layer and an insertion layer disposed over the second dielectric layer, and the plurality of layers include the third dielectric layer in crystalline form. In some embodiments, a thickness of the crystalline third dielectric layer is 4 nm to 10 nm. In some embodiments, a thickness of the insertion layer is 0.5 nm to 1 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a fin structure including a stacked layer of first semiconductor layers and second semiconductor layers disposed over a bottom fin structure and a top semiconductor layer over the stacked layer;
    forming an isolation insulating layer so that the top semiconductor layer and the stacked layer are exposed from the isolation insulating layer;
    forming a sacrificial cladding layer over at least sidewalls of the top semiconductor layer and the stacked layer;
    forming one or more layers of a first dielectric layer and an insertion layer over the sacrificial cladding layer and the fin structure;
    performing an annealing operation to convert a portion of the one or more layers of the first dielectric layer and the insertion layer from an amorphous form to a crystalline form; and
    removing a remaining amorphous portion of the one or more layers of the first dielectric layer and the insertion layer to form a recess.

2. The method of claim 1, wherein, prior to the annealing operation, the method comprises:
    implanting dopants in the one or more layers of the first dielectric layer and the insertion layer.

3. The method of claim 2, wherein the dopants includes at least one of silicon (Si), argon (Ar), and phosphorus (P) ions.

4. The method of claim 1, further comprising:
    forming a second dielectric layer over the sacrificial cladding layer;
    forming a third dielectric layer made of a different material than the second dielectric layer over the second dielectric layer;
    recessing the third dielectric layer; and
    forming the one or more layers of the first dielectric layer and the insertion layer over the recessed third dielectric layer.

5. The method of claim 4, wherein the first dielectric layer is made of a different material than the third dielectric layer.

6. The method of claim 4, wherein the second dielectric layer includes at least one of SiOC, SiOCN or SiCN.

7. The method of claim 4, wherein the third dielectric layer includes at least one of silicon nitride, silicon oxide or SiON.

8. The method of claim 1, wherein the first dielectric layer includes at least one of hafnium oxide, zirconium oxide, aluminum oxide or titanium oxide.

9. The method of claim 1, wherein the insertion layer includes silicon oxide.

10. The method of claim 1, wherein the sacrificial cladding layer is amorphous or polycrystalline Si or SiGe.

11. The method of claim 1, wherein a thickness of the crystalline first dielectric layer is 4 nm to 10 nm.

12. The method of claim 1, wherein a thickness of the insertion layer is 0.5 nm to 1 nm.

13. The method of claim 1, wherein the crystalline portion of first dielectric layer contacts sidewalls of the fin structure and surrounds the amorphous portion of first dielectric layer.

14. A method of manufacturing a semiconductor device, comprising:
   forming a fin structure;
   forming an isolation insulating layer so that an upper portion of the fin structure is exposed from the isolation insulating layer;
   forming a sacrificial layer over at least sidewalls of the exposed upper portion of the fin structure;
   forming a first dielectric layer over the sacrificial layer;
   forming a second dielectric layer made of a different material than the first dielectric layer over the first dielectric layer;
   recessing the second dielectric layer;
   forming two layers of hafnium oxide and an oxide insertion layer over the recessed second dielectric layer;
   implanting ions in a portion of the two layers of hafnium oxide and the oxide insertion layer;
   annealing the two layers of hafnium oxide and the oxide insertion layer to convert portions of the two layers of hafnium oxide and the oxide insertion layer not implanted with ions from amorphous to crystalline, wherein the portion of the two layers of hafnium oxide and the oxide insertion layer implanted with ions remains amorphous; and
   removing the portion of the two layers of hafnium oxide and the oxide insertion layer implanted with ions to form a recess.

15. The method of claim 14, wherein the oxide insertion layer includes silicon oxide.

16. The method of claim 14, wherein the ions include at least one of silicon (Si), argon (Ar), and phosphorus (P) ions.

17. The method of claim 14, wherein the crystalline portion surrounds the amorphous portion of first dielectric layer.

18. A method of manufacturing a semiconductor device, comprising:
   forming a fin structure over a substrate;
   forming a top semiconductor layer over the fin structure;
   forming a cladding layer over at least sidewalls of the top semiconductor layer and the fin structure;
   forming a first dielectric layer over the cladding layer;
   forming an oxide layer or a nitride layer over the first dielectric layer;
   converting a portion of the first dielectric layer and the oxide layer or the nitride layer from an amorphous form to a crystalline form; and
   removing a remaining amorphous portion of the first dielectric layer and the oxide layer or the nitride layer to form a concavity.

19. The method of claim 18, further comprising implanting a dopant in the first dielectric layer and the oxide layer or the nitride layer.

20. The method of claim 19, wherein the dopant includes at least one of silicon (Si), argon (Ar), and phosphorus (P) ions.

* * * * *